US 6,690,554 B2

(12) United States Patent
Aoki et al.

(10) Patent No.: US 6,690,554 B2
(45) Date of Patent: Feb. 10, 2004

(54) MAGNETORESISTIVE-EFFECT DEVICE WITH EXTENDED AFM LAYER AND METHOD FOR MANUFACTURING THE SAME

(75) Inventors: Daigo Aoki, Niigata-ken (JP); Naoya Hasegawa, Niigata-ken (JP); Kenji Honda, Niigata-ken (JP); Kiyoshi Sato, Niigata-ken (JP); Yoshihiko Kakihara, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/337,188

(22) Filed: Jan. 6, 2003

(65) Prior Publication Data

US 2003/0103298 A1 Jun. 5, 2003

Related U.S. Application Data

(62) Division of application No. 09/487,691, filed on Jan. 19, 2000, now Pat. No. 6,587,315.

(30) Foreign Application Priority Data

Jan. 20, 1999 (JP) .......................... 11-011670
Jan. 25, 1999 (JP) .......................... 11-015358
Dec. 2, 1999 (JP) .......................... 11-343134

(51) Int. Cl.[7] .............................................. G11B 5/39
(52) U.S. Cl. ............................................... 360/324.12
(58) Field of Search ......................... 360/324.12, 314, 360/324, 374.1, 374.11, 327, 327.1, 325; 338/32 R

(56) References Cited

U.S. PATENT DOCUMENTS

| 5,018,037 A | 5/1991 | Krounbi et al. ......... 360/377.31 |
| 5,079,035 A | 1/1992 | Krounbi et al. ............. 427/130 |
| 5,287,238 A | 2/1994 | Baumgart et al. .......... 360/314 |
| 5,408,377 A * | 4/1995 | Gurney et al. ............... 360/325 |
| 5,442,507 A | 8/1995 | Koga et al. .................. 360/322 |
| 5,465,185 A | 11/1995 | Heim et al. ............. 360/324.11 |
| 5,701,223 A | 12/1997 | Fontana, Jr. et al. .... 360/324.11 |
| 5,705,973 A * | 1/1998 | Yuan et al. ................ 338/32 R |
| 5,751,521 A * | 5/1998 | Gill ............................. 360/314 |
| 5,768,067 A | 6/1998 | Saito et al. ............. 360/327.32 |
| 5,784,225 A | 7/1998 | Saito et al. .............. 29/603.14 |
| 5,869,963 A | 2/1999 | Saito et al. .................. 324/252 |
| 5,949,623 A * | 9/1999 | Lin ........................ 360/324.12 |
| 5,959,810 A * | 9/1999 | Kakihara et al. ....... 360/324.12 |
| 5,995,338 A * | 11/1999 | Watanabe et al. ....... 360/324.12 |
| 6,038,107 A | 3/2000 | Pinarbasi ................. 360/327.11 |
| 6,061,211 A * | 5/2000 | Yoda et al. ............. 360/324.12 |
| 6,117,569 A | 9/2000 | Lin et al. ..................... 428/692 |
| 6,134,090 A * | 10/2000 | Mao et al. ................ 360/324.1 |
| 6,175,477 B1 * | 1/2001 | Lin et al. ................ 360/324.12 |
| 6,185,078 B1 * | 2/2001 | Lin et al. ................ 360/324.12 |
| 6,219,207 B1 | 4/2001 | Pinarbasi ..................... 360/322 |
| 6,243,241 B1 * | 6/2001 | Kanai ..................... 360/324.11 |
| 6,262,869 B1 * | 7/2001 | Lin et al. ................ 360/324.11 |
| 6,327,122 B1 | 12/2001 | Pinarbasi ................ 360/324.11 |

* cited by examiner

Primary Examiner—Tianjie Chen
(74) Attorney, Agent, or Firm—Brinks Hofer Gilson & Lione

(57) ABSTRACT

A magnetoresistive-effect device includes a multilayer film, hard bias layers arranged on both sides of the multilayer film, and electrode layers respectively deposited on the hard bias layers. The electrode layers are formed, extending over the multilayer film. Under the influence of the hard bias layers arranged on both sides of the multilayer, the multilayer film, forming the magnetoresistive-effect device, has, on the end portions thereof, insensitive regions which exhibit no substantial magnetoresistive effect. The insensitive region merely increases a direct current resistance. By extending the electrode layers over the insensitive regions of the multilayer film, a sense current is effectively flown from the electrode layer into the multilayer film. With a junction area between the electrode layer and the multilayer film increased, the direct current resistance is reduced, while the reproduction characteristics of the device are thus improved.

21 Claims, 33 Drawing Sheets

INSENSITIVE REGION D    INSENSITIVE REGION D
SENSITIVE REGION E

MAGNETORESISTIVE-EFFECT DEVICE WITH EXTENDED AFM LAYER AND METHOD FOR MANUFACTURING THE SAME

This application is a division of application Ser. No. 09/487,691, filed Jan. 19, 2000, now U.S. Pat. No. 6,587,315 which is hereby incorporated by reference herein.

BACKGROUND OF THE INVENTION

1. Field of the Invention

The present invention relates to a so-called spin-valve type thin-film device, in which an electrical resistance thereof varies depending on the relationship between the magnetization direction of a pinned magnetic layer and the magnetization direction of a free magnetic layer which is affected by external magnetic field, and, more particularly, to a magnetoresistive-effect device that allows a sense current to effectively flow through a multilayer film and a method for manufacturing the magnetoresistive-effect device.

2. Description of the Related Art

FIG. 33 is a cross-sectional view showing the construction of a conventional magnetoresistive-effect device, viewed from an ABS (air bearing surface) side thereof.

The magnetoresistive-effect device shown in FIG. 33 is the one called a spin-valve type thin-film device, one of the GMR (giant magnetoresistive) devices employing the giant magnetoresistive effect, and detects a magnetic field recorded on a recording medium, such as a hard disk.

This spin-valve type thin-film device includes a multi-layer film 9 including a substrate 6, an antiferromagnetic layer 1, a pinned magnetic layer 2, a nonmagnetic electrically conductive 3, a free magnetic layer 4, and a protective layer 7, a pair of hard bias layers 5, and a pair of electrode layers 8 and 8 respectively deposited on the hard bias layers 5 and 5, deposited on both sides of the multilayer film 9. The substrate 6 and the protective layer 7 are made of Ta (tantalum). A track width Tw is determined by the width dimension of the top surface of the multilayer film 9.

The antiferromagnetic layer 1 is typically an Fe—Mn (iron-manganese) alloy film or an Ni—Mn (nickel-manganese) alloy film, the pinned magnetic layer 2 and the free magnetic layer 4 are typically an Ni—Fe (nickel-iron) alloy film, the nonmagnetic electrically conductive layer 3 is typically a Cu (copper) film, the hard bias layers 5 and 5 are typically Co—Pt (cobalt-platinum) alloy films, and the electrode layers 8 and 8 are typically Cr (chromium) films.

Referring to FIG. 33, the magnetization of the pinned magnetic layer 2 is placed into a single-domain state in the Y direction (i.e., the direction of a leakage magnetic field from a recording medium, namely, the direction of the height of the multilayer film from the recording medium), and the magnetization of the free magnetic layer 4 is oriented in the X direction under the influence of a bias magnetic field of the hard bias layers 5.

The magnetization of the pinned magnetic layer 2 is designed to be perpendicular to the magnetization of the free magnetic layer 4.

In this spin-valve type thin-film device, the electrode layers 8 and 8, deposited on the hard bias layers 5 and 5, feed sense currents to the pinned magnetic layer 2, the nonmagnetic electrically conductive layer 3 and the free magnetic layer 4. The direction of the advance of the recording medium, such as a hard disk, is aligned with the Z direction. When a leakage magnetic field is given by the recording medium in the Y direction, the magnetization of the free magnetic layer 4 varies from the X direction toward the Y direction. An electric resistance varies depending on the relationship between a variation in the magnetization direction within the free magnetic layer 4 and a pinned magnetization direction of the pinned magnetic layer 2 (this phenomenon is called the magnetoresistive effect), and the leakage magnetic field is sensed from the recording medium based on a variation in the voltage in response to the variation in the electrical resistance.

The magnetoresistive-effect device shown in FIG. 33 suffers from the following problems.

The magnetization of the pinned magnetic layer 2 is pinned in a single-domain state in the Y direction, and the hard bias layers 5 and 5, magnetized in the X direction, are arranged on both sides of the pinned magnetic layer 2. The magnetization of the pinned magnetic layer 2 on both ends is therefore affected by the bias magnetic field from the hard bias layers 5 and 5, and is thus not pinned in the Y direction.

Specifically, the magnetization of the free magnetic layer 4 in the X direction single-domain state and the magnetization of the pinned magnetic layer 2 are not in a perpendicular relationship, particularly on end portions of the multilayer film 9, under the influence of the X direction magnetization of the hard bias layers 5 and 5. The magnetization of the free magnetic layer 4 is set to be perpendicular to the magnetization of the pinned magnetic layer 2 because the magnetization of the free magnetic layer 4 is easily varied in response to a weak external magnetic field, causing the electric resistance to greatly vary, and thereby enhancing reproduction gain. Furthermore, the perpendicular relationship results in output waveforms having a good symmetry.

Since the magnetization of the free magnetic layer 4 on end portions thereof is likely to be pinned under the influence of a strong magnetization of the hard bias layers 5 and 5, the magnetization of the free magnetic layer 4 less varies in response to an external magnetic field. As shown in FIG. 33, insensitive regions having a poor reproduction gain is formed in the end regions of the multilayer film 9.

A central portion other than the insensitive regions, of the multilayer film 9, substantially contributes to the reproduction of the recorded magnetic field, and is thus a sensitive region exhibiting the magnetoresistive effect. The width of the sensitive region is narrower than a track width Tw defined in the formation of the multilayer film 9 by the width dimension of the insensitive regions.

The multilayer film 9 of the magnetoresistive-effect device on both end portions thereof is thus associated with the insensitive regions that contribute nothing to the reproduction output, and these insensitive regions merely increases a direct current resistance (DCR).

In the magnetoresistive-effect device having the construction in which the electrode layers 8 and 8 are deposited on only both sides of the multilayer film 9 as shown in FIG. 33, the sense current from the electrode layers 8 and 8 easily flows into the hard bias layers 5 and 5, reducing the percentage of the current flowing into the multilayer film 9. The presence of the insensitive regions further substantially reduces the quantity of the sense current flowing into the sensitive region. The conventional magnetoresistive-effect device cannot feed an effective sense current to the sensitive region, and suffers from a drop in the reproduction output as the direct current resistance increases.

SUMMARY OF THE INVENTION

Accordingly, it is an object of the present invention to provide a magnetoresistive-effect device which reduces a direct current resistance by overlapping an electrode layer over an insensitive region of a multilayer film to improve reproduction characteristics, and a method for manufacturing the magnetoresistive-effect device.

According to a first aspect of the present invention, a magnetoresistive-effect device includes a multilayer film including an antiferromagnetic layer, a pinned magnetic layer, which is deposited on and in contact with the antiferromagnetic layer, and the magnetization direction of which is pinned through an exchange anisotropic magnetic field with the antiferromagnetic layer, and a free magnetic layer, separated from the pinned magnetic layer by a nonmagnetic electrically conductive layer, a pair of hard bias layers, deposited on both sides of the multilayer film, for orienting the magnetization direction of the free magnetic layer perpendicular to the magnetization direction of the pinned magnetic layer, and a pair of electrode layers respectively deposited on the hard bias layers, wherein the electrode layers extend over the multilayer film.

Preferably, the first magnetoresistive-effect device includes the multilayer film including the antiferromagnetic layer, the pinned magnetic layer, which is deposited on and in contact with the antiferromagnetic layer, and the magnetization direction of which is pinned through an exchange anisotropic magnetic field with the antiferromagnetic layer, and the free magnetic layer, separated from the pinned magnetic layer by the nonmagnetic electrically conductive layer, the pair of hard bias layers, deposited on both sides of the multilayer film, for orienting the magnetization direction of the free magnetic layer perpendicular to the magnetization direction of the pinned magnetic layer, and the pair of electrode layers respectively deposited on the hard bias layers, for feeding a sense current to the pinned magnetic layer, the nonmagnetic electrically conductive layer, and the free magnetic layer, wherein the multilayer film includes a central sensitive region which provides an excellent reproduction gain, exhibiting a substantial magnetoresistive effect and insensitive regions which are formed on both sides of the sensitive region, and provide a poor reproduction gain, exhibiting no substantial magnetoresistive effect, and wherein the electrode layers deposited on both sides of the multilayer film extend over the insensitive regions of the multilayer film.

Preferably, the multilayer film is fabricated by successively laminating the antiferromagnetic layer, the pinned magnetic layer, the nonmagnetic electrically conductive layer, and the free magnetic layer in that order from below, the antiferromagnetic layer laterally extends from the layers laminated thereon, and a pair of hard bias layer, a pair of intermediate layers, and a pair of electrode layers are respectively laminated on a pair of metallic layers respectively deposited on the antiferromagnetic layers in laterally extending regions thereof.

According to a second aspect of the present invention, a magnetoresistive-effect device includes a multilayer film including a free magnetic layer, nonmagnetic electrically conductive layer respectively lying over and under the free magnetic layer, pinned magnetic layers respectively lying over the one nonmagnetic electrically conductive layer and under the other nonmagnetic electrically conductive layer, each having a pinned magnetization direction, and antiferromagnetic layers respectively lying over the one pinned magnetic layer and under the other pinned magnetic layer, and a pair of hard bias layers, formed on both sides of the multilayer film, for orienting the magnetization direction of the free magnetic layer perpendicular to the magnetization direction of the pinned magnetic layer, and a pair of electrode layers respectively deposited on the hard bias layers, wherein the electrode layers extend over the multilayer film.

Preferably, the magnetoresistive-effect device includes the multilayer film including the free magnetic layer, nonmagnetic electrically conductive layers respectively lying over and under the free magnetic layer, pinned magnetic layers respectively lying over the one nonmagnetic electrically conductive layer and under the other nonmagnetic electrically conductive layer, each having a pinned magnetization direction, and antiferromagnetic layers respectively lying over the one pinned magnetic layer and under the other pinned magnetic layer, and the pair of hard bias layers, deposited on both sides of the multilayer film, for orienting the magnetization direction of the free magnetic layer perpendicular to the magnetization direction of the pinned magnetic layer, and the pair of electrode layers deposited on the hard bias layers, for feeding a sense current to the pinned magnetic layer, the nonmagnetic electrically conductive layer, and the free magnetic layer, wherein the multilayer film includes a central sensitive region which provides an excellent reproduction gain, exhibiting a substantial magnetoresistive effect and insensitive regions which are formed on both sides of the sensitive region, and provide a poor reproduction gain, exhibiting no substantial magnetoresistive effect, and wherein the electrode layers deposited on both sides of the multilayer film extend over the insensitive regions of the multilayer film.

Preferably, the free magnetic layer includes a plurality of soft magnetic thin films having different magnetic moments and nonmagnetic material layers, which are alternately laminated with one soft magnetic thin film separated from another by one nonmagnetic material layer, and the free magnetic layer is in a ferrimagnetic state in which the magnetization directions of two adjacent soft magnetic thin films, separated by the nonmagnetic material layer, are aligned antiparallel to each other. This arrangement offers the same result as the one obtained from the use of a thin free magnetic layer. The magnetization of the free magnetic layer is easily varied, improving the magnetic field detection sensitivity of the magnetoresistive-effect device.

The magnitude of the magnetic moment of the soft magnetic thin film is the product of the saturation magnetization (Ms) and the film thickness (t) of the soft magnetic thin film.

When the free magnetic layer is fabricated by alternately laminating a plurality of soft magnetic thin films having different magnetic moments and nonmagnetic material layers, the magnetization directions of two adjacent soft magnetic thin films, separated by the nonmagnetic material layer, are aligned antiparallel to each other in a ferrimagnetic state. With this arrangement, the plurality of the soft magnetic thin films alternate between the one having magnetization thereof aligned in the direction of a magnetic field generated from the bias layer and the one having magnetization thereof in 180 degrees opposite direction from the direction of the magnetic field of the bias layer.

The soft magnetic thin film having a magnetization direction thereof 180 degrees opposite from the direction of the magnetic field of the bias layer is subject to disturbance in magnetization direction on both end portions magnetically coupled with the bias layer. The soft magnetic thin film, separated from the above soft magnetic thin film by the nonmagnetic material layer, and having a magnetization direction thereof aligned with the direction of the magnetic field of the bias layer, is disturbed along therewith in magnetization direction on both end portions.

Both end portions where the soft magnetic thin films constituting the free magnetic field are disturbed in magnetization direction become insensitive regions which present a poor reproduction gain and exhibit no substantial magnetoresistive effect. In the present invention, the electrode layers are formed to extend over the insensitive regions.

When the free magnetic layer is fabricated by alternately laminating a plurality of soft magnetic thin films having different magnetic moments and nonmagnetic material layers with one nonmagnetic layer interposed between two adjacent soft magnetic thin films, the magnetic coupling junction between the multilayer film and the bias layer is preferably fabricated of an interface of the bias layer with the end face of only one of the plurality of the soft magnetic thin films forming the free magnetic layer.

It is sufficient if the bias layer aligns the magnetization direction of one of the plurality of the soft magnetic thin films constituting the free magnetic layer. When the magnetization direction of the one soft magnetic thin film is aligned in one direction, another soft magnetic thin film next to the first soft magnetic thin film is shifted to a ferrimagnetic state with a magnetization direction thereof aligned antiparallel. Consequently, all soft magnetic thin films are alternately aligned parallel to and antiparallel to one direction, and the magnetization direction of the entire free magnetic layer is aligned in one direction.

If the bias layer is magnetically coupled with the plurality of the soft magnetic thin films constituting the free magnetic layer, the magnetization direction of the soft magnetic thin films is undesirably disturbed on both end portions.

The pinned magnetic layer is fabricated by alternately laminating a plurality of soft magnetic thin films having different magnetic moments and nonmagnetic material layers with one nonmagnetic layer interposed between two adjacent soft magnetic thin films. When the magnetization direction of one soft magnetic thin film, separated from another soft magnetic thin film by the nonmagnetic material layer, is in a ferrimagnetic state with a magnetization direction thereof aligned antiparallel, the plurality of the soft magnetic thin films constituting the pinned magnetic layer mutually pin each other. As a result, the magnetization direction of the pinned magnetic layer is advantageously stabilized in one direction.

Here again, the magnitude of the magnetic moment of the soft magnetic thin film is the product of the saturation magnetization (Ms) and the film thickness (t) of the soft magnetic thin film.

The nonmagnetic material layer is preferably made of a material selected from the group consisting of Ru, Rh, Ir, Cr, Re, Cu, and alloys thereof.

The antiferromagnetic layer is preferably made of a PtMn alloy. Alternatively, the antiferromagnetic layer may be made of an X—Mn alloy where X is a material selected from the group consisting of Pd, Ir, Rh, Ru, and alloys thereof, or may be made of a Pt—Mn—X' alloy where X is a material selected from the group consisting of Pd, Ir, Rh, Ru, Au, Ag, and alloys thereof.

According to a third aspect of the present invention, a magnetoresistive-effect device includes a multilayer film including a magnetoresistive-effect layer, a soft magnetic layer, and a nonmagnetic layer with the magnetoresistive-effect layer and the soft magnetic layer laminated with the nonmagnetic layer interposed therebetween, a pair of hard bias layers deposited on both sides of the multilayer film, and a pair of electrode layers respectively deposited on the hard bias layers, wherein the electrode layers extend over the multilayer film.

Preferably, the magnetoresistive-effect device preferably includes the multilayer film including the magnetoresistive-effect layer, the soft magnetic layer, and the nonmagnetic layer with the magnetoresistive-effect layer and the soft magnetic layer laminated with the nonmagnetic layer interposed therebetween, the pair of hard bias layers deposited on both sides of the multilayer film, and the pair of electrode layers respectively deposited on the hard bias layers, wherein the multilayer film includes a central sensitive region which provides an excellent reproduction gain, exhibiting a substantial magnetoresistive effect and insensitive regions which are formed on both sides of the sensitive region, and provide a poor reproduction gain, exhibiting no substantial magnetoresistive effect, and wherein the electrode layers deposited on both sides of the multilayer film extend over the insensitive regions of the multilayer film.

Preferably, the position of at least one of the top edge and the bottom edge of the magnetic coupling junction between the multilayer film and the bias layer in the direction of the movement of a medium is at the same level as the position of at least one of the top surface and the bottom surface of the free magnetic layer or the magnetoresistive-effect layer in the direction of the movement of the medium.

Preferably, the bias layer is magnetically coupled, directly or via another intervening layer as an underlayer, with the multilayer film on the side face thereof transverse to the direction of a track width. The bias layer functions to align the magnetization direction of the free magnetic layer or the magnetoresistive-effect layer, out of the multilayer film, in one direction. It is therefore sufficient if the bias layer is magnetically coupled with the free magnetic layer only or the magnetoresistive-effect layer only. To prevent the magnetic field generated from the bias layer from affecting the magnetization direction of the pinned magnetic layer, the bias layer preferably remains magnetically uncoupled with the pinned magnetic layer.

A protective layer, constructed of Ta, etc., is preferably deposited, as a top layer, on top of the multilayer film to prevent oxidation.

An electrode layer, if laminated on the protective layer, adversely affects the characteristics of the magnetoresistive-effect device, for example, increases an electrical resistance. Therefore, the protective layer is preferably deposited where there is no junction between the multilayer film and the electrode layer.

The sensitive region of the multilayer film is defined as a region which results in an output equal to or greater than 50% of a maximum reproduction output while the insensitive regions of the multilayer film are defined as regions, formed on both sides of the sensitive region, which result in an output smaller than 50% of the maximum reproduction output, when the magnetoresistive-effect device having the electrode layers on both sides only of the multilayer film scans a micro track, having a signal recorded thereon, in the direction of a track width.

The width dimension of the sensitive region of the multilayer film is preferably equal to an optical track width O-Tw.

The width dimension of a portion of each electrode layer extending over the multilayer film is preferably within a range from 0 $\mu$m to 0.08 $\mu$m.

The width dimension of the portion of each electrode layer extending over the multilayer film is preferably equal to or larger than 0.05 $\mu$m.

The angle made between the surface of the protective layer or the surface of the multilayer film with the protective layer removed therefrom and the end face of the electrode layer extending over the insensitive region of the multilayer film is preferably within a range of 20 degrees to 60 degrees, and more preferably within a range of 25 degrees to 45 degrees.

An insulator layer is preferably deposited between the electrode layers, which are deposited above and on both sides of the multilayer film, and the end face of the insulator layer is in direct contact with each of the electrode layers or is separated from each of the electrode layers by a layer.

The angle made between the surface of the protective layer or the surface of the multilayer film with the protective layer removed therefrom and the end face of the electrode layer extending over the insensitive region of the multilayer film is preferably 60 degrees or greater, and more preferably 90 degrees or greater.

The width dimension of a portion of each electrode layer extending over the multilayer film is preferably substantially equal to the width dimension of the insensitive region of the multilayer film.

According to a fourth aspect of the present invention, a method for manufacturing a magnetoresistive-effect device includes the steps of laminating, on a substrate, a multilayer film for exhibiting the magnetoresistive effect, depositing, on a sensitive region of the multilayer film, a lift-off resist layer having an undercut on the underside thereof facing insensitive regions of the multilayer film with the sensitive and insensitive regions beforehand measured through a micro track profile method, depositing bias layers on both sides of the multilayer film and magnetizing the bias layer in the direction of a track width, depositing an electrode layer on the bias layer at a slant angle with respect to the multilayer film, with the electrode layer formed into the undercut on the underside of the resist layer arranged on the multilayer film, and removing the resist layer from the multilayer film.

When a protective layer is deposited as a top layer on the multilayer film for oxidation prevention in the step of laminating, on the substrate, the multilayer film for exhibiting the magnetoresistive effect, the method preferably includes the steps of depositing the lift-off resist layer on top of the protective layer in the sensitive region of the multilayer film, in the step of depositing the lift-off resist layer on the sensitive region of the multilayer film, and exposing the underlayer beneath the protective layer by removing a portion of the protective layer which is not in direct contact with the lift-off resist layer. In this way, the electrode layer advantageously joins the multilayer film where the protective layer having a high electrical resistance is removed, when the electrode layer is deposited to extend over the multilayer film.

In the step of depositing the electrode layer, the angle made between the surface of the protective layer or the surface of the multilayer film with the protective layer removed therefrom and the end face of the electrode layer extending over the insensitive region of the multilayer film is preferably within a range of 20 degrees to 60 degrees, and more preferably within a range of 25 degrees to 45 degrees.

According to a fifth aspect of the present invention, a method for manufacturing a magnetoresistive-effect device includes the steps of laminating, on a substrate, a multilayer film for exhibiting the magnetoresistive effect, depositing an insulator layer on the multilayer film, depositing, on the insulator layer in a sensitive region of the multilayer film, a lift-off resist layer having an undercut on the underside thereof facing insensitive regions of the multilayer film with the insensitive regions beforehand measured through a micro track profile method, removing the insulator layer deep to the undercut formed on the underside of the resist layer, through etching, depositing bias layers on both sides of the multilayer film and magnetizing the bias layers in the direction of a track width, depositing an electrode layer on the bias layer at a slant angle with respect to the multilayer film, with the electrode layer formed to be in direct contact with an end face of the insulator layer, i.e., the underlayer beneath the resist layer, or with the electrode layer formed to be separated from the end face of the insulator layer by a layer, and removing the resist layer from the insulator layer.

When a protective layer is deposited as a top layer on the multilayer film for oxidation prevention in the step of depositing, on the substrate, the multilayer film for exhibiting the magnetoresistive effect, the method preferably includes the step of removing the area of the protective layer not covered with the insulator layer to expose the underlayer beneath the protective layer, subsequent to the step of removing the insulator layer deep to the undercut formed on the underside of the resist layer through etching. In this way, the electrode layer advantageously joins the multilayer film where the protective layer having a high electrical resistance is removed, when the electrode layer is formed to extend over the multilayer film.

In the method for manufacturing the magnetoresistive-effect device including the step of laminating the insulator layer on the multilayer film, in the step of forming the electrode layer, the angle made between the surface of the protective layer or the surface of the multilayer film with the protective layer removed therefrom and the end face of the electrode layer extending over the insensitive region of the multilayer film is preferably 60 degrees or greater, and more preferably 90 degrees or greater.

The sensitive region of the multilayer film, measured through a micro track profile method, is defined as a region which results in an output equal to or greater than 50% of a maximum reproduction output while the insensitive regions of the multilayer film are defined as regions, formed on both sides of the sensitive region, which result in an output smaller than 50% of the maximum reproduction output, when a magnetoresistive-effect device having the electrode layers formed on hard bias layers only and not extending over the multilayer film scans a micro track, having a signal recorded thereon, in the direction of the track width.

In the method for manufacturing a magnetoresistive-effect device, the bias layers are preferably deposited on both sides of the multilayer film through at least one sputtering technique selected from an ion-beam sputtering method, a long-throw sputtering method, and a collimation sputtering method, with the substrate, having the multilayer film thereon, placed perpendicular to a target made of a composition of the bias layer, and the electrode layer is preferably deposited on the bias layer into an undercut formed in the underside of the resist layer arranged on the multilayer film through at least one sputtering technique selected from an ion beam sputtering method, a long-throw sputtering method, and a collimation sputtering method, with the substrate, having the multilayer film thereon, placed slightly oblique to a target made of a composition of the electrode layer, or with the target placed slightly oblique to the substrate.

Preferably, the multilayer film includes an antiferromagnetic layer, a pinned magnetic layer, a nonmagnetic electrically conductive layer, and a free magnetic layer, or the multilayer film includes a free magnetic layer, nonmagnetic electrically conductive layers respectively lying over and under the free magnetic layer, pinned magnetic layers respectively lying over the one nonmagnetic electrically conductive layer and under the other nonmagnetic electrically conductive layer, and antiferromagnetic layers respectively lying over the one pinned magnetic layer and under the other pinned magnetic layer, or the multilayer film includes a magnetoresistive-effect layer, a soft magnetic layer, and a nonmagnetic layer wherein the magnetoresistive-effect layer and the soft magnetic layer are laminated with the nonmagnetic layer interposed therebetween.

Preferably, the multilayer film includes at least one of each of an antiferromagnetic layer, a pinned magnetic layer, a nonmagnetic electrically conductive layer, and a free magnetic layer, or the multilayer film includes a free magnetic layer, nonmagnetic electrically conductive layers respectively lying over and under the free magnetic layer, pinned magnetic layers respectively lying over the one nonmagnetic electrically conductive layer and under the other nonmagnetic electrically conductive layer, and antiferromagnetic layers respectively lying over the one pinned magnetic layer and under the other pinned magnetic layer, or the multilayer film includes a magnetoresistive-effect layer, a soft magnetic layer, and a nonmagnetic layer wherein the magnetoresistive-effect layer and the soft magnetic layer are laminated with the nonmagnetic layer interposed therebetween.

The free magnetic layer preferably includes a plurality of soft magnetic thin films having different magnetic moments and nonmagnetic material layers, which are alternatively laminated with one soft magnetic thin film separated from another by one nonmagnetic material layer, and the free magnetic layer is in a ferrimagnetic state in which the magnetization directions of adjacent soft magnetic thin films, separated by the nonmagnetic material layer, are aligned antiparallel to each other.

When the free magnetic layer is fabricated by laminating the plurality of soft magnetic thin films having different magnetic moments and the nonmagnetic material layers with one nonmagnetic material layer interposed between adjacent soft magnetic thin films, the magnetic coupling junction between the multilayer film and the bias layer is preferably fabricated of an interface with the end face of only one of the plurality of the soft magnetic thin films forming the free magnetic layer, in the step of depositing the bias layer.

The pinned magnetic layer preferably includes a plurality of soft magnetic thin films having different magnetic moments and nonmagnetic material layers, which are alternately laminated with one soft magnetic thin film separated from another by one nonmagnetic material layer, and the pinned magnetic layer is in a ferrimagnetic state in which the magnetization directions of adjacent soft magnetic thin films, separated by the nonmagnetic material layer, are aligned antiparallel to each other.

The nonmagnetic material layer is preferably made of a material selected from the group consisting of Ru, Rh, Ir, Cr, Re, Cu, and alloys thereof.

In the step of depositing the bias layers, the position of at least one of the top edge and the bottom edge of the magnetic coupling junction between the multilayer film and the bias layer in the direction of the movement of a medium is preferably set to be at the same level as the position of at least one of the top surface and the bottom surface of the free magnetic layer or the magnetoresistive-effect layer in the direction of the movement of the medium.

The antiferromagnetic layer is preferably made of a PtMn alloy. Alternatively, the antiferromagnetic layer may be made of an X—Mn alloy where X is a material selected from the group consisting of Pd, Ir, Rh, Ru, and alloys thereof, or may be made of a Pt—Mn—X' alloy where X' is a material selected from the group consisting of Pd, Ir, Rh, Ru, Au, Ag, and alloys thereof.

Even if the width dimension of the top surface of the multilayer film, composed of the antiferromagnetic layer, the pinned magnetic layer, the nonmagnetic electrically conductive layer, and the free magnetic layer, is defined as a track width Tw, the full width of the multilayer film does not necessarily exhibit the magnetoresistive effect. Only the central portion of the width of the multilayer film offers an excellent reproduction gain, exhibiting the magnetoresistive effect in practice. The central portion of the multilayer film having an excellent reproduction gain is called a sensitive region, and the remaining portions, formed on both sides of the sensitive region, and having a poor reproduction gain, are called insensitive regions. The sensitive region and the insensitive regions are measured using a micro track profile method. Referring to FIG. 31, the micro track profile method is discussed.

As shown in FIG. 31, the conventional magnetoresistive-effect device (see FIG. 33), including the multilayer film exhibiting the magnetoresistive effect, the hard bias layers on both sides of the multilayer film, and the electrode layers formed on the hard bias layers, is formed on the substrate. The electrode layers are formed on only both sides of the multilayer film.

The width dimension A of the top surface of the multilayer film not covered with the electrode layers is measured through an optical microscope. The width dimension A is defined as a track width Tw measured through an optical method (hereinafter referred to as an optical track width dimension O-Tw).

A signal is recorded onto a micro track on the recording medium. A magnetoresistive-effect device is set to scan the micro track in the direction of a track width, and the relationship between the width dimension A and the reproduction output is measured. Alternatively, the recording medium having the micro track may be set to scan the magnetoresistive-effect device in the direction of the track width to measure the relationship between the width dimension A of the multilayer film and the reproduction output. The measurement results are shown in the lower portion of FIG. 31.

From the measurement results, the reproduction output rises high at the center of the multilayer film, and gets lower toward edges thereof. The central portion of the multilayer film exhibits an excellent magnetoresistive effect, and contributes to the reproduction capability, while edge portions of the multilayer film suffers from a poor magnetoresistive effect, resulting a low reproduction output with an insufficient reproduction capability.

The portion, having a width dimension B on the multilayer film and generating an output equal to or greater than 50% of a maximum reproduction output, is defined as the sensitive region, and the portion, having a width dimension C on the multilayer film and generating an output smaller than 50% of the maximum reproduction output, is defined as the insensitive region.

Since the insensitive region offers no effective reproduction capability, and merely raises a direct current resistance (DCR), the electrode layer is set to extend over the insensitive region in the present invention. In this arrangement, the junction areas of the multilayer film with the hard bias layers and the electrode layers, formed on both sides of the multilayer film, are increased. A sense current from the electrode easily flows into the multilayer film without passing through the hard bias layer, the direct current resistance is reduced, and the reproduction characteristics are thus improved.

As described above, when electrode layers 210 and 210 are overlapped onto a multilayer film 209 as shown in FIG. 34, the electrode layers 210 and 210 are connected to the multilayer film 209, permitting a sense current to effectively flow into the multilayer 209 from the electrode layer 210.

In order to cause a sense current to effectively flow into the multilayer film 209 from the electrode layer 210, the thickness of the electrode layer 210 must be larger than before, the thickness hi of the electrode 210 on and in direct contact with the multilayer film 209 must be larger, and the direct current resistance of the electrode layer 210 must be reduced.

If the thickness h1 of the electrode layer 210 is small relative to that of the multilayer film 209, the direct current resistance of the electrode layer 210 rises, more likely causing the sense current from the electrode layer 210 to shunt to a hard bias layer 205. As a result, the reproduction output can drop.

With the electrode layer 210 overlapped onto the multilayer film 209 and the thickness h1 of the electrode layer 210 increased relative to the thickness of the multilayer film 209, the shunt of the sense current to the hard bias layer 205 is controlled, and the sense current effectively flows from the electrode layer 210 to the multilayer film 209.

If the electrode layer 210 having a thickness h1 is deposited on the top surface of the multilayer film 209, a large step develops between the top surface of the electrode layer 210 and the top surface of the multilayer film 209. When an upper gap layer 211, made of an insulator material, covers throughout the electrode layer 210 and the multilayer film 209, the upper gap layer 211 suffers a poor step coverage, and a film discontinuity occurs at the step. As a result, the upper gap layer 211 fails to provide sufficient insulation.

It is yet another object of the present invention to provide a magnetoresistive-effect device which increases reproduction output by reducing a current loss caused by a sense current flowing into a hard bias layer, while making dominant a sense current flowing into a sensitive region occupying the central portion of a multilayer film, and which permits an upper gap layer to be deposited with proper insulation assured.

According to a sixth aspect of the present invention, a magnetoresistive-effect device includes a multilayer film including an antiferromagnetic layer, a pinned magnetic layer, which is deposited on and in contact with the antiferromagnetic layer, and the magnetization direction of which is pinned through an exchange anisotropic magnetic field with the antiferromagnetic layer, and a free magnetic layer, separated from the pinned magnetic layer by a nonmagnetic electrically conductive layer, a pair of hard bias layers, deposited on both sides of the multilayer film, for orienting the magnetization direction of the free magnetic layer perpendicular to the magnetization direction of the pinned magnetic layer, and a pair of electrode layers respectively deposited on the hard bias layers, wherein an intermediate layer, made of at least one of a high-resistivity material having a resistance higher than that of the electrode layer and an insulating material, is interposed between each of the hard bias layers and each of the electrode layers, and the electrode layers extend over the multilayer film.

The multilayer film is preferably fabricated by successively laminating the antiferromagnetic layer, the pinned magnetic layer, the nonmagnetic electrically conductive layer, and the free magnetic layer in that order from below, the antiferromagnetic layer laterally extends from the layers laminated thereon, and a pair of hard bias layer, a pair of intermediate layers, and a pair of electrode layers are respectively laminated on a pair of metallic layers respectively deposited on the antiferromagnetic layers in the laterally extending regions thereof.

According to a seventh aspect of the present invention, a magnetoresistive-effect device includes a multilayer film including a free magnetic layer, nonmagnetic electrically conductive layers respectively lying over and under the free magnetic layer, pinned magnetic layers respectively lying over the one nonmagnetic electrically conductive layer and under the other nonmagnetic electrically conductive layer, each having a pinned magnetization direction, and antiferromagnetic layers respectively lying over the one pinned magnetic layer and under the other pinned magnetic layer, and a pair of hard bias layers, deposited on both sides of the multilayer film, for orienting the magnetization direction of the free magnetic layer perpendicular to the magnetization direction of the pinned magnetic layer, and a pair of electrode layers respectively deposited on the hard bias layers, wherein an intermediate layer, made of at least one of a high-resistivity material having a resistance higher than that of the electrode layer and an insulating material, is interposed between each of the hard bias layers and each of the electrode layers and the electrode layers extend over the multilayer film.

The antiferromagnetic layer is preferably made of a PtMn alloy. Alternatively the antiferromagnetic layer may be made of an X—Mn alloy where X is a material selected from the group consisting of Pd, Ir, Rh, Ru, and alloys thereof, or may be made of a Pt—Mn—X alloy where X' is a material selected from the group consisting of Pd, Ir, Rh, Ru, Au, Ag, and alloys thereof.

According to an eighth aspect of the present invention, a magnetoresistive-effect device includes a multilayer film including a magnetoresistive-effect layer, a soft magnetic layer, and a nonmagnetic layer with the magnetoresistive-effect layer and the soft magnetic layer laminated with the nonmagnetic layer interposed therebetween, a pair of hard bias layers deposited on both sides of the multilayer film, and a pair of electrode layers respectively deposited on the hard bias layers, wherein an intermediate layer, made of at least one of a high-resistivity material having a resistance higher than that of the electrode layer and an insulating material, is interposed between each of the hard bias layers and each of the electrode layers and the electrode layers extend over the multilayer film.

The high-resistivity material, which fabricates the intermediate layer interposed between the hard bias layer and the electrode layer, is preferably at least one material selected from the group consisting of $TaSiO_2$, TaSi, $CrSiO_2$, CrSi, WSi, $WSiO_2$, TiN, and TaN.

Alternatively, the high-resistivity material, which fabricates the intermediate layer interposed between the hard bias layer and the electrode layer, is preferably at least one material selected from the group consisting of $Al_2O_3$, $SiO_2$, $Ti_2O_3$, TiO, WO, AlN, $Si_3N_4$, $B_4C$, SiC, and SiAlON.

The multilayer film preferably includes a central sensitive region which provides an excellent reproduction gain, exhibiting a substantial magnetoresistive effect and insensitive regions which are formed on both sides of the sensitive region, and provide a poor reproduction gain, exhibiting no substantial magnetoresistive effect, wherein the electrode layers deposited on both sides of the multilayer film extend over the insensitive regions of the multilayer film.

The sensitive region of the multilayer film is defined as a region which results in an output equal to or greater than 50% of a maximum reproduction output while the insensitive regions of the multilayer film are defined as regions, formed on both sides of the sensitive region, which result in an output smaller than 50% of the maximum reproduction output, when the magnetoresistive-effect device having the electrode layers on both sides only of the multilayer film scans a micro track, having a signal recorded thereon, in the direction of a track width.

The width dimension of the sensitive region of the multilayer film is preferably equal to an optical track width O-Tw.

It is another object of the present invention to provide a magnetoresistive-effect device which restricts a sense current from shunting to a hard bias layer while assuring sufficient insulation in an upper gap layer. To achieve this object, the present invention employs an intermediate layer, made of a high-resistivity material having a resistance higher than that of the electrode layer or an insulating material, interposed between each of the hard bias layers and each of the electrode layers, and the electrode layers extend over the multilayer film.

The intermediate layer of an insulator material interposed between the hard bias layer and the electrode layer reduces a sense current shunting into the hard bias layer (i.e., a current loss). With the electrode layer extending over the multilayer film, the electrode layer is connected to the multilayer film on the top surface thereof, thereby permitting the sense current to directly flow from the electrode layer to the multilayer film.

In accordance with the first through third aspects of the present invention, the electrode layer 210 overlaps the multilayer film 209, but no intermediate layer is interposed between the electrode layer 210 and the hard bias layer 205. To allow the sense current to effectively flow from the electrode layer 210 to the multilayer film 209, the thickness h1 of the electrode layer 210 relative to the multilayer film 209 must be increased to reduce the direct current resistance of the electrode layer 210 and to restrict the sense current from shunting to the hard bias layer 205. In this case, a sharp step develops between the top surface of the electrode layer 210 and the top surface of the multilayer film 209. When an upper gap layer 211 of an insulator material covers the electrode layer 210 and the multilayer film 209, the upper gap layer 211 suffers a poor step coverage, and a film discontinuity occurs at the step. As a result, the upper gap layer 211 fails to provide sufficient insulation.

In accordance with the sixth through eighth aspects of the present invention, the intermediate layer of an insulator material is interposed between the hard bias layer and the electrode layer. The sense current is less likely to shunt from the electrode layer to the hard bias layer regardless of the thickness of the electrode layer. In contrast to the magnetoresistive-effect layer in accordance with the first through third aspects, the sense current effectively flows from the electrode layer to the multilayer film even if the thickness of the electrode layer is decreased relative to the thickness of the multilayer film. The magnetoresistive-effect device of the sixth through eighth aspects works with a thin electrode layer, thereby reducing a step height formed between the top surface of the electrode layer and the top surface of the multilayer film, improving a step coverage of the upper gap layer formed over the border area between the electrode layer and the multilayer film, and thereby providing sufficient insulation.

The multilayer films in a GMR (Giant Magnetoresistance) device and an AMR (Anisotropic Magnetoresistance) device offer a good gain in only a central portion thereof, rather than providing the magnetoresistive effect in the entire area thereof. Only the central portion is a substantially working area for exhibiting the magnetoresistive effect. The portion of the multilayer film having the excellent reproduction gain is called a sensitive region, and portions on both sides of the sensitive region are called insensitive regions. The ratios of the sensitive region and the insensitive regions respectively to the entire multilayer film is measured through the micro track profile method. The micro trap profile method has already been discussed.

Considering that the multilayer film is formed of the sensitive region and the insensitive regions, it is yet another object of the present invention to provide a magnetoresistive-effect device which allows the sense current to predominantly flow into the sensitive region having the substantial magnetoresistive effect. To achieve this object, the electrode layer overlapping the multilayer is set to extend over the insensitive region.

With the electrode layer extending over the insensitive region, the sense current is allowed to predominantly flow into the sensitive region rather than the insensitive regions. The reproduction output is thus increased.

However, the electrode layer extends over but must not reach the sensitive region. As will be discussed later, the electrode layer reaching the sensitive region leads to noise generation and reduction in the reproduction output.

DESCRIPTION OF THE PREFERRED EMBODIMENTS

Figure 1:
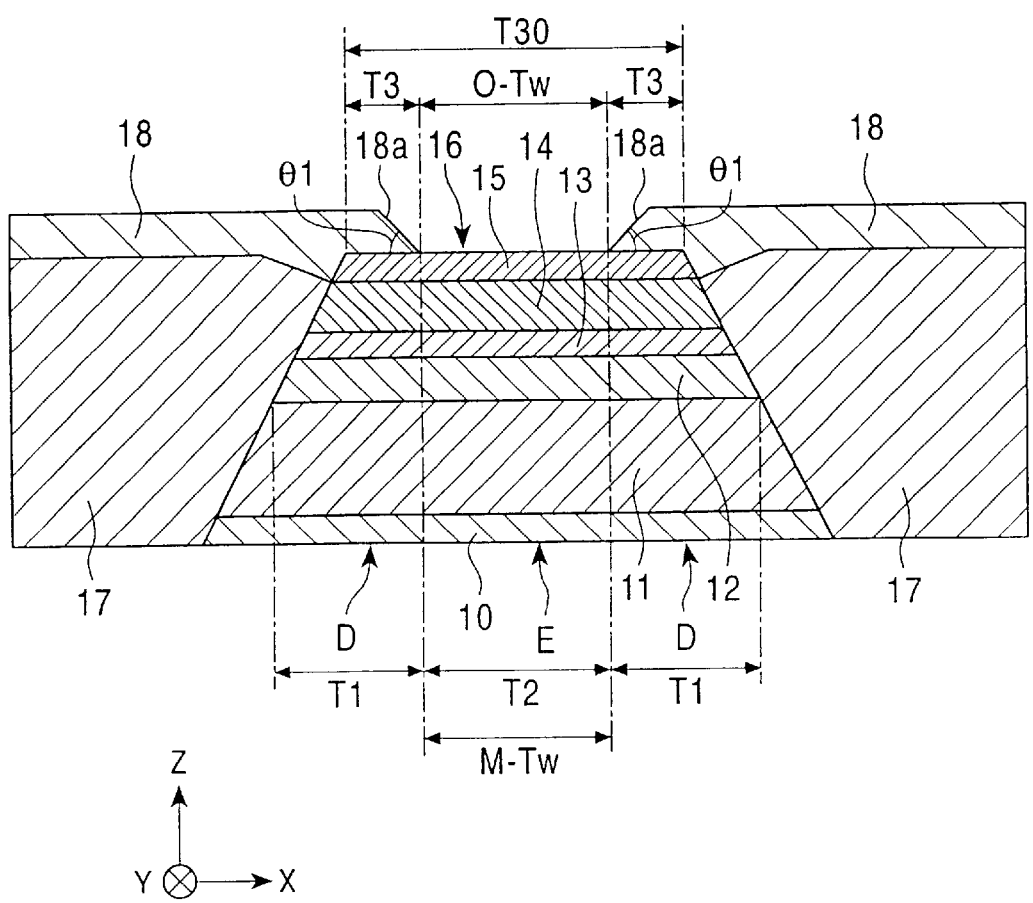
FIG. 1 is a partial cross-sectional view showing the construction of a magnetoresistive-effect device of a first embodiment of the present invention.

FIG. 1 is a cross-sectional view showing the construction of a magnetoresistive-effect device of a first embodiment of the present invention, viewed from an ABS (air bearing surface) side thereof. FIG. 1 shows only the central portion of the device sectioned in an XZ plane.

The magnetoresistive-effect device is a spin-valve type thin-film device, namely, one type of GMR (giant magnetoresistive) devices making use of the giant magnetoresistive effect. The spin-valve type thin-film device is mounted on the trailing end of a floating slider in a hard disk device to detect a magnetic field recorded onto a hard disk. The direction of the movement of a magnetic recording medium such as a hard disk is aligned with the Z direction, and the direction of a leakage magnetic field of the magnetic recording medium is aligned with the Y direction.

A substrate 10, fabricated of a nonmagnetic material such as Ta (tantalum), becomes the bottom layer of the device as shown in FIG. 1. An antiferromagnetic layer 11, a pinned magnetic layer 12, a nonmagnetic electrically conductive layer 13, and a free magnetic layer 14 are successively laminated onto the substrate 10. A protective layer 15, fabricated of Ta (tantalum), is deposited on the free magnetic layer 14. A multilayer film 16 is thus fabricated of the substrate to through the protective layer 15. Referring to FIG. 1, the width dimension of the top surface of the multilayer film 16 is defined as T30.

The pinned magnetic layer 12 is deposited to be in direct contact with the antiferromagnetic layer 11, and is subjected to annealing in the presence of a magnetic field. An exchange anisotropic magnetic field takes place through exchange coupling at the interface between the antiferromagnetic layer 11 and the pinned magnetic layer 12. The magnetization of the pinned magnetic layer 12 is thus pinned in the Y direction.

In accordance with the present invention, the antiferromagnetic layer 11 is made of a Pt—Mn (platinum-manganese) alloy. The Pt—Mn alloy film outperforms an Fe—Mn alloy film and Ni—Mn alloy film, conventionally used as an antiferromagnetic layer, in terms of corrosion resistance, and has a high blocking temperature, and further provides a large exchange anisotropic magnetic field (Hex). The Pt—Mn alloy film has thus excellent characteristics as an antiferromagnetic material.

Instead of the Pt—Mn alloy film, the antiferromagnetic layer 11 may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof.

The pinned magnetic layer 12 and the free magnetic layer 14 are made of an Ni—Fe (nickel-iron) alloy, Co (cobalt), an Fe—Co (iron-cobalt) alloy, or an Fe—Co—Ni alloy, and the nonmagnetic electrically conductive layer 13 is made of a low electrical-resistance nonmagnetic electrically conductive material, such as Cu (copper).

Referring to FIG. 1, hard bias layers 17 and 17 are deposited on both sides of the multilayer film 16, composed of the substrate 10 through the protective layer 15. The hard bias layers 17 and 17 are made of a Co—Pt (cobalt-platinum) alloy or a Co—Cr—Pt (cobalt-chromium-platinum) alloy.

The hard bias layers 17 and 17 are magnetized in the X direction (i.e., the direction of a track width), and the magnetization of the free magnetic layer 14 is aligned in the X direction under the bias magnetic field in the X direction by the hard bias layers 17 and 17.

The portion having a width dimension T2 in the center of the multilayer film 16 as shown in FIG. 1 is a sensitive region E, and the portions, each having a width dimension T1, on both sides of the sensitive region E, are insensitive regions D and D.

In the sensitive region E, the magnetization of the pinned magnetic layer 12 is pinned in the Y direction as shown. Since the magnetization of the free magnetic layer 14 is aligned in the X direction, the magnetization of the pinned magnetic layer 12 is perpendicular to the magnetization of the free magnetic layer 14. The magnetization of the free magnetic layer 14 varies sensitively in response to an external magnetic field from the recording medium. An electrical resistance varies in accordance with the relationship between the variation in the magnetization direction of the free magnetic layer 14 and the pinned magnetic field of the pinned magnetic layer 12. A leakage magnetic field from the recording medium is thus detected in response to a variation in voltage due to the electrical resistance variation.

The sensitive region E of the multilayer film 16 is where the magnetoresistive effect is substantially exhibited, and the reproduction function is excellently performed here.

In contrast, in the insensitive regions D and D formed on both sides of the sensitive region E, the magnetizations of pinned magnetic layer 12 and the free magnetic layer 14 are greatly affected by the hard bias layers 17 and 17, and the magnetization of the free magnetic layer 14 is less varying in response to the external magnetic field. In other words, the insensitive regions D and D provide a weak magnetoresistive effect with a reproduction capability thereof reduced.

Figure 31:
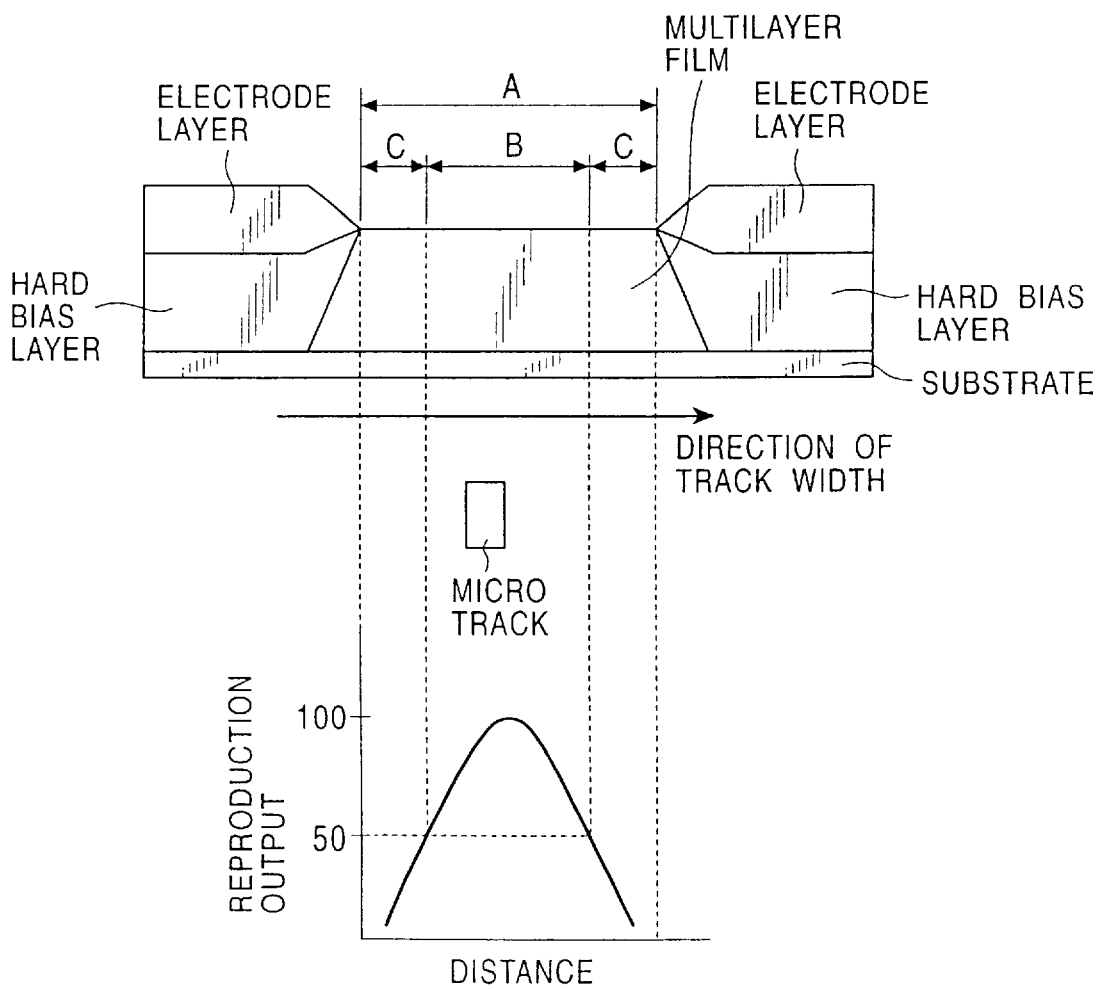
FIG. 31 is a diagram showing a measurement method for measuring a sensitive region and insensitive regions of a multilayer film of the magnetoresistive-effect device.

In this invention, the width dimension T2 of the sensitive region E, and the width dimension of the insensitive region D of the multilayer film 16 are measured through the previously discussed micro track profile method (see FIG. 31).

Referring to FIG. 1 in this invention, the electrode layers 18 and 18, directly deposited on the hard bias layers 17 and 17 on both sides of the multilayer film 16, are formed to extend over the insensitive region D of the multilayer film 16 by a width dimension of T3. The electrode layers 18 and 18 are made of Cr, Au, Ta, or W film, for instance. The width dimension of the top surface of the multilayer film 16 not covered with the electrode layers 18 and 18 is defined as an optical read track width O-Tw measured through an optical method.

The width dimension of the sensitive region E not covered with the electrode layers 18 and 18 substantially functions as a track width, and this width dimension is defined as a magnetic read track width M-Tw.

In the first embodiment shown in FIG. 1, the optical read track width O-Tw, the magnetic read track width M-Tw, and the width dimension T2 of the sensitive region E substantially have the same dimension.

The sense current is less likely to flow from the electrode layers 18 and 18 to the hard bias layers 17 and 17 in the present invention. The percentage of the sense current directly flowing into the multilayer film 16 without passing through the hard bias layers 17 and 17 is thus increased. With the electrode layers 18 and 18 respectively extending over the insensitive regions D and D, the junction area of the multilayer film 16 with the hard bias layers 17 and 17 and the electrode layers 18 and 18 increases, reducing the direct current resistance (DCR) and thereby improving the reproduction characteristics.

When the electrode layers 18 and 18 are formed to extend over the insensitive regions D and D, the sense current flowing into the insensitive regions is controlled and the noise generation is also controlled.

When the optical read track width O-Tw and the width dimension T2 (i.e., the magnetic read track width M-Tw) of the sensitive region E are set to be approximately the same dimension, the sense current more easily flows into the sensitive region E, thereby further improving the reproduction characteristics.

Although the electrode layers 18 and 18 fully cover the insensitive regions D and D in this invention, it is not a requirement that the electrode layers 18 and 18 fully cover the insensitive regions D and D. The insensitive regions D and D may be partly exposed. In this case, the optical read track width O-Tw becomes larger than the magnetic read track width M-Tw. Specifically, the width dimension T3 of each electrode layer 18 extending over the multilayer film 16 is preferably within a range from 0 to 0.08 $\mu$m. The width dimension T3 is more preferably within a range from 0.05 $\mu$m to 0.08 $\mu$m.

Experimentally, it is found that the electrode layer 18 having a width T3 of 0.08 $\mu$m or larger generates a noise signal in the reproduction output. A width dimension of 0.08 $\mu$m is a maximum value on the top surface of the insensitive region D. If the electrode layer 18 having a width T3 of 0.08 $\mu$m or larger is formed, the electrode layer 18 partly covers the sensitive region E.

The electrode layers 18 and 18 extend over the multilayer film 16 but must not extend over the sensitive region E.

The sense current flows out, chiefly from the end of the electrode layer 18 extending over the multilayer film 16. When the electrode layers 18 and 18 are formed on the sensitive region E that substantially exhibits the magnetoresistive effect, the area of the sensitive region E covered with the electrode layer 18 permits the sense current to less flow. The sensitive region E that presents an otherwise excellent magnetoresistive effect is partly degraded, thereby causing a drop in the reproduction output. Since the area of the sensitive region E covered with the electrode layer 18 still has some sensitivity, a variation in the magnetoresistance occurs in both ends of the magnetic read track width M-Tw, inconveniently generating noise.

According to the results of a micro magnetic simulation, when the width dimension T3 of the electrode layer 18 is set to be 0.05 µm or wider, the electrode layers 18 and 18 cover the areas of the free magnetic layer 14 where a magnetization direction-thereof is disturbed, and improves the reproduction characteristics of the magnetoresistive-effect device.

The angle θ1 made between the top surface 15a of the protective layer 15 and an end face 18a of the electrode layer 18 extending over the insensitive region of the multilayer film 16 is preferably 20 degrees or greater, and more preferably 25 degrees or greater. This arrangement prevents the sense current from shunting into the insensitive region, thereby controlling the generation of noise.

If the angle θ1 made between the top surface 15a and the end face 18a is too large, a short is likely to occur between the electrode layer 18 and a top shield layer of a soft magnetic material when the top shield layer is deposited over the protective layer 15 and the electrode layers 18 and 18. The angle θ1 made between the top surface 15a and the end face 18a is preferably 60 degrees or smaller, and more preferably, 45 degrees or smaller.

Figure 2:
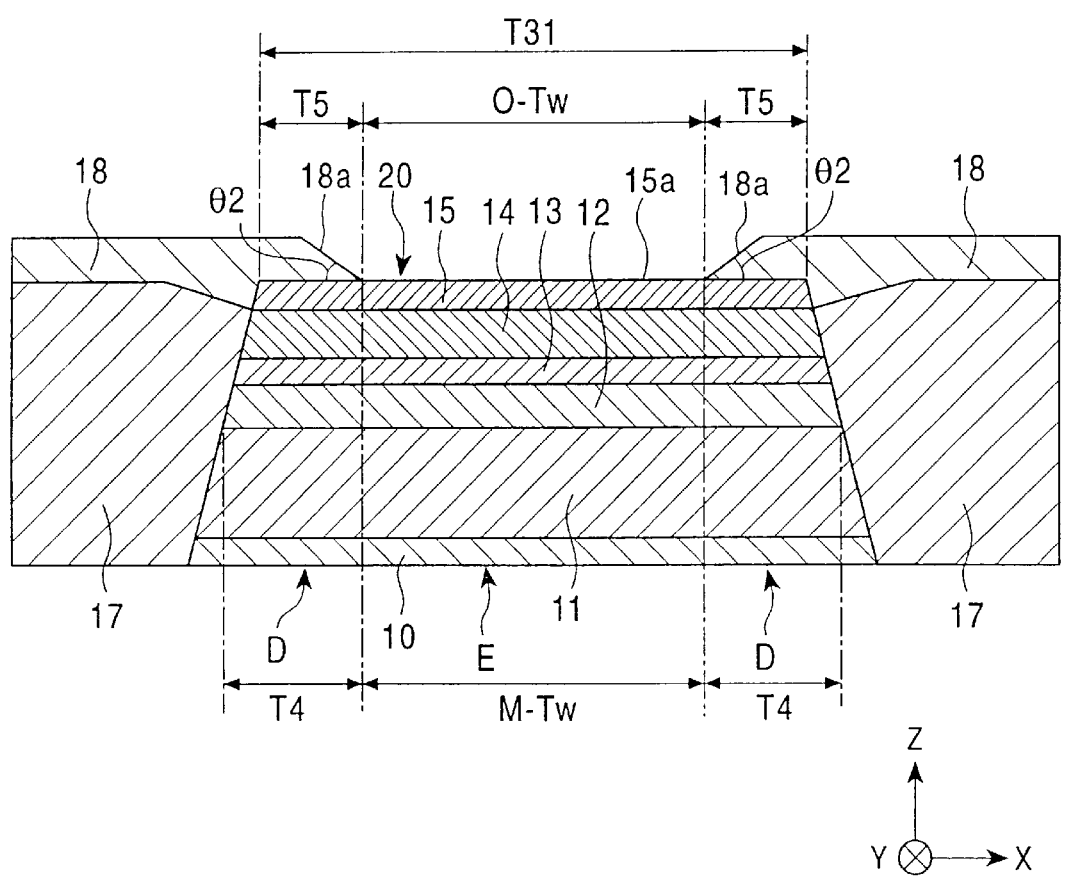
FIG. 2 is a partial cross-sectional view showing the construction of a magnetoresistive-effect device of a second embodiment of the present invention.

A spin-valve type thin-film device shown in FIG. 2 also includes a multilayer film 20 composed of a substrate 10, an antiferromagnetic layer 11, a pinned magnetic layer 12, a nonmagnetic electrically conductive layer 13, a free magnetic layer 14, and a protective layer 15, hard bias layers 17 and 17 deposited on both sides of the multilayer film 20, and electrode layers 18 and 18 respectively deposited on the hard bias layers 17 and 17. Each electrode layer 18 is formed to extend over the multilayer film 20 by a width dimension of T5. The electrode layers 18 and 18 extending over the multilayer film 20 fully cover the insensitive regions D and D. In this case, an optical read track width O-Tw determined by the width dimension of the top surface of the multilayer film 20 is approximately equal to the magnetic read track width dimension M-Tw (i.e., the width dimension of the sensitive region E) determined by the width dimension of the sensitive region E not covered by the electrode layers 18 and 18.

It is not a requirement that the electrode layer 18 fully cover the insensitive region D. The width dimension T5 of the electrode layer 18 extending over the multilayer film 20 may be smaller than the insensitive region D. In this case, the optical read track width O-Tw is larger than the magnetic read track width M-Tw. The width dimension T5 of the electrode layer 18 is preferably within a range from 0 µm to 0.08 µm, and more preferably within a range from 0.05 µm to 0.08 µm. Within these ranges, the direct current resistance is successfully reduced while the reproduction output is free from noise.

In the second embodiment shown in FIG. 2, the width dimension of the top surface of the multilayer film 20 is T31, which is larger than the width dimension T30 of the multilayer film 16 shown in FIG. 1. The multilayer film 20 provides a wider sensitive region E capable of substantially exhibiting the magnetoresistive effect than the multilayer film 16 shown in FIG. 1. The width dimension of the sensitive region E shown in FIG. 2 is approximately equal to the width dimension T30 on the top surface of the multilayer film 16 shown in FIG. 1.

By enlarging the width dimension of the multilayer film 20, the influence by the hard bias layers 17 and 17 is reduced, and the width dimension of the sensitive region E capable of substantially exhibiting the magnetoresistive effect is set to be larger than that of the multilayer film 16 shown in FIG. 1. This is because the width dimension of each of the insensitive regions D and D falls within a certain range regardless of the width dimension T31 of the top surface of the multilayer film 20. For this reason, by setting the width dimension of the multilayer film 20 to any arbitrary dimension, the width dimension of the sensitive region E, i.e., the magnetic read track width M-Tw is also set to be any arbitrary dimension.

More specifically, even if the top surface of the multilayer film 16 is sized to be T30, the portion capable of substantially exhibiting the magnetoresistive effect is limited to the sensitive region D having the width dimension T2 as shown in FIG. 1. The second embodiment shown in FIG. 2 is chiefly intended to enlarge the width dimension of the sensitive region E to be larger than the width dimension T2 of the sensitive region E shown in FIG. 1. The width dimension of the top surface of the multilayer film 20 is enlarged to T31 to this end.

The angle θ2 made between the top surface 15a of the protective layer 15 and an end face 18a of the electrode layer 18 extending over the insensitive region of the multilayer film 20 is preferably 20 degrees or greater, and more preferably 25 degrees or greater. This arrangement prevents the sense current from shunting into the insensitive region, thereby controlling the generation of noise.

If the angle θ2 made between the top surface 15a and the end face 18a is too large, a short is likely to occur between the electrode layer 18 and a top shield layer of a soft magnetic material when the top shield layer is deposited over the protective layer 15 and the electrode layers 18 and 18. The angle θ2 made between the top surface 15a and the end face 18a is preferably 60 degrees or smaller, and more preferably, 45 degrees or smaller.

Figure 3:
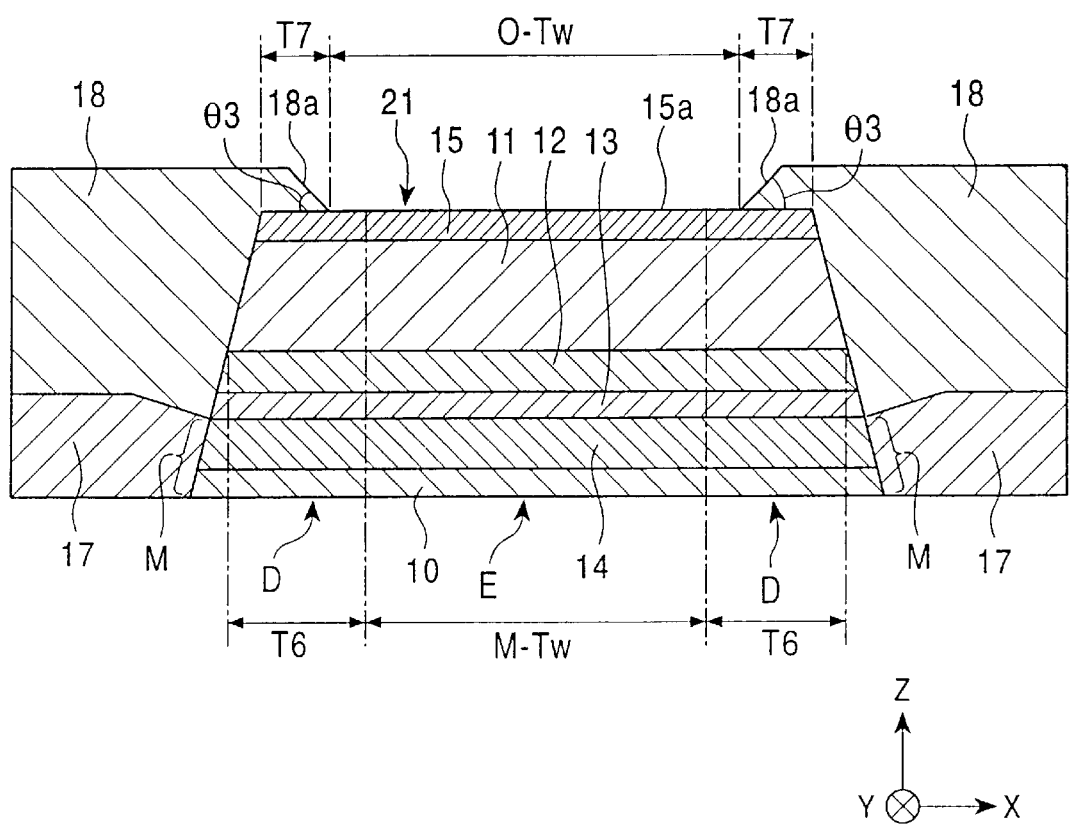
FIG. 3 is a partial cross-sectional view showing the construction of a magnetoresistive-effect device of a third embodiment of the present invention.

A multilayer film 21 in a spin-valve type thin-film device of a third embodiment of the present invention shown in FIG. 3 has an inverted order of the lamination of the multilayer film 20 of the spin-valve type thin-film device shown in FIG. 2. Specifically, a free magnetic layer 14, a nonmagnetic electrically conductive layer 13, a pinned magnetic layer 12, and an antiferromagnetic layer 11 are successively laminated from the substrate 10 as shown in FIG. 3.

In the third embodiment, the free magnetic layer 14 of the multilayer film 21 shown in FIG. 3 is formed beneath the antiferromagnetic layer 11, and is in contact with the thick portion of the hard bias layers 17 and 17. The magnetization of the free magnetic layer 14 is thus easily aligned in the X direction. The generation of Barkhausen noise is thus controlled.

Referring to FIG. 3, the height position of the upper edge of the magnetic coupling junction M between the multilayer film 21 and the hard bias layers 17 and 17 in the direction of the advance of the recording medium (i.e., the Z direction in FIG. 3) is at the same level as the height position of the top surface of the free magnetic layer 14 in the direction of the advance of the recording medium.

It is sufficient if the hard bias layers 17 and 17 are magnetically coupled with the free magnetic layer 14 only. Since the hard bias layers 17 and 17 are magnetically uncoupled with the pinned magnetic layer 12 as shown in FIG. 3, the influence of the magnetic field created by the hard bias layers 17 and 17 on the magnetization direction of the pinned magnetic layer 12 is controlled.

In the third embodiment again, the width dimension of the top surface of the multilayer film 21 is enlarged to be larger than the width dimension T30 of the top surface of the multilayer film 16 shown in FIG. 1. The width dimension of the sensitive region E of the multilayer film 21 is thus larger than the width dimension T2 of the sensitive region E shown in FIG. 1.

Also referring to FIG. 3, the electrode layers 18 and 18 are formed to extend over the multilayer film 21 on both sides thereof by a width dimension T7, covering the insensitive regions D and D of the multilayer film 21. The width dimension T7 of each of the electrode layers 18 and 18 preferably falls within a range from 0 μm to 0.08 μm. More preferably, the width dimension T7 falls within a range from 0.05 μm to 0.08 μm.

In the third embodiment, the electrode layers 18 and 18 deposited above the multilayer film 21 partly cover the insensitive regions D and D, rather than fully covering them. Specifically, as shown in FIG. 3, the optical read track width dimension O-Tw, determined by the width dimension of the top surface of the multilayer film 21 not covered with the electrode layers 18 and 18, is set to be larger than the magnetic read track width M-Tw determined by the width dimension of the sensitive region E not covered with the electrode layers 18 and 18. In this embodiment again, the electrode layers 18 and 18 may fully cover the insensitive regions D and D on the multilayer film 21, thereby setting the optical read track width O-Tw and the magnetic read track width M-Tw (i.e., the width dimension of the sensitive region E) to approximately the same dimension.

The angle θ3 made between the top surface 15a of the protective layer 15 and an end face 18a of the electrode layer 18 extending over the insensitive region of the multilayer film 21 is preferably 20 degrees or greater, and more preferably 25 degrees or greater. This arrangement prevents the sense current from shunting into the insensitive region, thereby controlling the generation of noise.

If the angle θ3 made between the top surface 15a and the end face 18a is too large, a short is likely to occur between the electrode layer 18 and a top shield layer of a soft magnetic material when the top shield layer is deposited over the protective layer 15 and the electrode layers 18 and 18. The angle θ3 made between the top surface 15a and the end face 18a is preferably 60 degrees or smaller, and more preferably, 45 degrees or smaller.

Figure 4:
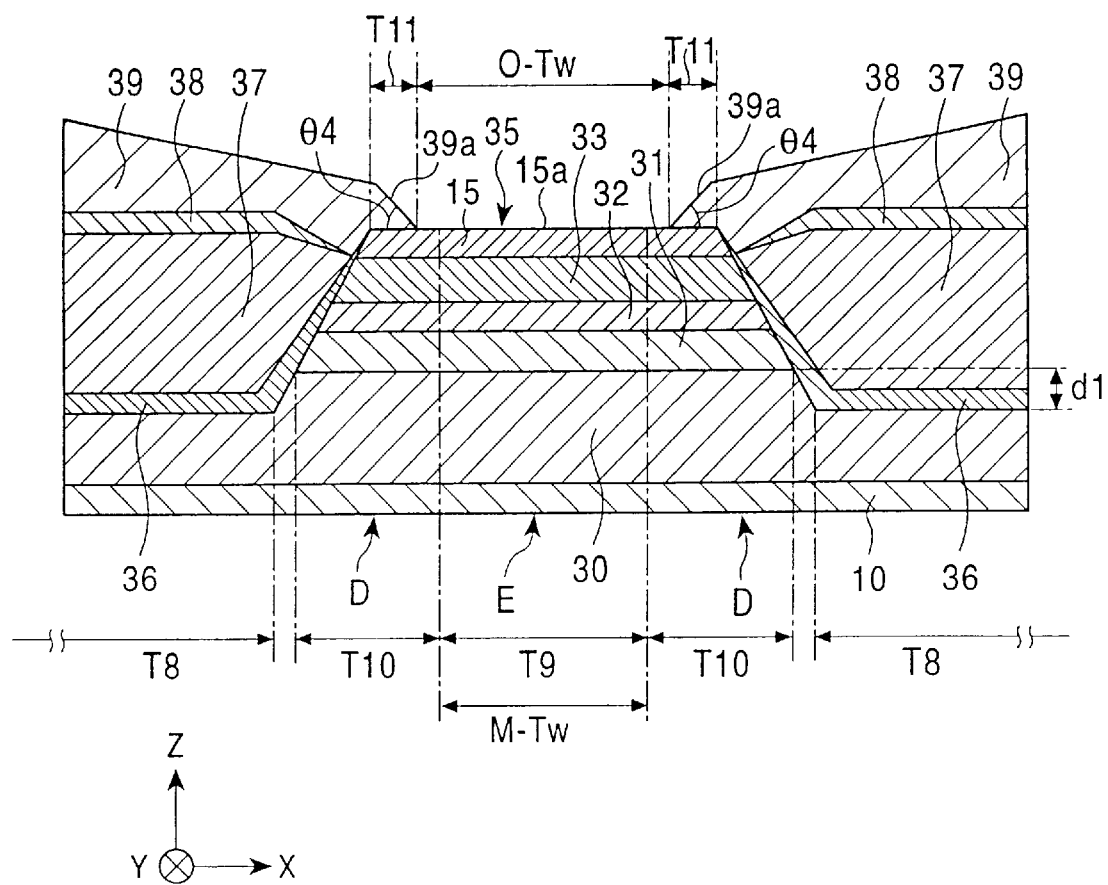
FIG. 4 is a partial cross-sectional view showing the construction of a magnetoresistive-effect device of a fourth embodiment of the present invention.

FIG. 4 is a cross-sectional view showing the construction of the magnetoresistive-effect device of a fourth embodiment of the present invention, viewed from an ABS side thereof.

A spin-valve type thin-film device shown in FIG. 4 has an antiferromagnetic layer 30 formed and extending on and along the substrate 10 in the X direction. The antiferromagnetic layer 30 is projected upward by a height dimension d1 on the center of the device along the X direction. A pinned magnetic layer 31, a nonmagnetic electrically conductive layer 32, a free magnetic layer 33, and a protective layer 15 are successively laminated on the projected antiferromagnetic layer 30. The laminate, composed of the layers from the substrate 10 through the protective layer 15, forms a multilayer film 35.

In the present invention, the antiferromagnetic layer 30 is made of a Pt—Mn (platinum-manganese) alloy. Instead of the Pt—Mn alloy film, the antiferromagnetic layer 30 may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof.

The pinned magnetic layer 31 and the free magnetic layer 33 are made of an Ni—Fe (nickel-iron) alloy, Co (cobalt), an Fe—Co (iron-cobalt) alloy, or an Fe—Co—Ni alloy, and the nonmagnetic electrically conductive layer 32 is made of a low electrical-resistance nonmagnetic electrically conductive material, such as Cu (copper).

Referring to FIG. 4, metallic layers 36 and 36, made of Cr or the like, and functioning as a buffer layer or a alignment layer, extend from a horizontal portion thereof coextending a width dimension T8 of the antiferromagnetic layer 30 in the X direction, rising along the side end faces of the pinned magnetic layer 31, the nonmagnetic electrically conductive layer 32, and the free magnetic layer 33. The use of the metallic layer 36 helps increase the strength of the bias magnetic field created by hard bias layers 37 and 37.

Deposited on top of the metallic layers 36 and 36 are the hard bias layers 37 and 37 which are made of a Co—Pt (cobalt-platinum) alloy or a Co—Cr—Pt (cobalt-chromium-platinum) alloy.

The hard bias layers 37 and 37 are magnetized in the X direction (i.e., the direction of the track width) as shown, and the magnetization direction of the free magnetic layer 33 is thus aligned in the X direction under the bias field in the X direction caused by the hard bias layers 37 and 37.

Since the antiferromagnetic layer 30 extends beneath and along the hard bias layers 37 and 37 as shown in FIG. 4, the thickness of the hard bias layers 37 and 37 can be made thinner. The hard bias layers 37 and 37 are thus easily produced using a sputtering technique.

Intermediate layers 38 and 38, made of a nonmagnetic material, such as Ta, are respectively deposited on the hard bias layers 37 and 37. Electrode layers 39 and 39, made of Cr, Au, Ta, or W, are respectively deposited on top of the intermediate layers 38 and 38.

In the fourth embodiment again, the sensitive region E and the insensitive regions D and D of the multilayer film 35 are measured using the micro track profile method. Referring to FIG. 4, the portion of the multilayer film 35 having a width dimension T9 represents the sensitive region E, and the portion having a width dimension T10 represents each of the insensitive regions D and D.

In the sensitive region E, the magnetization direction of the pinned magnetic layer 31 is pinned correctly parallel to the Y direction, and the magnetization direction of the free magnetic layer 33 is correctly aligned in the X direction. The pinned magnetic layer 31 and the free magnetic layer 33 are thus perpendicular in magnetization direction. The magnetization of the free magnetic layer 33 varies sensitively in response to an external magnetic field from the recording medium. An electrical resistance varies in accordance with the relationship between the variation in the magnetization direction of the free magnetic layer 33 and the pinned magnetic field of the pinned magnetic layer 31. A leakage magnetic field from the recording medium is thus detected in response to a variation in voltage due to the electrical resistance variation.

The electrode layers 39 and 39 deposited both sides of the multilayer film 35 are formed to extend over the multilayer film 35, and the width dimension of the top surface of the multilayer film 35 having no electrode layers 39 formed thereon is the optical read width dimension O-Tw.

The magnetic read track width M-Tw determined by the width dimension of the sensitive region E not covered with the electrode layers 39 and 39 is equal to the width dimension T9, which is also equal to the size of the sensitive region E.

Since the electrode layer 39 formed on the multilayer film 35 is narrower than the width of the insensitive region D, and does not fully cover the insensitive region D in this embodiment, the optical read track width O-Tw is larger than the magnetic read track width M-Tw. The electrode layers 39 and 39 formed on the multilayer film 35 may fully cover the insensitive regions D and D, setting the optical read track width O-Tw and the magnetic read track width M-Tw (i.e., the width dimension of the sensitive region E) to approximately the same dimension.

The percentage of the sense current flowing from the electrode layers 39 and 39 to the multilayer film 35 without passing through the hard bias layers 37 and 37 is increased in this invention. With the electrode layers 39 and 39 respectively extending over the insensitive regions D and D, the junction area of the multilayer film 35 and the hard bias layers 37 and 37 and the electrode layers 39 and 39 is increased, reducing the direct current resistance (DCR) and improving the reproduction characteristics.

Furthermore, the electrode layers 39 and 39 extending over the insensitive regions D and D restricts the sense current from flowing into the insensitive regions D and D, thereby controlling the generation of noise.

As shown in FIG. 4, the width dimension T11 of the electrode layer 39 extending over the insensitive region D of the multilayer film 35 preferably falls within a range from 0 $\mu$m to 0.08 $\mu$m. More preferably, the width dimension T11 falls within a range from 0.05 $\mu$m to 0.08 $\mu$m.

The angle $\theta 4$ made between the top surface 15a of the protective layer 15 and an end face 39a of the electrode layer 39 extending over the insensitive region of the multilayer film 35 is preferably 20 degrees or greater, and more preferably 25 degrees or greater. This arrangement prevents the sense current from shunting into the insensitive region, thereby controlling the generation of noise.

If the angle $\theta 4$ made between the top surface 15a and the end face 39a is too large, a short is likely to occur between the electrode layer 39 and a top shield layer of a soft magnetic material when the top shield layer is deposited over the protective layer 15 and the electrode layers 39 and 39. The angle $\theta 4$ made between the top surface 15a and the end face 39a is preferably 60 degrees or smaller, and more preferably, 45 degrees or smaller.

Figure 5:
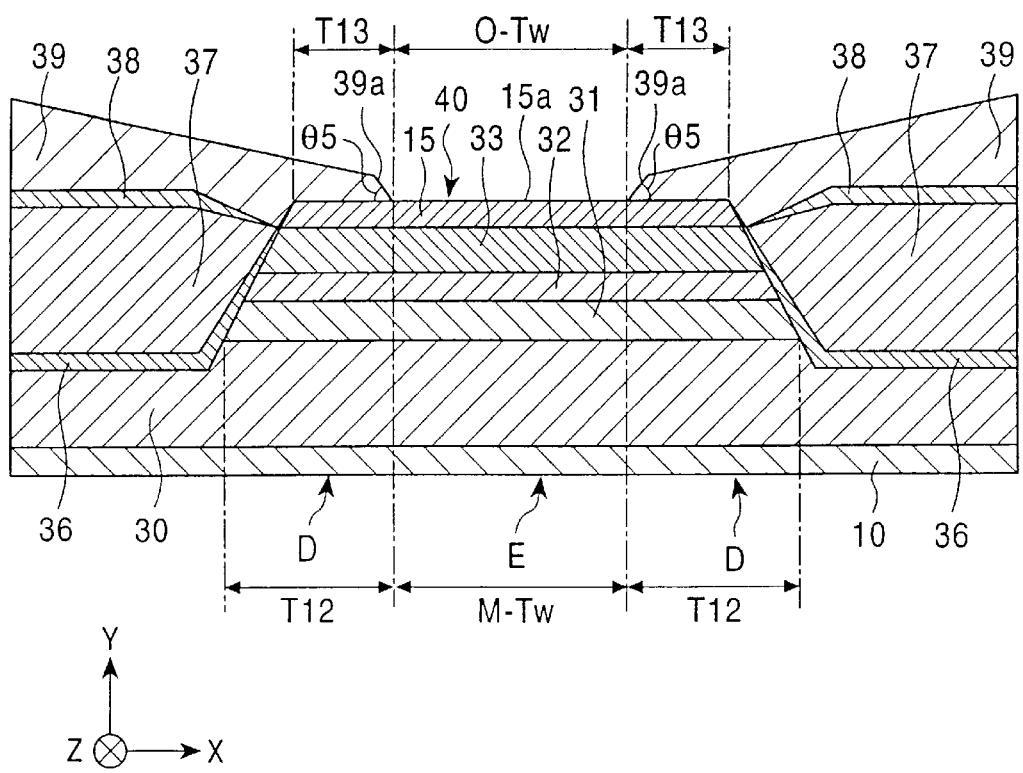
FIG. 5 is a partial cross-sectional view showing the construction of a magnetoresistive-effect device of a fifth embodiment of the present invention.

A spin-valve type thin-film device of a fifth embodiment of the present invention shown in FIG. 5 has a construction identical to that of the spin-valve type thin-film device shown in FIG. 4. However, the width dimension of a multilayer film 40 in the spin-valve type thin-film device in FIG. 5 is set to be larger in the X direction than that of the top surface of the multilayer film 35 in the spin-valve type thin-film device shown in FIG. 4.

The width dimension of the sensitive region E of the multilayer film 40 shown in FIG. 5 is thus larger than the width dimension T9 of the sensitive region E of the multilayer film 35 shown in FIG. 4.

The electrode layers 39 and 39 deposited on both sides of the multilayer film 40 extend over the multilayer film 40, and the width dimension of the top surface of the multilayer film 40 having no electrode layers 39 and 39 formed thereon is defined as the optical read track width O-Tw.

Since the electrode layers 39 and 39 formed on top of the multilayer film 40 substantially cover the insensitive regions D and D as shown FIG. 5, the optical read track width O-Tw becomes approximately equal to the magnetic read track width M-Tw (i.e., the width dimension of the sensitive region E) determined by the width dimension of the sensitive region E not covered with the electrode layers 39 and 39. It is not a requirement that the electrode layers 39 and 39 fully cover the insensitive regions D and D. If the electrode layers 39 and 39 do not fully cover the insensitive regions D and D, the optical read track width O-Tw becomes larger than the magnetic read track width M-Tw. The width dimension T13 of each of the electrode layers 39 and 39 extending over the insensitive regions D and D of the multilayer film 40 preferably falls within a range from 0 $\mu$m to 0.08 $\mu$m. More preferably, the width dimension T13 falls within a range from 0.05 $\mu$m to 0.08 $\mu$m.

The angle $\theta 5$ made between the top surface 15a of the protective layer 15 and an end face 39a of the electrode layer 39 extending over the insensitive region of the multilayer film 40 is preferably 20 degrees or greater, and more preferably 25 degrees or greater. This arrangement prevents the sense current from shunting into the insensitive region, thereby controlling the generation of noise.

If the angle $\theta 5$ made between the top surface 15a and the end face 39a is too large, a short is likely to occur between the electrode layer 39 and a top shield layer of a soft magnetic material when the top shield layer is laminated over the protective layer 15 and the electrode layers 39 and 39. The angle $\theta 5$ made between the top surface 15a and the end face 39a is preferably 60 degrees or smaller, and more preferably, 45 degrees or smaller.

Figure 6:
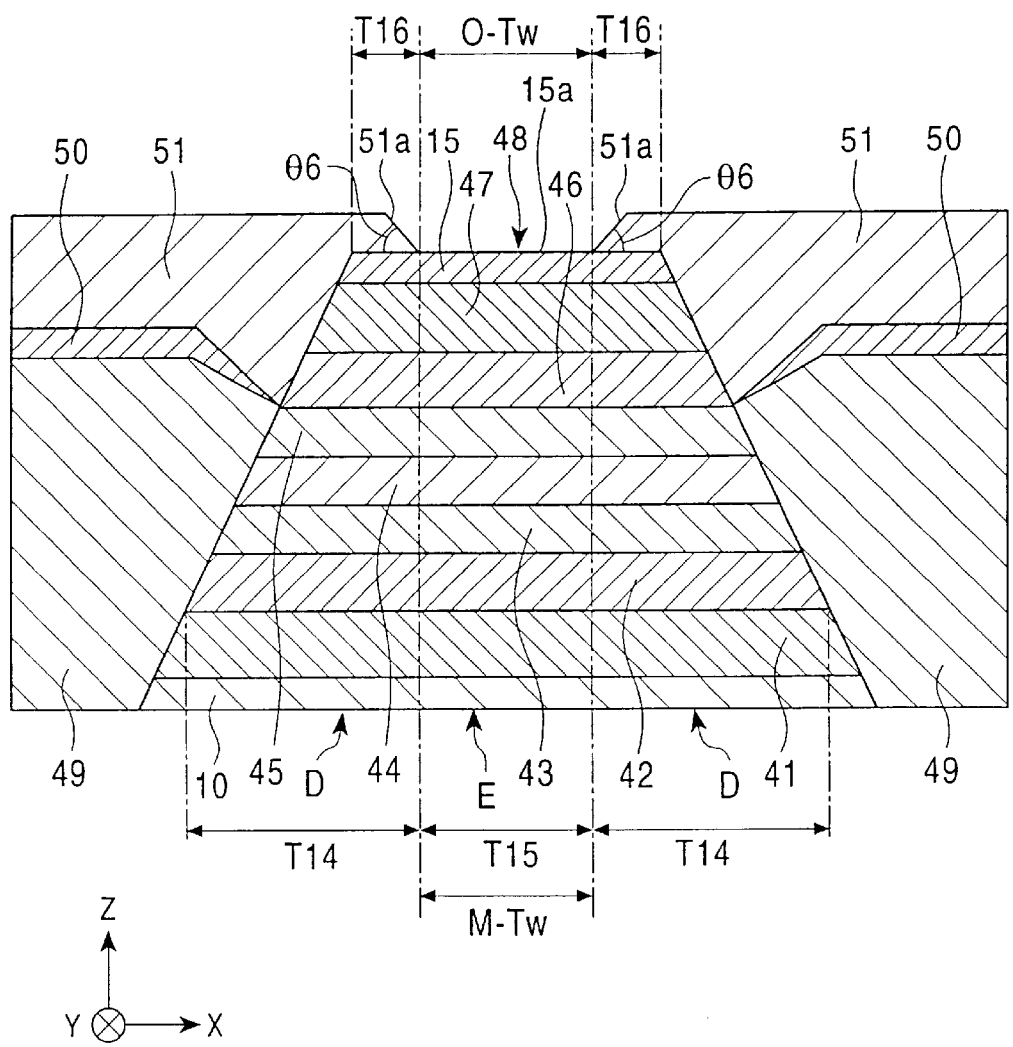
FIG. 6 is a partial cross-sectional view showing the construction of a magnetoresistive-effect device of a sixth embodiment of the present invention.

FIG. 6 is a cross-sectional view showing the construction of the magnetoresistive-effect device of a sixth embodiment of the present invention, viewed from an ABS side thereof.

This spin-valve type thin-film device is a so-called dual spin-valve type thin-film device, which includes a free magnetic layer 44, nonmagnetic electrically conductive layers 45 and 43 respectively lying over and under the free magnetic layer 44, pinned magnetic layers 46 and 42 respectively lying over and under the nonmagnetic electrically conductive layers 45 and 43, and antiferromagnetic layers 47 and 41 respectively lying over and under the pinned magnetic layers 46 and 42. The dual spin-valve type thin-film device provides a reproduction output higher in level than that of the spin-valve type thin-film devices (i.e., so-called single spin-valve type thin-film devices) shown in FIG. 1 through FIG. 5. The layer lying at the bottom is the substrate 10, while the layer lying on the top is a protective layer 15. The laminate, composed of the layers from the substrate 10 through the protective layer 15, constitutes a multilayer film 48.

In the sixth embodiment of the present invention, the antiferromagnetic layers 41 and 47 are is made of a Pt—Mn (platinum-manganese) alloy. Instead of the Pt—Mn alloy, the antiferromagnetic layers 41 and 47 may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof.

The pinned magnetic layers 42 and 46 and the free magnetic layer 44 are made of an Ni—Fe (nickel-iron) alloy, Co (cobalt), an Fe—Co (iron-cobalt) alloy, or an Fe—Co—Ni alloy, and the nonmagnetic electrically conductive layers 43 and 45 are made of a low electrical-resistance nonmagnetic electrically conductive material such as Cu (copper).

The hard bias layers 49 and 49 are deposited on both sides of the multilayer film 48 as shown in FIG. 6, and the hard bias layers 49 and 49 are made of a Co—Pt (cobalt-platinum) alloy or a Co—Cr—Pt (cobalt-chromium-platinum) alloy.

The hard bias layers 49 and 49 are magnetized in the X direction (i.e., the direction of the track width) as shown, and the magnetization direction of the free magnetic layer 44 is thus aligned in the X direction under the bias field in the X direction caused by the hard bias layers 49 and 49.

In the sixth embodiment again, the sensitive region E and the insensitive regions D and D of the multilayer film 48 are measured using the micro track profile method. As shown in FIG. 6, the portion having the width dimension T15 centrally positioned on the multilayer film 48 is the sensitive region E, and the portions having the width dimension T14 are the insensitive regions D and D.

In the sensitive region E, the magnetization direction of the pinned magnetic layers 42 and 46 is pinned correctly in the Y direction, and the magnetization direction of the free magnetic layer 44 is correctly aligned in the X direction. The pinned magnetic layers 42 and 46 and the free magnetic layer 44 are thus perpendicular in magnetization direction. The magnetization of the free magnetic layer 44 varies sensitively in response to an external magnetic field from the recording medium. An electrical resistance varies in accordance with the relationship between the variation in the magnetization direction of the free magnetic layer 44 and the pinned magnetic field of the pinned magnetic layers 42 and 46. A leakage magnetic field from the recording medium is thus detected in response to a variation in voltage due to the electrical resistance variation.

Referring to FIG. 6 in this invention, intermediate layers 50 and 50 made of a nonmagnetic material are respectively deposited on the hard bias layers 49 and 49 on both sides of the multilayer film 48. Electrode layers 51 and 51 are then respectively deposited on the intermediate layers 50 and 50 and respectively extend over the insensitive regions D and D of the multilayer film 48. The electrode layers 51 and 51 are made of Cr, Au, Ta, or W film, for instance.

The width dimension of the top surface of the multilayer film 48 not covered with the electrode layers 51 and 51 is defined as an optical read track width O-Tw. The width dimension T15 of the sensitive region E not covered with the electrode layers 51 and 51 is defined as the magnetic read track width M-Tw. In the sixth embodiment, the electrode layers 51 and 51 extending over the multilayer film 48 fully cover the insensitive regions D and D. The optical read track width O-Tw is approximately equal to the magnetic read track width M-Tw (i.e., the width dimension of the sensitive region E).

It is not a requirement that the electrode layers 51 and 51 fully cover the insensitive regions D and D, and the width dimension T5 of the electrode layer 51 extending over the multilayer film 48 is smaller than the insensitive region D. In this case, the optical read track width O-Tw becomes larger than the magnetic read track width M-Tw.

This arrangement makes it easier for the sense current to directly flow from the electrode layer 51 into the multilayer film 48 without passing through the hard bias layer 49. With the electrode layers 51 and 51 respectively extending over the insensitive regions D and D, the junction area between the multilayer film 48 and the hard bias layer 49 and the electrode layer 51 is increased, reducing the direct current resistance (DCR) and thereby improving the reproduction characteristics.

Furthermore, the electrode layers 51 and 51 respectively extending over the insensitive regions D and D prevent the sense current flowing into the insensitive regions D and D, thereby controlling the generation of noise.

Referring to FIG. 6, the width dimension T16 of each of the electrode layers 51 and 51 extending over the insensitive regions D and D of the multilayer film 48 preferably falls within a range from 0 $\mu$m to 0.08 $\mu$m. More preferably, the width dimension T16 falls within a range from 0.05 $\mu$m to 0.08 $\mu$m.

The angle $\theta 6$ made between the top surface 15a of the protective layer 15 and an end face 51a of the electrode layer 51 extending over the insensitive region of the multilayer film 48 is preferably 20 degrees or greater, and more preferably 25 degrees or greater. This arrangement prevents the sense current from shunting into the insensitive region; thereby controlling the generation of noise.

If the angle $\theta 6$ made between the top surface 15a and the end face 51a is too large, a short is likely to occur between the electrode layer 51 and a top shield layer of a soft magnetic material when the top shield layer is deposited over the protective layer 15 and the electrode layers 51and 51. The angle $\theta 6$ made between the top surface 15a and the end face 51a is preferably 60 degrees or smaller, and more preferably, 45 degrees or smaller.

Figure 7:
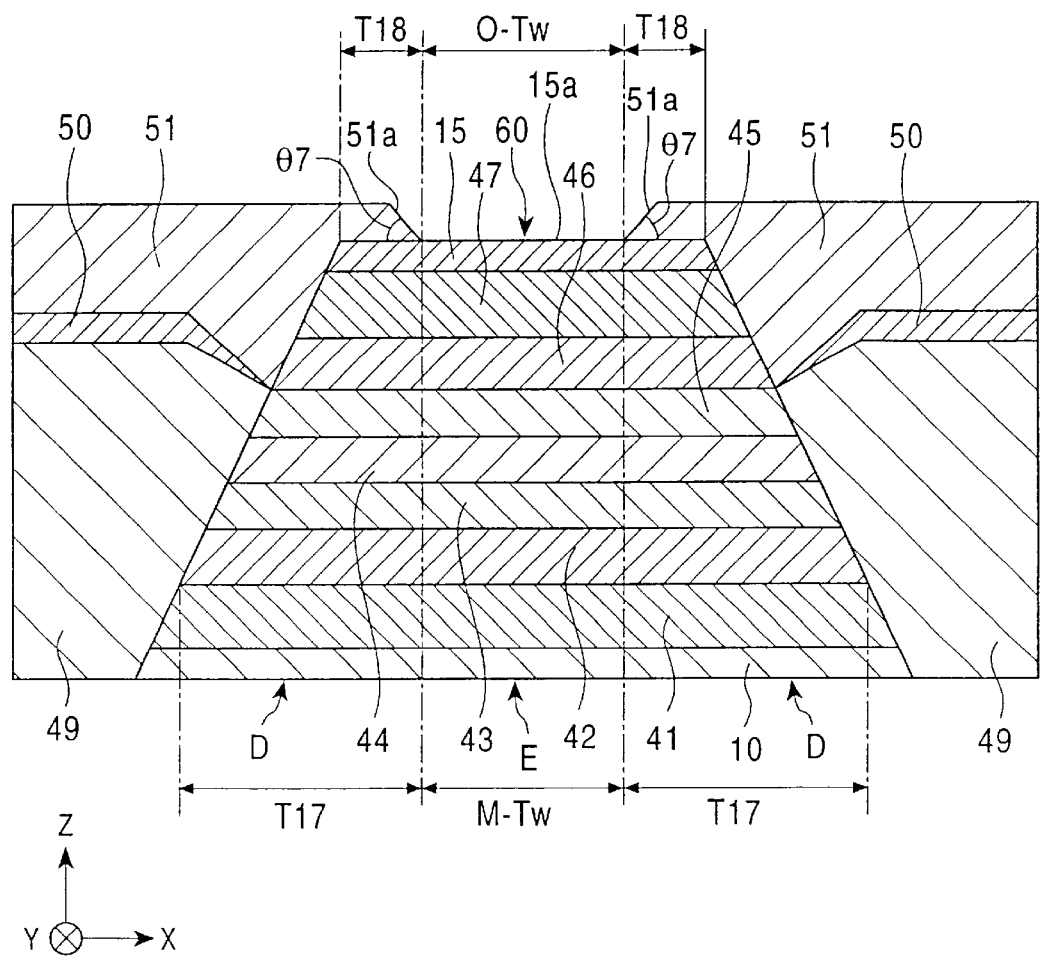
FIG. 7 is a partial cross-sectional view showing the construction of a magnetoresistive-effect device of a seventh embodiment of the present invention.

A dual spin-valve type thin-film device of a seventh embodiment of the present invention shown in FIG. 7 has a construction identical to that of the dual spin-valve type thin-film device shown in FIG. 6. However, the width dimension of a multilayer film 60 in the spin-valve type thin-film device in FIG. 7 is set to be larger in the X direction than that of the multilayer film 48 in the spin-valve type thin-film device shown in FIG. 6.

Referring to FIG. 7, the multilayer film 60 is formed to be longer than the multilayer film 48 shown in FIG. 6, and the width dimension of the sensitive region E of the multilayer film 60 is thus larger than the width dimension of the sensitive region E of the multilayer film 48.

The electrode layers 51 and 51 formed on both sides of the multilayer film 60 extend over the multilayer film 60, and the insensitive regions D and D of the multilayer film 60 are covered with the electrode layers 51 and 51.

The width dimension T18 of each of the electrode layers 51 and 51 extending over the insensitive regions D and D of the multilayer film 60 preferably falls within a range from 0 $\mu$m to 0.08 $\mu$m. More preferably, the width dimension T18 falls within a range from 0.05 $\mu$m to 0.08 $\mu$m. The angle $\theta 7$ made between the top surface 15a of the protective layer 15 and an end face 51a of the electrode layer 51 extending over the insensitive region of the multilayer film 60 is preferably 20 degrees or greater, and more preferably 25 degrees or greater. This arrangement prevents the sense current from shunting into the insensitive region, thereby controlling the generation of noise.

If the angle $\theta 7$ made between the top surface 15a and the end face 51a is too large, a short is likely to occur between the electrode layer 51 and a top shield layer of a soft magnetic material when the top shield layer is deposited over the protective layer 15 and the electrode layers 51 and 51. The angle $\theta 7$ made between the top surface 15a and the end face 51a is preferably 60 degrees or smaller, and more preferably, 45 degrees or smaller.

Figure 8:
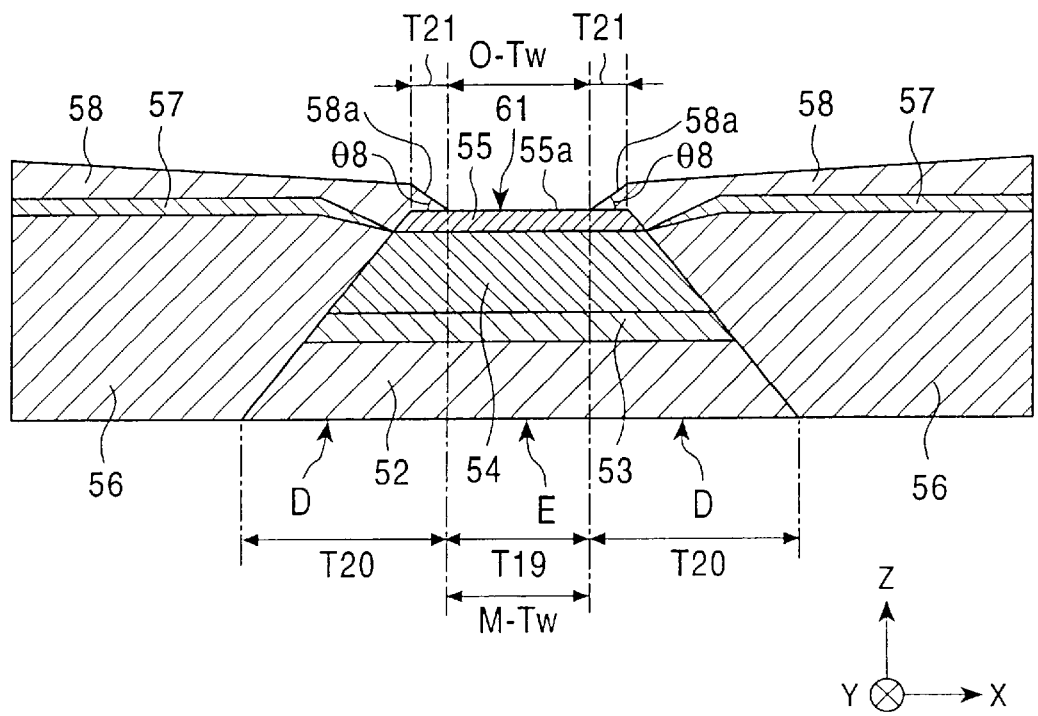
FIG. 8 is a partial cross-sectional view showing the construction of a magnetoresistive-effect device of an eighth embodiment of the present invention.

FIG. 8 is a cross-sectional view of the magnetoresistive-effect device of an eighth embodiment of the present invention, viewed from an ABS side thereof.

The magnetoresistive-effect device shown in FIG. 8 is called an anisotropic magnetoresistive-effect (AMR) device. A soft magnetic layer (a SAL layer) 52, a nonmagnetic layer (a shunt layer) 53, a magnetoresistive layer (MR layer) 54, and a protective layer 55 are successively laminated in that order to form a multilayer film 61. Hard bias layers 56 and 56 are formed on both sides of the multilayer film 61.

Typically, the soft magnetic layer 52 is made of an NiFeNb alloy, the nonmagnetic layer 53 is made of Ta, the magnetoresistive layer 54 is made of an NiFe alloy, and the hard bias layers 56 and 56 are made of a CoPt alloy.

In the eight embodiment again, the sensitive region E and the insensitive regions D and D of the multilayer film 61 are measured using the micro track profile method. The portion having the width dimension T19 centrally positioned on the multilayer film 61 is the sensitive region E, and the portions, each having the width dimension T20, are the insensitive regions D and D.

Intermediate layers 57 and 57, made of a nonmagnetic material, are respectively deposited on the hard bias layers 56 and 56 on both sides of the multilayer film 61, and electrode layers 58 and 58, made of Cr, Au, Ta, or W, are respectively formed on the intermediate layers 57 and 57.

Referring to FIG. 8, the electrode layers 58 and 58 are formed to extend over the multilayer film 61. The width dimension of the top surface of the multilayer film 61 having no electrode layer 58 thereon is the optical read track width O-Tw, and the width dimension of the sensitive region E not covered with the electrode layer 58 is the magnetic read track width M-Tw. In the eighth embodiment, the electrode layers 58 and 58 extending over the multilayer film 61 fully cover the insensitive regions D and D. The optical read track width O-Tw is thus approximately equal to the magnetic read track width M-Tw.

It is not a requirement that the electrode layers 58 and 58 fully cover the insensitive regions D and D, and the width dimension T21 of the electrode layer 58 extending over the multilayer film 61 may be smaller than the insensitive region D. In this case, the optical read track width O-Tw becomes larger than the magnetic read track width M-Tw.

This arrangement makes it easier for the sense current to directly flow from the electrode layer 51 into the multilayer film 48 without passing through the hard bias layer 49. With the electrode layers 58 and 58 respectively extending over the insensitive regions D and D, the junction area between the multilayer film 61 and the hard bias layer 56 and the electrode layer 58 is increased, reducing the direct current resistance (DCR) and thereby improving the reproduction characteristics.

Furthermore, the electrode layers 58 and 58 respectively extending over the insensitive regions D and D prevent the sense current flowing into the insensitive regions D and D, thereby controlling the generation of noise.

The width dimension T21 of each of the electrode layers 58 and 58 extending over the insensitive regions D and D of the multilayer film 61 preferably falls within a range from 0 $\mu$m to 0.08 $\mu$m. More preferably, the width dimension T21 falls within a range from 0.05 $\mu$m to 0.08 $\mu$m.

In the AMR device, the hard bias layer 56 is magnetized in the X direction as shown, and the magnetoresistive layer 54 is supplied with the bias magnetic field in the X direction by the hard bias layer 56. Furthermore, the magnetoresistive layer 54 is supplied with the bias field in the Y direction by the soft magnetic layer 52. With the magnetoresistive layer 54 supplied with the bias magnetic fields in the X direction and Y direction, a variation in magnetization thereof in response to a variation in the magnetic field becomes linear.

The sense current from the electrode layer 58 is directly fed to the magnetoresistive layer 54 in the sensitive region E. The direction of the advance of the recording medium is aligned with the Z direction. When a leakage magnetic field from the recording medium in the Y direction is applied, the magnetization direction of the magnetoresistive layer 54 varies, causing a variation in the resistance. The resistance variation is then detected as a voltage variation.

The angle $\theta8$ made between the top surface 55a of the protective layer 55 and an end face 58a of the electrode layer 58 extending over the insensitive region of the multilayer film 61 is preferably 20 degrees or greater, and more preferably 25 degrees or greater. This arrangement prevents the sense current from shunting into the insensitive region, thereby controlling the generation of noise.

If the angle $\theta8$ made between the top surface 55a and the end face 58a is too large, a short is likely to occur between the electrode layer 58 and a top shield layer of a soft magnetic material when the top shield layer is deposited over the protective layer 55 and the electrode layers 58 and 58. The angle $\theta8$ made between the top surface 55a and the end face 58a is preferably 60 degrees or smaller, and more preferably, 45 degrees or smaller.

Figure 9:
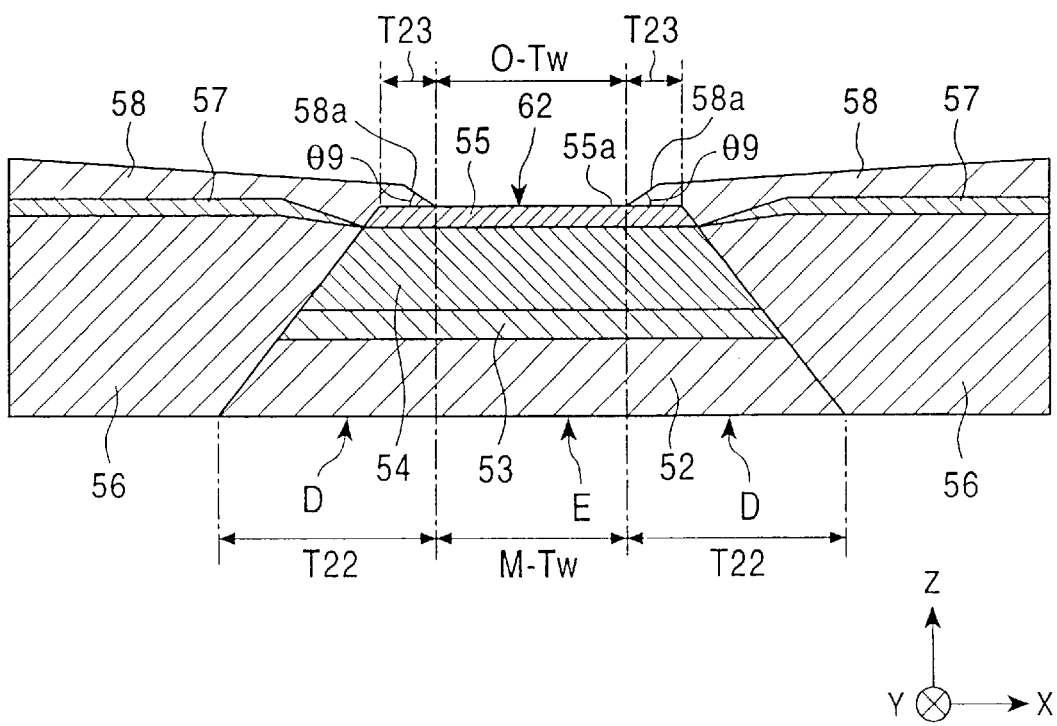
FIG. 9 is a partial cross-sectional view showing the construction of a magnetoresistive-effect device of a ninth embodiment of the present invention.

An AMR device of a ninth embodiment of the present invention shown in FIG. 9 has a construction identical to that of the AMR shown in FIG. 8. However, the width dimension of a multilayer film 62 is set to be larger than the width dimension of the multilayer film 61 in the X direction, as shown in FIG. 8. The sensitive region E of the multilayer film 62 shown in FIG. 9 is therefore larger in width dimension than the sensitive region E of the multilayer film 61 shown in FIG. 8.

Each of electrode layers 58 and 58 formed on both sides of the multilayer film 62 extends over the multilayer film 62. The insensitive regions D and D are thus covered with the electrode layers 58 and 58.

The width dimension T23 of each of the electrode layers 58 and 58 extending over the insensitive regions D and D of the multilayer film 62 preferably falls within a range from 0 $\mu$m to 0.08 $\mu$m. More preferably, the width dimension T23 falls within a range from 0.05 $\mu$m to 0.08 $\mu$m.

The angle $\theta9$ made between the top surface 55a of the protective layer 55 and an end face 58a of the electrode layer 58 extending over the insensitive region of the multilayer film 62 is preferably 20 degrees or greater, and more preferably 25 degrees or greater, and preferably 60 degrees or smaller, and more preferably, 45 degrees or smaller.

Figure 10:
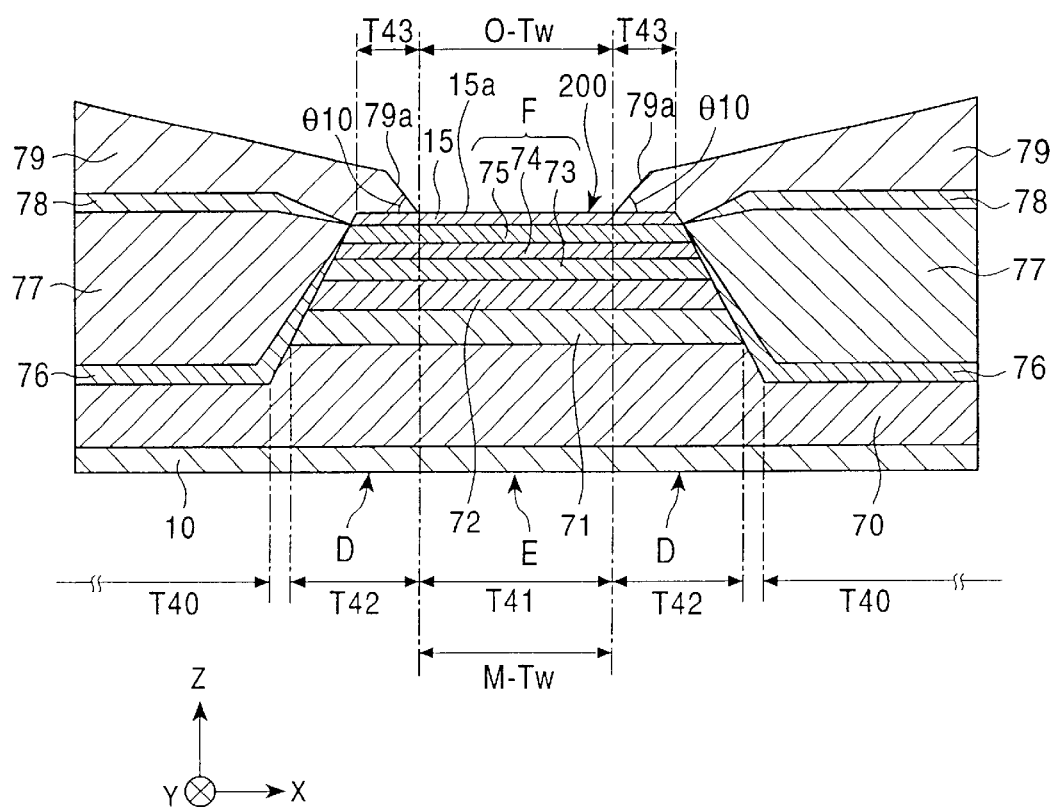
FIG. 10 is a partial cross-sectional view showing the construction of a magnetoresistive-effect device of a tenth embodiment of the present invention.

FIG. 10 is a cross-sectional view showing the construction of the magnetoresistive-effect device of a tenth embodiment of the present invention, viewed from an ABS side thereof.

The spin-valve type thin-film device shown in FIG. 10 includes an antiferromagnetic layer 70 which has a long portion extending on and along a substrate 10 in the X direction as shown. The antiferromagnetic layer 70 is projected upward in a central portion thereof. Laminated on the projected portion of the antiferromagnetic layer 70 are a pinned magnetic layer 71, a nonmagnetic electrically conductive layer 72, a first free magnetic layer 73, a nonmagnetic material layer 74, a second free magnetic layer 75, and a protective layer 15. The laminate, composed of the layers from the substrate 10 through the protective layer 15, forms a multilayer film 200.

The pinned magnetic layer 71 is deposited on and in contact with the antiferromagnetic layer 70, and is subjected to annealing in the presence of a magnetic field. An exchange anisotropic magnetic field takes place through exchange coupling at the interface between the antiferromagnetic layer 70 and the pinned magnetic layer 71. The magnetization of the pinned magnetic layer 71 is thus pinned in the Y direction.

In accordance with the present invention, the antiferromagnetic layer 71 is made of a Pt—Mn (platinum-manganese) alloy. Instead of the Pt—Mn alloy film, the antiferromagnetic layer 71 may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof.

The pinned magnetic layer 71, the first free magnetic layer 73, and the second free magnetic layer 75 are made of an NiFe (nickel-iron) alloy, Co (cobalt), an Fe—Co (iron-cobalt) alloy, or an Fe—Co—Ni alloy.

The nonmagnetic electrically conductive layer 72 is made of a low electrical-resistance nonmagnetic electrically conductive material such as Cu (copper).

Referring to FIG. 10, metallic layers 76 and 76, made of Cr or the like, and functioning as a buffer layer or a alignment layer, extend from a horizontal portion thereof coextending a width dimension T40 of the antiferromagnetic layer 70 in the X direction, rising along the side end faces of the pinned magnetic layer 71, the nonmagnetic electrically conductive layer 72, the first free magnetic layer 73, the nonmagnetic material layer 74, and the second free magnetic layer 75. The use of the metallic layers 76 and 76 helps increase the strength of the bias magnetic field created by hard bias layers 77 and 77 to be described later.

Deposited on top of the metallic layers 76 and 76 are the hard bias layers 77 and 77 which are made of a Co—Pt (cobalt-platinum) alloy or a Co—Cr—Pt (cobalt-chromium-platinum) alloy.

Intermediate layers 78 and 78, made of a nonmagnetic material such as Ta, are respectively deposited on the hard bias layers 77 and 77. Electrode layers 79 and 79, made of Cr, Au, Ta, or W, are respectively deposited on top of the intermediate layers 78 and 78.

Since the antiferromagnetic layer 70 extends beneath and along the hard bias layers 77 and 77 as shown in FIG. 10, the thickness of the hard bias layers 77 and 77 can be made thinner. The hard bias layers 77 and 77 are thus easily produced using a sputtering technique.

The first free magnetic layer 73 and the second free magnetic layer 75 are formed to have different magnetic moments. The magnetic moment is expressed by the product of the saturation magnetization (Ms) and the thickness (t) of the layer. For example, the first free magnetic layer 73 and the second free magnetic layer 75 are manufactured of the same material with thicknesses thereof made different so that the two layers have different magnetic moments.

The nonmagnetic material layer 74, interposed between the first free magnetic layer 73 and the second free magnetic layer 75, is preferably made of a material selected from the group consisting of Ru, Rh, Ir, Cr, Re, Cu, and alloys thereof.

Referring to FIG. 10, the first free magnetic layer 73, and the second free magnetic layer 75, having different magnetic moments, are laminated with the nonmagnetic material layer 74 interposed therebetween, and function as a single free magnetic layer F.

The first free magnetic layer 73 and the second free magnetic layer 75 are in a ferrimagnetic state with magnetization directions thereof being antiparallel, namely different from each other by 180 degrees. The magnetization direction of the first free magnetic layer 73 or the second free magnetic layer 75, whichever has a greater magnetic moment, is aligned with the direction of the magnetic field generated by the hard bias layers 77 and 77. Assuming that the first free magnetic layer 73 has a greater magnetic moment, the magnetization direction of the first free magnetic layer 73 is aligned with the direction of the magnetic field generated by the hard bias layers 77 and 77 while the magnetization direction of the second free magnetic layer 75 is 180 degrees opposite.

The first free magnetic layer 73 and the second free magnetic layer 75, which are in a ferrimagnetic state with magnetization directions thereof being antiparallel, namely different from each other by 180 degrees, achieve the same effect, which can be provided by the use of a thin free magnetic layer F. This arrangement reduces the saturation magnetization, causing the magnetization of the free magnetic layer F to easily vary, and thereby improving the magnetic field detection sensitivity of the magnetoresistive-effect device.

The direction of the sum of the magnetic moments of the first free magnetic layer 73 and the second free magnetic layer 75 becomes the magnetization direction of the free magnetic layer F.

Because of the relationship with the magnetization direction of the pinned magnetic layer 71, only the magnetization direction of the first free magnetic layer 73 contributes to the reproduction output.

The hard bias layers 77 and 77 are magnetized in the X direction (i.e, the direction of the track width), and the magnetization of the free magnetic layer F is aligned with the X direction under the bias magnetic field in the X direction given by the hard bias layers 77 and 77.

The second free magnetic layer 75 having a magnetization direction thereof 180 degrees opposite from the direction of the magnetic field generated by the hard bias layers 77 and 77, is subject to disturbance in magnetization direction in the vicinity of two end portions thereof magnetically coupled with the hard bias layers 77 and 77. In response to this disturbance, the first free magnetic layer 73 suffers from magnetization direction disturbance on its end portions together therewith.

The two end portions of the free magnetic layer F having disturbed magnetization directions have a poor reproduction gain, and become insensitive regions unable to exhibit no substantial magnetoresistive effect.

In the tenth embodiment again, the sensitive region E and the insensitive regions D and D of the multilayer film 200 are measured using the micro track profile method. Referring to FIG. 10, the portion having the width dimension T41 of the multilayer film 200 is the sensitive region E, and the portions having the width dimension T42 are the insensitive regions D and D.

In the sensitive region E, the magnetization direction of the pinned magnetic layer 71 is pinned correctly in a direction parallel to the Y direction, and the magnetization direction of the free magnetic layer F is correctly aligned in the X direction. The pinned magnetic layer 71 and the free magnetic layer F are thus perpendicular in magnetization direction. The magnetization of the free magnetic layer F varies sensitively in response to an external magnetic field from the recording medium. An electrical resistance varies in accordance with the relationship between the variation in the magnetization direction of the free magnetic layer F and the pinned magnetic field of the pinned magnetic layer 71. A leakage magnetic field from the recording medium is thus detected in response to a variation in voltage due to the electrical resistance variation. However, those which directly contribute to the variation in the electrical resistance (i.e., the reproduction output) are a relative angle made between the magnetization direction of the pinned magnetic layer 71 and the magnetization direction of the first free magnetic layer 73. These magnetization directions are preferably perpendicular with a sense current conducted in the absence of a signal magnetic field.

Electrode layers 79 and 79, deposited on both sides of the multilayer film 200, extend over the multilayer film 200. The width dimension of the top layer of the multilayer film 200 not covered with the electrode layers 79 and 79 is the optical read track width O-Tw.

The magnetic read track width M-Tw, determined by the width dimension of the sensitive region E not covered with the electrode layers 79 and 79, is a width dimension T41, which is also the dimension of the sensitive region E.

In the tenth embodiment, the electrode layers 79 and 79 formed above the multilayer film 200 fully cover the insensitive regions D and D, setting the optical read track width O-Tw and the magnetic read track width M-Tw (i.e., the width dimension of the sensitive region E) to approximately the same dimension.

It is not a requirement that the electrode layers 79 and 79 formed above the multilayer film 200 fully cover the insensitive regions D and D, and the electrode layer 79 may be narrower than the insensitive region D. In this case, the optical read track width O-Tw becomes larger than the magnetic read track width M-Tw.

The percentage of the sense current flowing from the electrode 79 to the multilayer film 200 without passing through the hard bias layers 77 and 77 is increased in this invention.

The electrode layers 79 and 79 extending over the insensitive regions D and D prevent the sense current from flowing into the insensitive regions D and D, thereby controlling the generation of noise.

Referring to FIG. 10, the width dimension T43 of each of the electrode layers 79 and 79 extending over the insensitive region D of the multilayer film 200 preferably falls within a range from 0 μm to 0.08 μm. More preferably, the width dimension T43 of the electrode layer 79 falls within a range from 0.05 μm to 0.08 μm.

The angle θ10 made between the top surface 15a of the protective layer 15 and an end face 79a of the electrode layer 79 extending over the insensitive region of the multilayer film 200 is preferably 20 degrees or greater, and more preferably 25 degrees or greater. This arrangement prevents the sense current from shunting into the insensitive region, thereby controlling the generation of noise.

If the angle θ10 made between the top surface 15a and the end face 79a is too large, a short is likely to occur between the electrode layer 79 and a top shield layer of a soft magnetic material when the top shield layer is deposited over the protective layer 15 and the electrode layers 79 and 79. The angle θ10 made between the top surface 15a and the end face 79a is preferably 60 degrees or smaller, and more preferably, 45 degrees or smaller.

Figure 11:
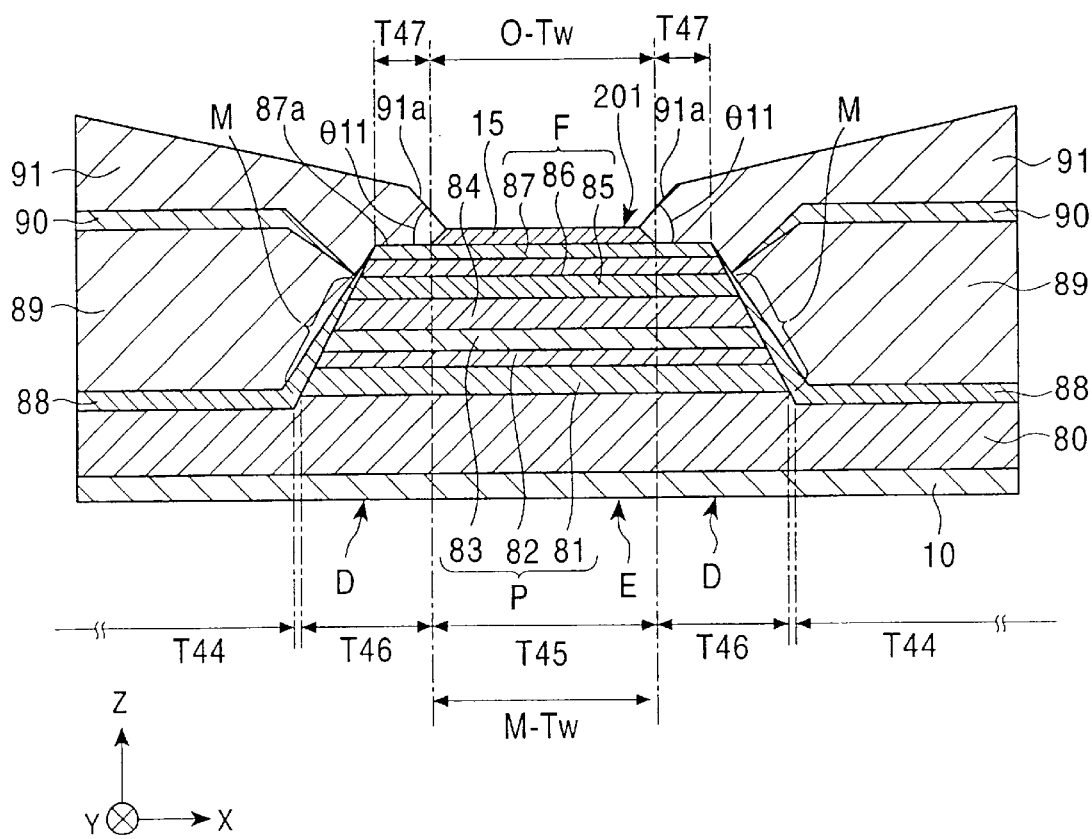
FIG. 11 is a partial cross-sectional view showing the construction of a magnetoresistive-effect device of an eleventh embodiment of the present invention.

FIG. 11 is a cross-sectional view showing the construction of the magnetoresistive-effect device of an eleventh embodiment of the present invention, viewed from an ABS side thereof.

The spin-valve type thin-film device shown in FIG. 11 includes an antiferromagnetic layer 80 which has a long portion extending on and along a substrate 10 in the X direction as shown. The antiferromagnetic layer 80 is projected upward in a central portion thereof. Laminated on the projected portion of the antiferromagnetic layer 80 are a first pinned magnetic layer 81, a nonmagnetic material layer 82, a second pinned magnetic layer 83, a nonmagnetic electrically conductive layer 84, a first free magnetic layer 85, a nonmagnetic material layer 86, a second free magnetic layer 87, and a protective layer 15. The laminate, composed of the layers from the substrate 10 through the protective layer 15, forms a multilayer film 201.

In accordance with the present invention, the antiferromagnetic layer 80 is made of a Pt—Mn (platinum-manganese) alloy. Instead of the Pt—Mn alloy, the antiferromagnetic layer 80 may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof.

The first pinned magnetic layer 81, the second pinned magnetic layer 83, the first free magnetic layer 85, and second free magnetic layer 87 are made of an Ni—Fe (nickel-iron) alloy, Co (cobalt), an Fe—Co (iron-cobalt) alloy, or an Fe—Co—Ni alloy.

The nonmagnetic electrically conductive layer 84 is made of a low electrical-resistance nonmagnetic electrically conductive material such as Cu (copper).

Referring to FIG. 11, metallic layers 88 and 88, made of Cr or the like, and functioning as a buffer layer or a alignment layer, extend from a horizontal portion thereof coextending a width dimension T44 of the antiferromagnetic layer 80 in the X direction, rising along the side end faces of the first pinned magnetic layer 81, the nonmagnetic material layer 82, the second pinned magnetic layer 83, the nonmagnetic electrically conductive layer 84, and the first free magnetic layer 85. The use of the metallic layers 88 and 88 helps increase the strength of the bias magnetic field created by hard bias layers 89 and 89 to be described later.

Deposited on top of the metallic layers 88 and 88 are the hard bias layers 89 and 89 which are made of a Co—Pt (cobalt-platinum) alloy or a Co—Cr—Pt (cobalt-chromium-platinum) alloy.

Intermediate layers 90 and 90, made of a nonmagnetic material, such as Ta, are respectively deposited on the hard bias layers 89 and 89. Electrode layers 91 and 91, made of Cr, Au, Ta, or W, are respectively deposited on top of the intermediate layers 90 and 90.

Since the antiferromagnetic layer 80 extends beneath and along the hard bias layers 89 and 89 as shown in FIG. 11, the thickness of the hard bias layers 89 and 89 can be made thinner. The hard bias layers 89 and 89 are thus easily produced using a sputtering-technique.

Referring to FIG. 11, the first pinned magnetic layer 81 and the second pinned magnetic layer 83, having different magnetic moments, are laminated to each other-with the nonmagnetic material layer 82 interposed therebetween, and function as a single pinned magnetic layer P.

The first pinned magnetic layer 81 is deposited on and in contact with the antiferromagnetic layer 80, and is subjected to annealing in the presence of a magnetic field. An exchange anisotropic magnetic field takes place through exchange coupling at the interface between the first pinned magnetic layer 81 and the antiferromagnetic layer 80. The magnetization direction of the first pinned magnetic layer 81 is thus pinned in the Y direction. When the magnetization direction of the first pinned magnetic layer 81 is pinned in the Y direction, the magnetization direction of the second pinned magnetic layer 83, separated from the first pinned magnetic layer 81 by the intervening nonmagnetic material layer 82, is pinned to be antiparallel to the magnetization direction of the first pinned magnetic layer 81.

The direction of the sum of the magnetic moments of the first pinned magnetic layer 81 and the second pinned magnetic layer 83 becomes the magnetization direction of the pinned magnetic layer P.

The first pinned magnetic layer 81 and the second pinned magnetic layer 83 are in a ferrigmagnetic state with magnetization directions thereof being antiparallel, and the magnetization direction of the first pinned magnetic layer 81 and the magnetization direction of the second pinned magnetic layer 83 mutually pin each other. The magnetization direction of the pinned magnetic layer P, as a whole, is advantageously stabilized in one direction.

Referring to FIG. 11, the first pinned magnetic layer 81 and the second pinned magnetic layer 83 are manufactured of the same material with thicknesses thereof made different so that the two layers have different magnetic moments. The nonmagnetic material layer 82, interposed between the first pinned magnetic layer 81 and the second pinned magnetic layer 83, is preferably made of a material selected from the group consisting of Ru, Rh, Ir, Cr, Re, Cu, and alloys thereof.

The first free magnetic layer 85 and the second free magnetic layer 87 are formed to have different magnetic moments. Here again, the first free magnetic layer 85 and the second free magnetic layer 87 are manufactured of the same material with thicknesses thereof made different so that the two layers have different magnetic moments.

The nonmagnetic material layer 86 is preferably made of a material selected from the group consisting of Ru, Rh, Ir, Cr, Re, Cu, and alloys thereof.

Referring to FIG. 11, the first free magnetic layer 85 and the second free magnetic layer 87, having different magnetic moments, are laminated with the nonmagnetic material layer 86 interposed therebetween, and function as a single free magnetic layer F.

The first free magnetic layer 85 and the second free magnetic layer 87, which are in a ferrimagnetic state with magnetization directions thereof being antiparallel, namely different from each other by 180 degrees, achieve the same effect, which can be provided by the use of a thin free magnetic layer F. This arrangement reduces the saturation magnetization, causing the magnetization of the free magnetic layer F to easily vary, and thereby improving the magnetic field detection sensitivity of the magnetoresistive-effect device.

The direction of the sum of the magnetic moments of the first free magnetic layer 85 and the second free magnetic layer 87 becomes the magnetization direction of the free magnetic layer F. However, those which directly contribute to the reproduction output are a relative angle made between the second pinned magnetic layer 83 and the first free magnetic layer 85.

The hard bias layers 89 and 89 are magnetized in the X direction (i.e., the direction of the track width), and the magnetization direction of the free magnetic layer F is aligned in the X direction under the bias magnetic field in the X direction given by the hard bias layers 89 and 89.

The two end portions of the free magnetic layer F, having disturbed magnetization directions, present a poor reproduction gain, and become insensitive regions unable to exhibit no substantial magnetoresistive effect.

In the eleventh embodiment again, the sensitive region E and the insensitive regions D and D of the multilayer film 201 are measured using the micro track profile method. Referring to FIG. 11, the portion having the width dimension T45 of the multilayer film. 201 is the sensitive region E, and the portions, each having the width dimension T46, are the insensitive regions D and D.

In the sensitive region E, the magnetization direction of the pinned magnetic layer P is pinned correctly in a direction parallel to the Y direction, and the magnetization direction of the free magnetic layer F is correctly aligned in the X direction. The pinned magnetic layer P and the free magnetic layer F are thus perpendicular in magnetization direction. The magnetization of the free magnetic layer F varies sensitively in response to an external magnetic field from the recording medium. An electrical resistance varies in accordance with the relationship between the variation in the magnetization direction of the free magnetic layer F and the pinned magnetic field of the pinned magnetic layer P. A leakage magnetic field from the recording medium is thus detected in response to a variation in voltage due to the electrical resistance variation. However, those which directly contribute to the variation in the electrical resistance (i.e., the reproduction output) are a relative angle made between the magnetization direction of the second pinned magnetic layer 83 and the magnetization direction of the first free magnetic layer 85. These magnetization directions are preferably perpendicular with a sense current conducted in the absence of a signal magnetic field.

Electrode layers 91 and 91, formed on both sides of the multilayer film 201, extend over the multilayer film 201. The width dimension of the top layer of the multilayer film 201 not covered with the electrode layers 91 and 91 is the optical read track width O-Tw.

The magnetic read track width M-Tw, determined by the width dimension of the sensitive region E not covered with the electrode layers 91 and 91, is a width dimension T45, which is also the dimension of the sensitive region E.

In this embodiment, the electrode layers 91 and 91 formed above the multilayer film 201 fully cover the insensitive regions D and D, setting the optical read track width O-Tw and the magnetic read track width M-Tw (i.e., the width dimension of the sensitive region E) to approximately the same dimension.

It is not a requirement that the electrode layers 91 and 91 formed above the multilayer film 201 fully cover the insensitive regions D and D, and the electrode layer 91 may be narrower than the insensitive region D. In this case, the optical read track width O-Tw becomes larger than the magnetic read track width M-Tw.

The percentage of the sense current flowing from the electrode 91 to the multilayer film 201 without passing through the hard bias layers 89 and 89 is increased.

The electrode layers 91 and 91 respectively extending over the insensitive regions D and D prevent the sense current from flowing into the insensitive regions D and D, thereby controlling the generation of noise.

Referring to FIG. 11, the width dimension T47 of each of the electrode layers 91 and 91 extending over the insensitive region D of the multilayer film 201 preferably falls within a range from 0 μm to 0.08 μm. More preferably, the width dimension T47 of each of the electrode layers 91 and 91 falls within a range from 0.05 μm to 0.08 μm.

The angle θ11 made between the top surface of the multilayer film 201 with the protective layer 15 removed, namely, the top surface 87a of the second free magnetic layer 87 in FIG. 11, and an end face 91a of the electrode layer 91 extending over the insensitive region of the multilayer film 201 is preferably 20 degrees or greater, and more preferably 25 degrees or greater. This arrangement prevents the sense current from shunting into the insensitive region, thereby controlling the generation of noise.

If the angle θ11 made between the top surface 87a and the end face 91a is too large, a short is likely to occur between the electrode layers 91 and 91 and a top shield layer of a soft magnetic material when the top shield layer is deposited over the protective layer 15 and the electrode layers 91 and 91. The angle θ11 made between the top surface 87a and the end face 91a is preferably 60 degrees or smaller, and more preferably, 45 degrees or smaller.

Referring to FIG. 11, a magnetic coupling junction M between the multilayer film 201 and each of the hard bias layers 89 and is fabricated of an interface with the end face of only the first free magnetic layer 85, of both the first free magnetic layer 85 and the second free magnetic layer 87.

It is sufficient if the hard bias layers 89 and 89 are aligned with the magnetization direction of one of the first free magnetic layer 85 and the second free magnetic layer 87. If the magnetization direction of one of the free magnetic layers is aligned in one direction, another free magnetic layer adjacent thereto is put into a ferrimagnetic state with a magnetization direction thereof being antiparallel. The direction of the sum of the magnetic moments of the first and second free magnetic layers is aligned in a certain direction, namely, the direction of the track width in FIG. 11.

If the hard bias layers 89 and 89 are magnetically coupled with each of the first free magnetic layer 85 and the second free magnetic layer 87, the first free magnetic layer 85 and the second free magnetic layer 87 suffer from a larger magnetization direction disturbance on end portions thereof. However, the construction shown in FIG. 11 controls the magnetization direction disturbance on both end portions of each of the free magnetic layers, permitting the width dimension T45 of the sensitive region E to be enlarged.

As shown in FIG. 11, the protective layer 15 is deposited where the multilayer film 201 has no electrode layers 91 and 91 formed thereon. The electrode layers 91 and 91 are connected to the second free magnetic layer 87 with no protective layer 15 interposed therebetween.

This arrangement presents a smaller electrical resistance than the arrangement in which the electrode layers 91 and 91 are deposited on the protective layer 15, improving the characteristics of the magnetoresistive-effect device.

Figure 12:
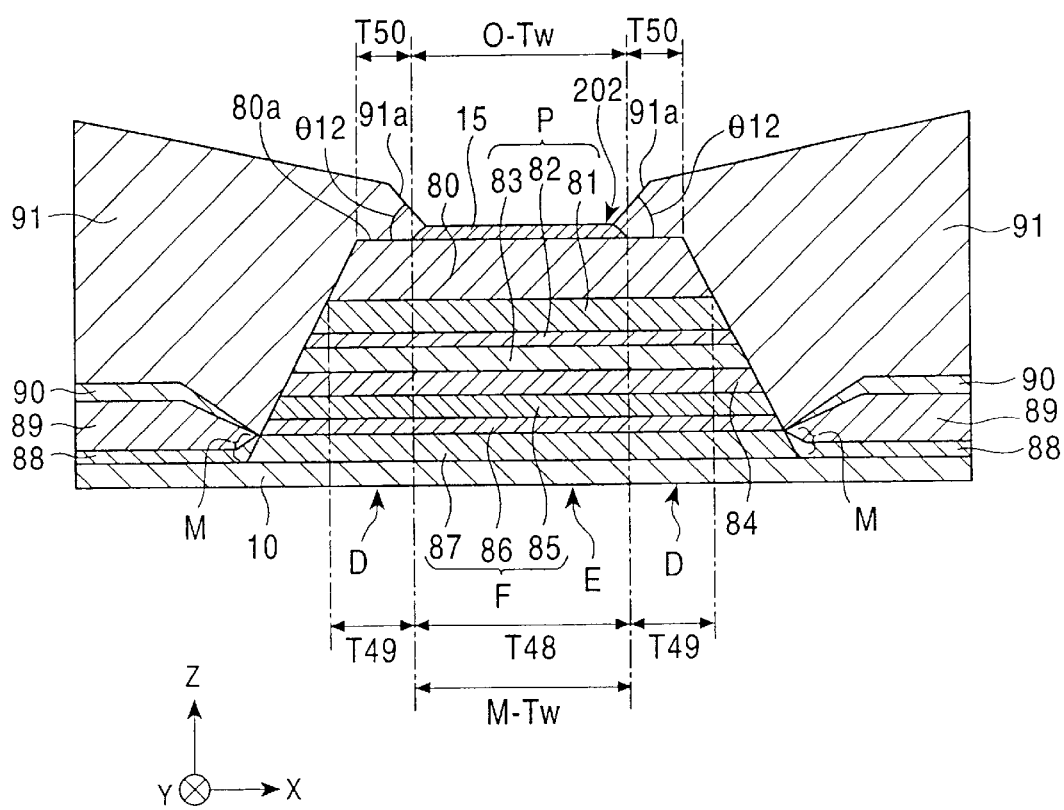
FIG. 12 is a partial cross-sectional view showing the construction of a magnetoresistive-effect device of a twelfth embodiment of the present invention.

A multilayer film 202 of a spin-valve type thin-film device of a twelfth embodiment of the present invention shown in FIG. 12 has the inverted version of the multilayer film 201 of the spin-valve type thin-film device shown in FIG. 11. Specifically, referring to FIG. 12, a second free magnetic layer 87, a nonmagnetic material layer 86, a first free magnetic layer 85, a nonmagnetic electrically conductive layer 84, a second pinned magnetic layer 83, a nonmagnetic material layer 82, a first pinned magnetic layer 81, an antiferromagnetic layer 80, and a protective layer 15 are successively laminated on a substrate 10.

Referring to FIG. 12, the hard bias layers 89 and 89 are magnetically coupled with neither of the first pinned magnetic layer 81 and the second pinned magnetic layer 83. This arrangement prevents the magnetization directions of the first pinned magnetic layer 81 and the second pinned magnetic layer 83 aligned in a direction parallel to the Y direction, from varying under the magnetic field applied by the hard bias layers 89 and 89. The characteristics of the magnetoresistive-effect device are thus improved.

Referring to FIG. 12, the first pinned magnetic layer 81 and the second pinned magnetic layer 83, having different magnetic moments, are laminated to each other with the nonmagnetic material layer 82 interposed therebetween, and function as a single pinned magnetic layer P. Referring to FIG. 12, the first pinned magnetic layer 81 and the second pinned magnetic layer 83 are manufactured of the same material with thicknesses thereof made different so that the two layers have different magnetic moments.

As shown in FIG. 12, the first pinned magnetic layer 81 is deposited on and in contact with the antiferromagnetic layer 80, and is subjected to annealing in the presence of a magnetic field. An exchange anisotropic magnetic field takes place through exchange coupling at the interface between the first pinned magnetic layer 81 and the antiferromagnetic layer 80. The magnetization direction of the first pinned magnetic layer 81 is thus pinned in the Y direction. When the magnetization direction of the first pinned magnetic layer 81 is pinned in the Y direction, the magnetization direction of the second pinned magnetic layer 83, separated from the first pinned magnetic layer 81 by the intervening nonmagnetic material layer 82, is pinned to be antiparallel to the magnetization direction of the first pinned magnetic layer 81. The direction of the sum of the magnetic moments of the first and second free magnetic layers 81 and 83 becomes the magnetization of the pinned magnetic layer P.

The first free magnetic layer 85 and the second free magnetic layer 87, having different magnetic moments, are laminated with the nonmagnetic material layer 86 interposed therebetween, and function as a single free magnetic layer F.

The first free magnetic layer 85 and the second free magnetic layer 87 are manufactured of the same material with thicknesses thereof made different so that the two layers have different magnetic moments.

In the spin-valve type thin-film device shown in FIG. 12, again, the first free magnetic layer 85 and the second free magnetic layer 87, which are in a ferrimagnetic state with magnetization directions thereof being antiparallel, namely different from each other by 180 degrees, achieve the same effect, which can be provided by the use of a thin free magnetic layer F. This arrangement reduces the saturation magnetization of the entire free magnetic layer F, causing the magnetization of the free magnetic layer F to easily vary, and thereby improving the magnetic field detection sensitivity of the magnetoresistive-effect device.

The direction of the sum of the magnetic moments of the first free magnetic layer 85 and the second free magnetic layer 87 becomes the magnetization direction of the free magnetic layer F.

The hard bias layers 89 and 89 are magnetized in the X direction (i.e., the direction of the track width), and the magnetization direction of the free magnetic layer F is aligned in the X direction under the bias magnetic field in the X direction given by the hard bias layers 89 and 89.

The two end portions of the free magnetic layer F, having disturbed magnetization directions, present a poor reproduction gain, and become insensitive regions unable to exhibit no substantial magnetoresistive effect.

In twelfth embodiment again, the sensitive region E and the insensitive regions D and D of the multilayer film 202 are measured using the micro track profile method. Referring to FIG. 12, the portion, having the width dimension T48, of the multilayer film 202 is the sensitive region E, and the portions, each having the width dimension T49, are the insensitive regions D and D.

In the sensitive region E, the magnetization direction of the pinned magnetic layer P is pinned correctly in a direction parallel to the Y direction, and the magnetization direction of the free magnetic layer F is correctly aligned in the X direction. The pinned magnetic layer P and the free magnetic layer F are thus perpendicular in magnetization direction. The magnetization of the free magnetic layer F varies sensitively in response to an external magnetic field from the recording medium. An electrical resistance varies in accordance with the relationship between the variation in the magnetization direction of the free magnetic layer F and the pinned magnetic field of the pinned magnetic layer P. A leakage magnetic field from the recording medium is thus detected in response to a variation in voltage due to the electrical resistance variation. However, those which directly contribute to the variation in the electrical resistance (i.e., the reproduction output) are a relative angle made between the magnetization direction of the second pinned magnetic layer 83 and the magnetization direction of the first free magnetic layer 85. These magnetization directions are preferably perpendicular with a sense current conducted in the absence of a signal magnetic field.

The electrode layers 91 and 91 formed on both sides of the multilayer film 202 extend over the multilayer film 202. The width dimension of the top surface of the multilayer film 202 not covered with the electrode layers 91 and 91 is the optical read track width O-Tw.

The magnetic read track width M-Tw, determined by the width dimension of the sensitive region E not covered with the electrode layers 91 and 91, is a width dimension T48, which is also the dimension of the sensitive region E.

In the twelfth embodiment, the electrode layers 91 and 91 formed on the multilayer film 202 fully cover the insensitive regions D and D, setting the optical read track width O-Tw and the magnetic read track width M-Tw (i.e., the width dimension of the sensitive region E) to approximately the same dimension.

It is not a requirement that the electrode layers 91 and 91 formed above the multilayer film 202 fully cover the insensitive regions D and D, and the electrode layer 91 may be narrower than the insensitive region D. In this case, the optical read track width O-Tw becomes larger than the magnetic read track width M-Tw.

The percentage of the sense current flowing from the electrode 91 to the multilayer film 202 without passing through the hard bias layers 89 and 89 is increased in this invention.

The electrode layers 91 and 91 extending over the insensitive regions D and D prevent the sense current from flowing into the insensitive regions D and D, thereby controlling the generation of noise.

The width dimension T50 of each of the electrode layers 91 and 91 extending over the insensitive region D of the multilayer film 202 preferably falls within a range from 0 μm to 0.08 μm. More preferably, the width dimension T50 of each of the electrode layers 91 and 91 falls within a range from 0.05 μm to 0.08 μm.

The angle θ12 made between the top surface of the multilayer film 202 with the protective layer 15 removed, namely, the top surface 80a of the antiferromagnetic layer 80 in FIG. 12, and an end face 91a of the electrode layer 91 extending over the insensitive region of the multilayer film 202 is preferably 20 degrees or greater, and more preferably 25 degrees or greater. This arrangement prevents the sense current from shunting into the insensitive region, thereby controlling the generation of noise.

To prevent a short which is likely to occur between the electrode layers 91 and 91 and a top shield layer of a soft magnetic material when the top shield layer is deposited over the protective layer 15 and the electrode layers 91 and 91, the angle θ12 made between the top surface 80a and the end face 91a is preferably 60 degrees or smaller, and more preferably, 45 degrees or smaller.

Referring to FIG. 12, a magnetic coupling junction M between the multilayer film 202 and each of the hard bias layers 89 and 89 is fabricated of an interface with the end face of only the second free magnetic layer 87, of both the first free magnetic layer 85 and the second free magnetic layer 87. This arrangement controls the disturbance in the magnetization direction on both end portions in the free magnetic layer, permitting the width dimension T48 of the sensitive region E to be enlarged.

As shown in FIG. 12, the protective layer 15 is deposited where the multilayer film 202 has no electrode layers 91 and 91 formed thereon. The electrode layers 91 and 91 are connected to the antiferromagnetic layer 80 with no protective layer 15 interposed therebetween.

This arrangement presents a smaller electrical resistance than the arrangement in which the electrode layers 91 and 91 are laminated on the protective layer 15, improving the characteristics of the magnetoresistive-effect device.

Figure 13:
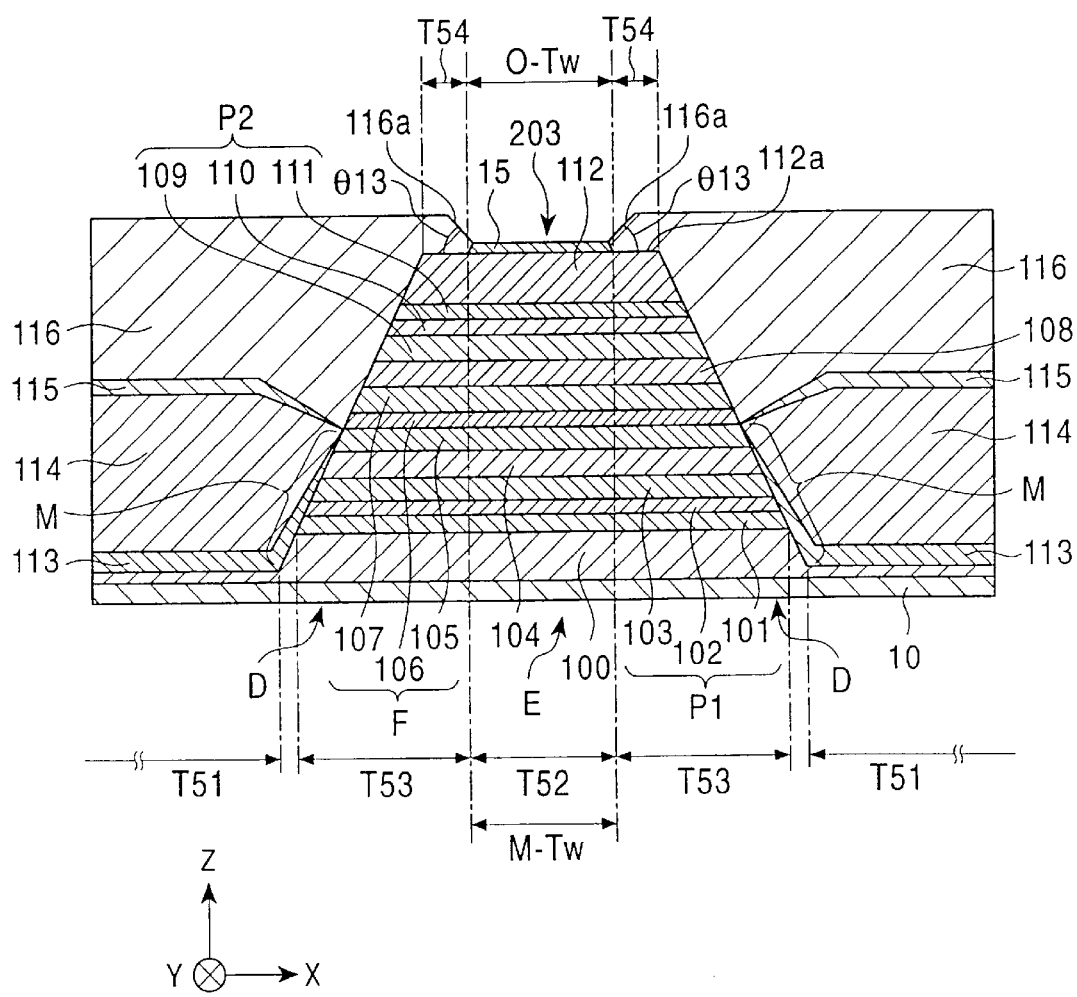
FIG. 13 is a partial cross-sectional view showing the construction of a magnetoresistive-effect device of a thirteenth embodiment of the present invention.

FIG. 13 is a cross-sectional view showing the magnetoresistive-effect device of a thirteenth embodiment of the present invention, viewed from an ABS side thereof.

This spin-valve type thin-film device is a so-called dual spin-valve type thin-film device, which includes a nonmagnetic material layer 106, a first free magnetic layer 105 and a second free magnetic layer 107, respectively lying under and over the nonmagnetic material layer 106, nonmagnetic electrically conductive layers 104 and 108, respectively lying under the first free magnetic layer 105 and over the second free magnetic layer 107, a first pinned magnetic layer 103 and a third pinned magnetic layer 109, respectively lying under the nonmagnetic electrically conductive layer 104 and over the nonmagnetic electrically conductive layer 108, nonmagnetic layers 102 and 110, respectively lying under the first pinned magnetic layer 103 and over the third pinned magnetic layer 109, a second pinned magnetic layer 101 and a fourth pinned magnetic layer 111, respectively lying under the nonmagnetic material layer 102 and over the nonmagnetic material layer 110, and antiferromagnetic layers 100 and 112, respectively lying under the second pinned magnetic layer 101 and over the fourth pinned magnetic layer 111. The dual spin-valve type thin-film device provides a reproduction output higher in level than that of the spin-valve type thin-film devices (i.e., so-called single spin-valve type thin-film devices) shown in FIG. 11 through. FIG. 13. The layer lying at the bottom-is a substrate 10, while the layer lying on the top is a protective layer 15. The laminate, composed of the layers from the substrate 10 through the protective layer 15, constitutes a multilayer film 203.

Referring to FIG. 13, the antiferromagnetic layer 100 extends on and along the substrate 10 in the X direction with a central portion thereof projected upward.

In the thirteenth embodiment, the antiferromagnetic layers 100 and 112 are made of a Pt—Mn (platinum-manganese) alloy. Instead of the Pt—Mn alloy, the antiferromagnetic layers 100 and 112 may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof.

The first free magnetic layer 105, the second free magnetic layer 107, the first pinned magnetic layer 103, the second pinned magnetic layer 101, the third pinned magnetic layer 109, and the fourth pinned magnetic layer 111 are made of an Ni—Fe (nickel-iron) alloy, Co (cobalt), an Fe—Co (iron-cobalt) alloy, or an Fe—Co—Ni alloy, and the nonmagnetic electrically conductive layers 104 and 108 are made of a low electrical-resistance nonmagnetic electrically conductive material, such as Cu (copper).

Referring to FIG. 13, each of metallic layers 113 and 113, made of Cr or the like, and functioning as a buffer layer or a alignment layer, extends from a horizontal portion thereof coextending a width dimension T51 of the antiferromagnetic layer 100 in the X direction, rising along the side end faces of the second pinned magnetic layer 101, the nonmagnetic material layer 102, the first pinned magnetic layer 103, the nonmagnetic electrically conductive layer 104, and the first free magnetic layer 105. The use of the metallic layers 113 and 113 helps increase the strength of the bias magnetic field created by hard bias layers 114 and 114 to be described later.

Deposited on top of the metallic layers 113 and 113 are the hard bias layers 114 and 114 which are made of a Co—Pt (cobalt-platinum) alloy or a Co—Cr—Pt (cobalt-chromium-platinum) alloy.

Intermediate layers 115 and 115, made of a nonmagnetic material such as Ta, are respectively deposited on the hard bias layers 114 and 114. Electrode layers 116 and 116, made of Cr, Au, Ta, or W, are respectively deposited on top of the intermediate layers 115 and 115.

Since the antiferromagnetic layer 100 extends beneath and along the hard bias layers 114 and 114 as shown in FIG. 13, the thickness of the hard bias layers 114 and 114 can be made thinner. The hard bias layers 114 and 114 are thus easily produced using a sputtering technique.

Referring to FIG. 13, the first pinned magnetic layer 103 and the second pinned magnetic layer 101, having different magnetic moments, are laminated to each other with the nonmagnetic material layer 102 interposed therebetween, and function as a single pinned magnetic layer $P_1$. The third pinned magnetic layer 109 and the fourth pinned magnetic layer 111, having different magnetic moments, are laminated to each other with the nonmagnetic material layer 110 interposed therebetween, and function as a single pinned magnetic layer $P_2$.

The first pinned magnetic layer 103 and the second pinned magnetic layer 101 are in a ferrigmagnetic state with magnetization directions thereof being antiparallel, namely, 180 degrees opposite from each other, and the magnetization direction of the first pinned magnetic layer 103 and the magnetization direction of the second material layer 101 mutually pin each other. The magnetization direction of the pinned magnetic layer $P_1$, as a whole, is advantageously stabilized in one direction.

Referring to FIG. 13, the first pinned magnetic layer 103 and the second pinned magnetic layer 101 are manufactured of the same material with thicknesses thereof made different so that the two layers have different magnetic moments.

The third pinned magnetic layer 109 and the fourth pinned magnetic layer 111 are in a ferrimagnetic state with the magnetization directions thereof being antiparallel, namely, 180 degrees opposite from each other, and the magnetization direction of the third pinned magnetic layer 109 and the magnetization direction of the fourth pinned magnetic layer 111 mutually pin each other.

The nonmagnetic material layers 102 and 110 are preferably made of a material selected from the group consisting of Ru, Rh, Ir, Cr, Re, Cu, and alloys thereof.

The second pinned magnetic layer 101 and the fourth pinned magnetic layer 111 are respectively deposited on and in contact with the antiferromagnetic layers 100 and 112, and are subjected to annealing under the presence of a magnetic field. An anisotropic magnetic field occurs through exchange coupling at each of the interfaces between the second pinned magnetic layer 101 and the antiferromagnetic layer 100, and between the fourth pinned magnetic layer 111 and the antiferromagnetic layer 112.

The magnetization direction of the second pinned magnetic layer 101 is pinned in the Y direction. When the magnetization direction of the second pinned magnetic layer 101 is pinned in the Y direction, the magnetization direction of the first pinned magnetic layer 103, separated from the second pinned magnetic layer 101 by the nonmagnetic material layer 102, is pinned to be antiparallel to the magnetization direction of the second pinned magnetic layer 101. The direction of the sum of the magnetic moments of the second pinned magnetic layer 101 and the first pinned magnetic layer 103 becomes the direction of the pinned magnetic layer $P_1$.

When the magnetization direction of the second pinned magnetic layer 101 is pinned in the Y direction, the magnetization direction of the fourth pinned magnetic layer 111 is preferably pinned to be antiparallel to the Y direction. Then, the magnetization direction of the third pinned magnetic layer 109, separated from the fourth pinned magnetic layer 111 by the nonmagnetic material layer 110, is pinned to be antiparallel to the magnetization direction of the fourth pinned magnetic layer 111, namely, pinned in the Y direction. The direction of the sum of the magnetic moments of the fourth pinned magnetic layer 111 and the third pinned magnetic layer 109 becomes the magnetization direction of the pinned magnetic layer $P_2$.

The first pinned magnetic layer 103 and the third pinned magnetic layer 109, which are separated from each other by the first free magnetic layer 105, the nonmagnetic layer 106, and the second free magnetic layer 107, are in an antiparallel state with the magnetization directions thereof being opposite by 180 degrees.

Referring to FIG. 13, as will be discussed later, a free magnetic layer F is formed of the first free magnetic layer 105 and the second free magnetic layer 107, both laminated with the nonmagnetic layer 106 interposed therebetween. The first free magnetic layer 105 and the second free magnetic layer 107 are in a ferrimagnetic state with the magnetization directions thereof being antiparallel to each other.

The first free magnetic layer 105 and the second free magnetic layer 107 change magnetization directions thereof under the influence of an external magnetic field while keeping the ferrimagnetic state. If the first pinned magnetic layer 103 and the third pinned magnetic layer 109 are in an antiparallel state with the magnetization directions thereof being opposite by 180 degrees, the rate of change in resistance of the layers above the free magnetic layer F becomes equal to the rate of change in resistance of the layers below the free magnetic layer F.

Furthermore, the magnetization direction of the pinned magnetic layer $P_1$ and the magnetization direction of the pinned magnetic layer $P_2$ are preferably antiparallel to each other.

The magnitude of the magnetic moment of the second pinned magnetic layer 101 pinned in the Y direction is set to be larger than the magnitude of the magnetic moment of the first pinned magnetic layer 103 to align the magnetization direction of the pinned magnetic layer $P_1$ in the Y direction. On the other hand, the magnitude of the magnetic moment of the third pinned magnetic layer 109 pinned in the Y direction is set to be smaller than the magnitude of the magnetic moment of the fourth pinned magnetic layer 111 to align the magnetization direction of the pinned magnetic layer $P_2$ to be antiparallel to the Y direction.

In this arrangement, the direction of the magnetic field, which is created when the sense current flows in the X direction, coincides with the magnetization direction of the pinned magnetic layer $P_1$ and the magnetization direction of the pinned magnetic layer $P_2$. This arrangement stabilizes the ferrimagnetic state of the first pinned magnetic layer 103 and the second pinned magnetic layer 101 and the ferrimagnetic state of the third pinned magnetic layer 109 and the fourth pinned magnetic layer 111.

The first free magnetic layer 105 and the second free magnetic layer 107 are designed to have different magnetic moments. Here again, the first free magnetic layer 105 and the second free magnetic layer 107 are manufactured of the same material with thicknesses thereof made different so that the two layers have different magnetic moments.

The nonmagnetic material layers 102, 106, and 116 are made of a material selected from the group consisting of Ru, Rh, Ir, Cr, Re, Cu, and alloys thereof.

Referring to FIG. 13, the first free magnetic layer 105 and the second free magnetic layer 107 are laminated with the nonmagnetic layer 106 interposed therebetween, and function as a single free magnetic layer F.

The first free magnetic layer 105 and the second free magnetic layer 107, which are in a ferrimagnetic state with the magnetization directions thereof being antiparallel, namely different from each other by 180 degrees, achieve the same effect, which can be provided by the use of a thin free magnetic layer F. This arrangement reduces the saturation magnetization of the entire free magnetic layer F, causing the magnetization of the free magnetic layer F to easily vary, and thereby improving the magnetic field detection sensitivity of the magnetoresistive-effect device.

The direction of the sum of the magnetic moments of the first free magnetic layer 105 and the second free magnetic layer 107 becomes the magnetization direction of the free magnetic layer F.

The hard bias layers 114 and 114 are magnetized in the X direction (i.e., the direction of the track width), and the magnetization direction of the free magnetic layer F is aligned in the X direction under the bias magnetic field in the X direction given by the hard bias layers 114 and 114.

The two end portions of the free magnetic layer F, having disturbed magnetization directions, present a poor reproduction gain, and become insensitive regions unable to exhibit no substantial magnetoresistive effect.

In the thirteenth embodiment again, the sensitive region E and the insensitive regions D and D of the multilayer film 203 are measured using the micro track profile method. Referring to FIG. 13, the portion, having the width dimension T52, centrally positioned in the multilayer film 203 is the sensitive region E, and the portions, each having the width dimension T53, on both sides of the sensitive region E are the insensitive regions D and D.

In the sensitive region E, the magnetization directions of the pinned magnetic layers $P_1$ and $P_2$ are correctly aligned in a direction parallel to the Y direction, and the magnetization of the free magnetic layer F is correctly aligned in the X direction. The pinned magnetic layers $P_1$ and $P_2$ and the free magnetic layer F are perpendicular to each other in magnetization direction. The magnetization of the free magnetic layer F varies sensitively in response to an external magnetic field from the recording medium. An electrical resistance varies in accordance with the relationship between the variation in the magnetization direction of the free magnetic layer F and the pinned magnetic field of the pinned magnetic layers $P_1$ and $P_2$. A leakage magnetic field from the recording medium is thus detected in response to a variation in voltage due to the electrical resistance variation. However, those which directly contribute to the variation in the electrical resistance (i.e., the reproduction output) are a relative angle made between the magnetization direction of the first pinned magnetic layer 103 and the magnetization direction of the first free magnetic layer 105, and a relative angle made between the magnetization direction of the third pinned magnetic layer 109 and the magnetization direction of the second free magnetic layer 107. These magnetization directions are preferably perpendicular with a sense current conducted in the absence of a signal magnetic field.

Referring to FIG. 13, in this invention, electrode layers 116 and 116 are respectively formed on top of intermediate layers 115 and 115, which in turn are respectively formed on top of the hard bias layers 114 and 114 on both sides of the multilayer film 203. The electrode layers 116 and 116 extend over the insensitive regions D and D of the multilayer film 203. The electrode layers 116 and 116 are made of a Cr, Au, Ta, or W film.

The width dimension of the top surface of the multilayer film 203 not covered with the electrode layers 116 and 116 is defined as the optical read track width O-Tw. The width dimension T52 of the sensitive region E not covered with the electrode layers 116 and 116 is defined as the magnetic read track width M-Tw. In the thirteenth embodiment, the electrode layers 116 and 116 extending over the multilayer film 203 fully cover the insensitive regions D and D. The optical read track width O-Tw is thus approximately equal to the magnetic read track width M-Tw (i.e., the width dimension of the sensitive region E).

It is not a requirement that the electrode layers 116 and 116 formed above the multilayer film 203 fully cover the insensitive regions D and D, and the width dimension T54 of each of the electrode layers 116 and 116 may be narrower than the insensitive region D. In this case, the optical read track width O-Tw becomes larger than the magnetic read track width M-Tw.

This arrangement makes it easier for the sense current to directly flow from the electrode layers 116 and 116 into the multilayer film 203 without passing through the hard bias layers 114 and 114. With the electrode layers 116 and 116 respectively extending over the insensitive regions D and D, the junction area between the multilayer film 203 and the electrode layers 116 and 116 is increased, reducing the direct current resistance (DCR) and thereby improving the reproduction characteristics.

Furthermore, the electrode layers 116 and 116, respectively extending over the insensitive regions D and D, prevent the sense current flowing into the insensitive regions D and D, thereby controlling the generation of noise.

Referring to FIG. 13, the width dimension T54 of each of the electrode layers 116 and 116 extending over the insensitive regions D and D of the multilayer film 203 preferably falls within a range from 0 μm to 0.08 μm. More preferably, the width dimension T54 falls within a range from 0.05 μm to 0.08 μm.

The angle θ13 made between the top surface of the multilayer film 203 with the protective layer 15 removed, namely, the top surface 112a of the antiferromagnetic layer 112 in FIG. 13, and an end face 116a of the electrode layer 116 extending over the insensitive region of the multilayer film 203 is preferably 20 degrees or greater, and more preferably 25 degrees or greater. This arrangement prevents the sense current from shunting into the insensitive region, thereby controlling the generation of noise.

To prevent a short which is likely to occur between the electrode layers 116 and 116 and a top shield layer when the top shield layer is deposited over the protective layer 15 and the electrode layers 116 and 116, the angle θ13 made between the top surface 112a and the end face 116a is preferably 60 degrees or smaller, and more preferably, 45 degrees or smaller.

Referring to FIG. 13, a magnetic coupling junction M between the multilayer film 203 and each of the hard bias layers 114 and 114 is fabricated of an interface with the end face of only the first free magnetic layer 105, of both the first free magnetic layer 105 and the second free magnetic layer 107. This arrangement controls the disturbance in the magnetization direction on both end portions in each of the free magnetic layers, permitting the width dimension T52 of the sensitive region E to be enlarged.

As shown in FIG. 13, the protective layer 15 is formed where the multilayer film 203 has no electrode layers 116 and 116 deposited thereon. The electrode layers 116 and 116 are connected to the antiferromagnetic layer 112 with no protective layer 15 interposed therebetween.

This arrangement presents a smaller electrical resistance than the arrangement in which the electrode layers 116 and 116 are deposited on the protective layer 15, improving the characteristics of the magnetoresistive-effect device.

Figure 14:
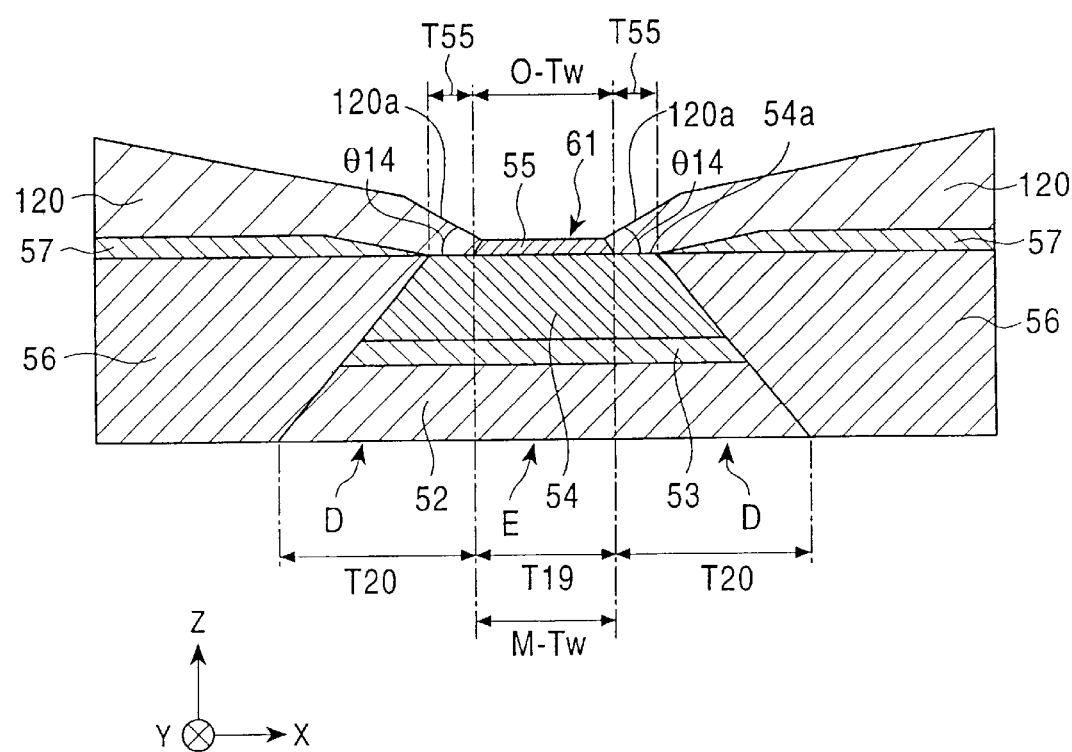
FIG. 14 is a partial cross-sectional view showing the construction of a magnetoresistive-effect device of a fourteenth embodiment of the present invention.

FIG. 14 is a cross-sectional view of the magnetoresistive-effect device of a fourteenth embodiment of the present invention, viewed from an ABS side thereof.

A magnetoresistive-effect device shown in FIG. 14 is an AMR (anisotropic magnetoresistive) device, and its layer structure is identical to that of the AMR device shown in FIG. 8.

In this embodiment again, the sensitive region E and the insensitive regions D and D of the multilayer film 61 are measured using the micro track profile method. The portion, having the width dimension T19, centrally positioned on a multilayer film 61 is the sensitive region E, and the portions, each having the width dimension T20, are the insensitive regions D and D.

The difference of the AMR device shown in FIG. 14 from the AMR device shown in FIG. 8 lies in that a protective layer 55 is formed where the multilayer film 61 has no junction with electrode layers 120 and 120 and that a magnetoresistive layer 54 is directly connected to the electrode layers 120 and 120 with no protective layer 55 interposed therebetween.

This arrangement presents a smaller electrical resistance than the arrangement in which the electrode layers 120 and 120 are laminated on the protective layer 55, improving the characteristics of the magnetoresistive-effect device.

Referring to FIG. 14, the electrode layers 120 and 120 are formed to extend over the multilayer film 61. The width dimension of the top surface of the multilayer film 61 having no electrode layer 120 thereon is the optical read track width O-Tw, and the width dimension of the sensitive region E not covered with the electrode layer 120 is the magnetic read track width M-Tw. In this embodiment, the electrode layers 120 and 120 extending over the multilayer film 61 fully cover the insensitive regions D and D. The optical read track width O-Tw is thus approximately equal to the magnetic read track width M-Tw.

It is not a requirement that the electrode layers 120 and 120 fully cover the insensitive regions D and D, and the width dimension T55 of the electrode layer 120 extending over the multilayer film 61 is smaller than the insensitive region D. In this case, the optical read track width O-Tw becomes larger than the magnetic read track width M-Tw.

The width dimension T55 of each of the electrode layers 120 and 120 extending over the insensitive regions D and D of the multilayer film 61 preferably falls within a range from 0 μm to 0.08 μm. More preferably, the width dimension T21 falls within a range from 0.05 μm to 0.08 μm.

The angle θ14 made between the top surface 54a of the magnetoresistive layer and an end face 120a of the electrode layer 120 extending over the insensitive region of the multilayer film 61 is preferably 20 degrees or greater, and more preferably 25 degrees or greater. This arrangement prevents the sense current from shunting into the insensitive region, thereby controlling the generation of noise.

If the angle θ14 made between the top surface 54a and the end face 120a is too large, a short is likely to occur between the electrode layer 120 and a top shield layer of a soft magnetic material when the top shield layer is deposited over the protective layer 55 and the electrode layers 120 and 120. The angle θ14 made between the top surface 54a and the end face 120a is preferably 60 degrees or smaller, and more preferably, 45 degrees or smaller.

In the AMR device, the hard bias layers 56 and 56 are magnetized in the X direction as shown, and the magnetoresistive layer 54 is supplied with the bias magnetic field in the X direction by the hard bias layers 56 and 56. Furthermore, the magnetoresistive layer 54 is supplied with the bias field in the Y direction by the soft magnetic layer 52. With the magnetoresistive layer 54 supplied with the bias magnetic fields in the X direction and Y direction, a variation in magnetization thereof in response to a variation in the magnetic field becomes linear.

The sense current from the electrode layers 120 and 120 is directly fed to the magnetoresistive layer 54 in the sensitive region E. The direction of the advance of the recording medium is aligned with the Z direction. When a leakage magnetic field from the recording medium in the Y direction is applied, the magnetization direction of the magnetoresistive layer 54 varies, causing a variation in the resistance. The resistance variation is then detected as a voltage variation.

By using a method, to be discussed later, for manufacturing a magnetoresistive-effect device, the film thickness of the region of the hard bias layer in contact with the multilayer is made thin, and the top surface of the hard bias layer close to the multilayer film is, downwardly, inclined or curved toward the multilayer film as shown in the magnetoresistive-effect devices shown in FIG. 1 through FIG. 14.

Figure 33:
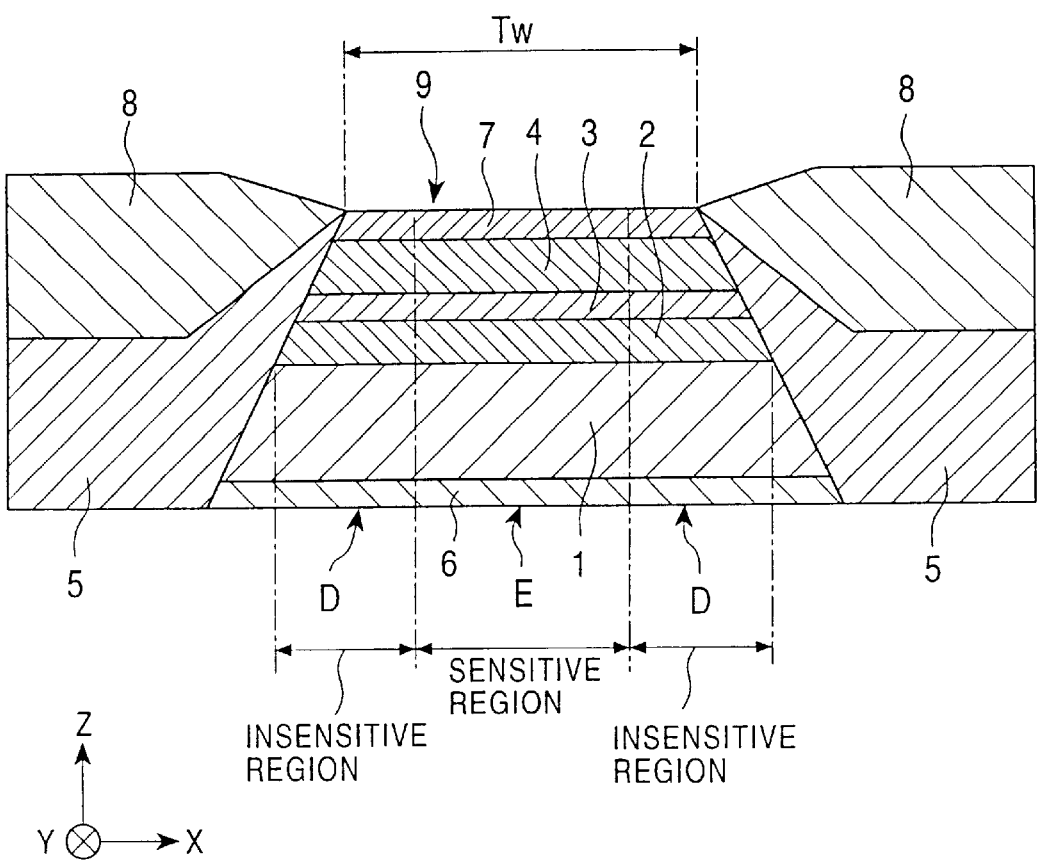
FIG. 33 is a partial cross-sectional view showing the construction of a conventional magnetoresistive-effect device.
Figure 34:
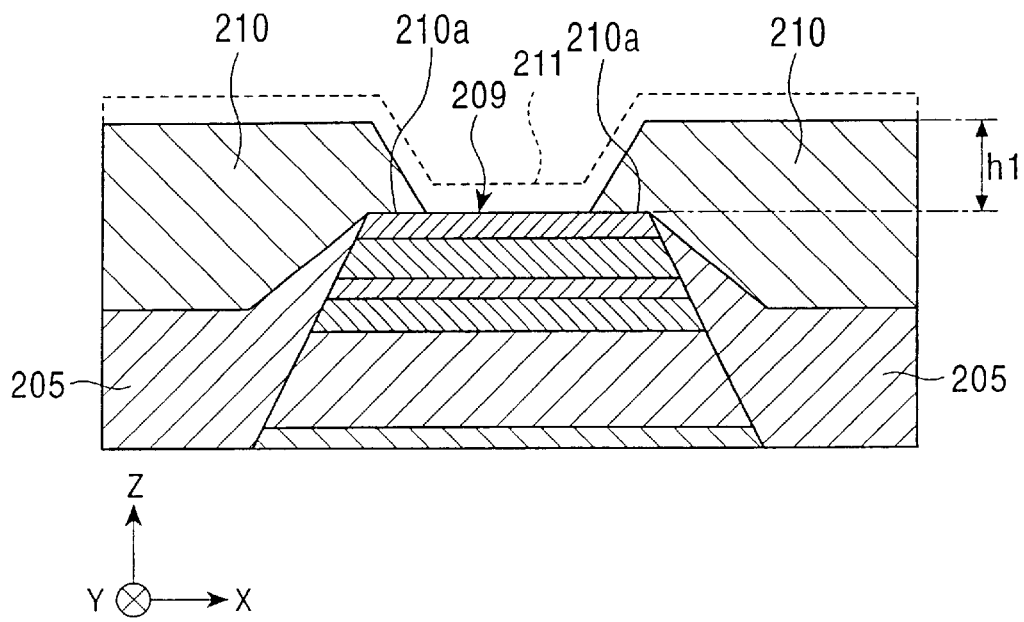
FIG. 34 is a partial cross-sectional view showing a magnetoresistive-effect device of the present invention.

When the top surface of the hard bias layer is projected upward toward the multilayer film in the conventional magnetoresistive-effect device as shown in FIG. 33, a leakage magnetic field or a loop magnetic field takes place around the projected portion, making the magnetization direction of the free magnetic layer less stable.

If the top surface of the hard bias layer is, downwardly, inclined or curved toward the multilayer film as shown in FIG. 1 through FIG. 14, the generation of the leakage magnetic field and the loop magnetic field is prevented, and the magnetization direction of the free magnetic layer is thus stabilized.

The manufacturing method for manufacturing the magnetoresistive-effect devices shown in FIG. 1 through FIG. 14 is now discussed referring to the drawings.

Figure 15:
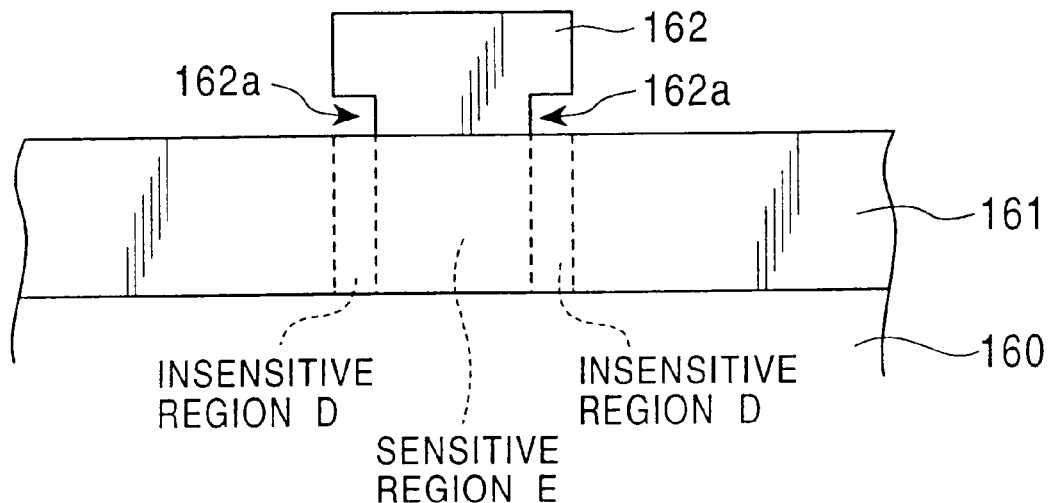
FIG. 15 is a conceptual diagram showing a manufacturing step of the magnetoresistive-effect device of the present invention.

Referring to FIG. 15, a multilayer film 161 of the magnetoresistive-effect device is formed on a substrate 160. The multilayer film 161 can be any of the multilayer films of the single spin-valve type thin-film devices shown in FIG. 1 through FIG. 5, and FIG. 11 through FIG. 12, the multilayer films of the dual spin-valve type thin-film devices shown in FIG. 6, FIG. 7 and FIG. 13, and the multilayer films of the AMR devices shown in FIG. 8, FIG. 9 and FIG. 14.

To form the antiferromagnetic layers 30, 70, 80, and 100 in extended forms thereof in the X direction respectively shown in FIG. 4, FIG. 5, FIG. 10, and FIG. 11, an etch rate and etch time are controlled to leave the lateral portions of the antiferromagnetic layers 30, 70, 80, and 100 when the sides of the multilayer film 161, shown in FIG. 15, are etched away.

When the multilayer film 161 is a multilayer film for a single spin-valve type thin-film device or a dual spin-valve type thin-film device, the antiferromagnetic layer in the multilayer film 161 is preferably made of a PtMn alloy, or may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof. When the antiferromagnetic layer is made of one of the above-cited materials, the antiferromagnetic layer needs to be subjected to a heat treatment to generate an exchange coupling magnetic field in the interface with the pinned magnetic layer.

FIG. 33 shows a conventional magnetoresistive-effect device having its hard bias layers and electrode layers on only both sides of the multilayer film. The width dimension A of the top surface of the multilayer film of the conventional magnetoresistive-effect device is measured using an optical microscope as shown in FIG. 31. The magnetoresistive-effect device is then scanned across a micro track having a signal recorded thereon, on a recording medium in the direction of the track width, and a reproduction output is detected. A top width dimension of B giving an output equal to or greater than 50% of a maximum reproduction output is defined as the sensitive region E and a top width dimension of C giving an output smaller than 50% of the maximum reproduction output is defined as the insensitive region D.

Based on these measurement results, a lift-off resist layer 162 is formed on the multilayer film 161, paying attention to the width dimension C of the insensitive regions D and D measured. through the micro track profile method. Referring to FIG. 15, undercuts 162a and 162a are formed on the underside of the resist layer 162. The undercuts 162a and 162a are formed above the insensitive regions D and D, and the sensitive region E of the multilayer film 161 is fully covered with the resist layer 162.

Figure 16:
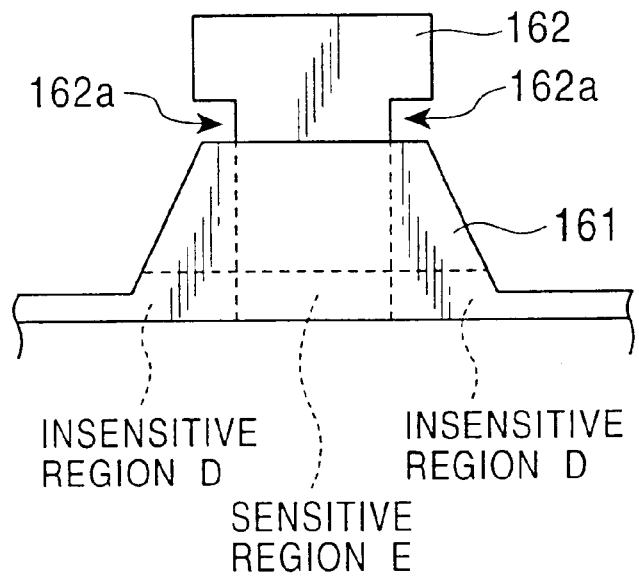
FIG. 16 is a conceptual diagram showing a manufacturing step performed subsequent to the step of FIG. 15.

In a next manufacturing step shown in FIG. 16, both sides of the multilayer film 161 are etched away.

When one of the magnetoresistive-effect devices shown in FIG. 11 through FIG. 14 is manufactured, the protective layer is formed on top of the multilayer film 161, and the resist layer 162 is formed on top of the protective layer. The portions of the protective layer, which come just below the undercuts 162a and 162a of the resist layer 162, namely, the portions of the protective layer which are not in direct contact with the resist layer 162, are removed through an obliquely entering ion milling beam to expose the layer beneath the protective layer.

Figure 17:
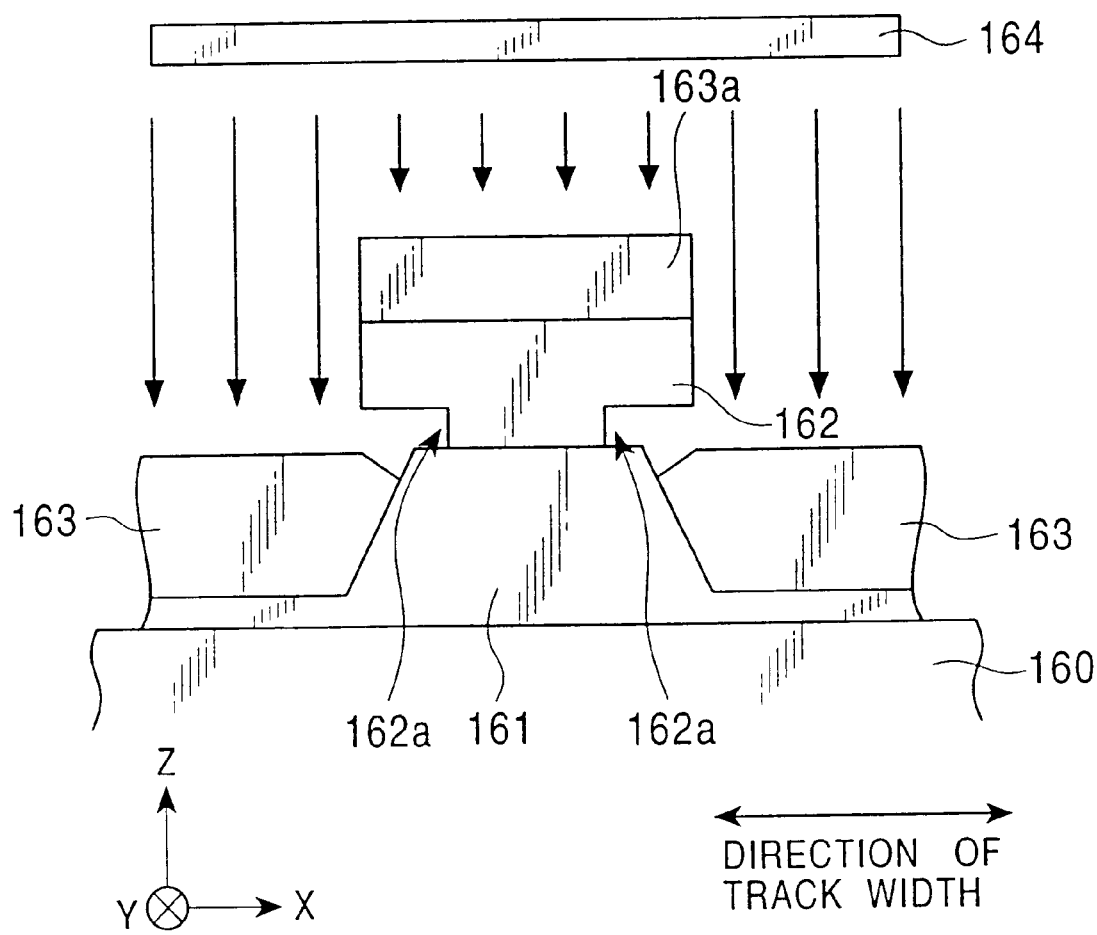
FIG. 17 is a conceptual diagram showing a manufacturing step performed subsequent to the step of FIG. 16.

In a manufacturing step shown in FIG. 17, hard bias layers 163 and 163 are deposited on both sides of the multilayer film 161. In this invention, the sputtering technique, used to form the hard bias layers 163 and 163 and electrode layers 165 and 165 to be formed subsequent to the formation of the hard bias layers 163 and 163, is preferably at least one sputtering technique selected from an ion-beam sputtering method, a long-throw sputtering method, and a collimation sputtering method.

In accordance with the present invention, as shown in FIG. 17, a substrate 160 having the multilayer film 161 formed thereon is placed normal to a target 164 having the same composition as that of the hard bias layers 163 and 163. In this setup, the hard bias layers 163 and 163 are grown in a direction normal to the multilayer film 161 using the ion-beam sputtering method, for instance. The hard bias layers 163 and 163 are not grown into the undercuts 162a and 162a of the resist layer 162 arranged on the multilayer film 161. Less sputter particles are deposited in the regions of the hard bias layers 163 and 163 in contact with the multilayer film 161, because of the overhang by both end portions of the resist layer 162. The thickness of the hard bias layers 163 and 163 is thinner in the regions thereof in contact with the multilayer film 161, and the top surface of the hard bias layers 163 and 163 are downwardly inclined or curved toward the multilayer film 161 as shown. Referring to FIG. 17, a layer 163a having the same composition as that of the hard bias layers 163 and 163 is formed on top of the resist layer 162.

In the manufacturing step shown in FIG. 17, the hard bias layers 163 and 163 are preferably formed so that the height position of the top edge or the bottom edge (in the Z direction) of the magnetic coupling junction between the multilayer film 161 and each of the hard bias layers 163 and 163 is at the same level as the height position of the top surface or the bottom surface of the free magnetic layer or the magnetoresistive-effect layer in the direction of the advance of the recording medium.

It is sufficient if each of the hard bias layers 163 and 163 is magnetically coupled with the free magnetic layer only or the magnetoresistive-effect layer only. The influence of the magnetic field generated from the bias layers 163 and 163, on the magnetization direction of the pinned magnetic layer, is controlled if the hard bias layers 163 and 163 remain magnetically uncoupled with the pinned magnetic layer.

If the multilayer film 161 includes a free magnetic layer which is composed of a plurality of soft magnetic thin-film layers having different magnetic moments and separated from each other by nonmagnetic material layers, like the multilayer film of one of the thin-film devices shown in FIG. 10 through FIG. 13, the hard bias layers 163 and 163 are preferably formed so that the magnetic coupling junction between the multilayer film 161 and each of the hard bias layers 163 and 163 is fabricated of an interface with the end face of only one of the plurality of the soft magnetic thin-film layers forming the free magnetic layer.

If the magnetic coupling junction between the multilayer film 161 and each of the hard bias layers 161 and 161 is fabricated of an interface with the end face of only one of the plurality of the soft magnetic thin-film layers forming the free magnetic layer, the magnetization direction of the soft magnetic thin-film layer on both end portions is free from disturbance.

Figure 18:
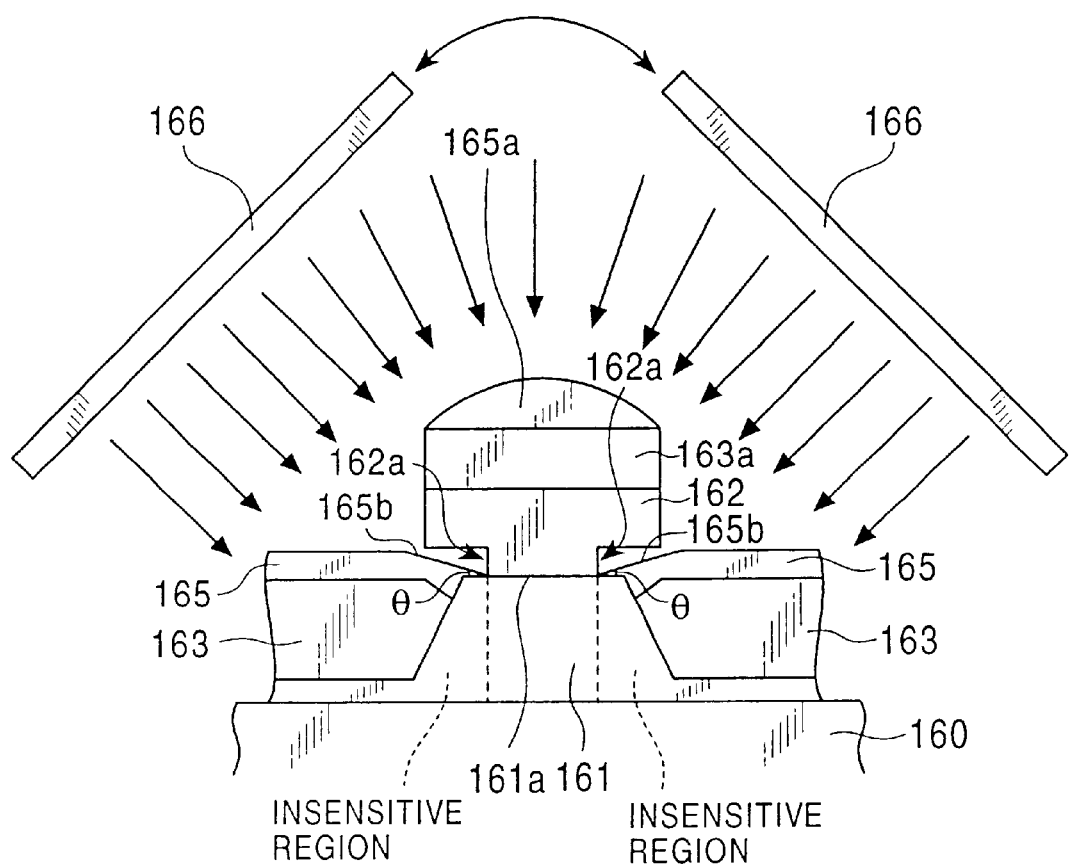
FIG. 18 is a conceptual diagram showing a manufacturing step performed subsequent to the step of FIG. 17.

In a manufacturing step shown in FIG. 18, the electrode layers 165 and 165 are obliquely grown on the hard bias layers 163 and 163 at an angle to the multilayer film 161. In this case, the electrode layers 165 and 165 are grown into the undercuts 162a and 162a formed on the underside of the resist layer 162 arranged on top of the multilayer film 161.

Referring to FIG. 18, a target 166 having the same composition as that of the electrode layer 165 is inclined at an angle to the substrate 160 having the multilayer film 161 formed thereon, and the electrode layers 165 and 165 are grown on the hard bias layers 163 and 163 using the ion-beam sputtering method while moving the target 166 transversely across the substrate 160. The electrode layers 165 and 165 sputtered at an angle to the multilayer film 161 are formed not only on the hard bias layers 163 and 163 but also into the undercuts 162a and 162a of the resist layer 162. Specifically, the electrode layers 165 and 165 formed within the undercuts 162a and 162a are grown on the insensitive regions D and D of the multilayer film 161.

Referring to FIG. 18, the target 166 is moved at an angle with respect to a fixed substrate 160. Alternatively, the substrate 160 may be moved at an angle with respect to a fixed target 166. As shown in FIG. 18, a layer 165a having the same composition as the electrode layers 165 and 165 is deposited on top of the layer 163a on the resist layer 162.

When the portions of the protective layer, formed on top of the multilayer film 161 and having no contact with the resist layer 162, are removed to expose the underlayers beneath the protective layer, the electrode layers 165 and 165 are deposited on and in direct contact with the free magnetic layer, the antiferromagnetic layer or the magnetoresistive-effect layer beneath the protective layer as in the magnetoresistive-effect devices shown in FIG. 11 through FIG. 14.

Figure 19:
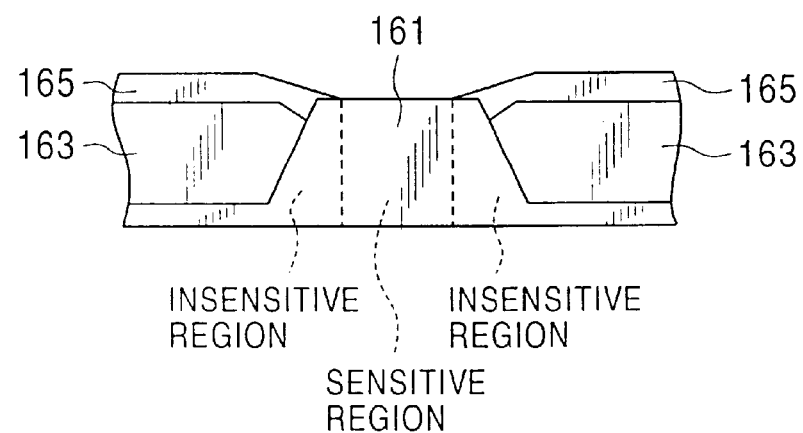
FIG. 19 is a conceptual diagram showing a manufacturing step performed subsequent to the step of FIG. 18.

In a manufacturing step shown in FIG. 19, the resist layer 162 shown in FIG. 18 is removed through a lift-off process, and this completes a magnetoresistive-effect device having the electrode layers 165 and 165 formed on top of the insensitive regions D and D of the multilayer film 161.

In the film forming process of the electrode layers 165 and 165, the angle θ made between the end face 165b of the electrode layer 165 formed into the undercut 162a and the top surface 161a of the multilayer film 161 is preferably 20 degrees or greater, and more preferably 25 degrees or greater. This arrangement prevents the sense current from shunting into the insensitive region, thereby controlling the generation of noise.

In the manufacturing method shown in FIG. 15 through FIG. 19, increasing the angle θ made between the top surface 161a and the end face 165b is difficult. If the angle θ made between the top surface 161a and the end face 165b is too large, a short is likely to occur between the electrode layers 165 and 165 and a top shield layer of a soft magnetic material when the top shield layer is deposited over the multilayer film 161 and the electrode layers 165 and 165. The angle θ made between the top surface 161a and the end face 165b is preferably 60 degrees or smaller, and more preferably, 45 degrees or smaller.

Figure 20:
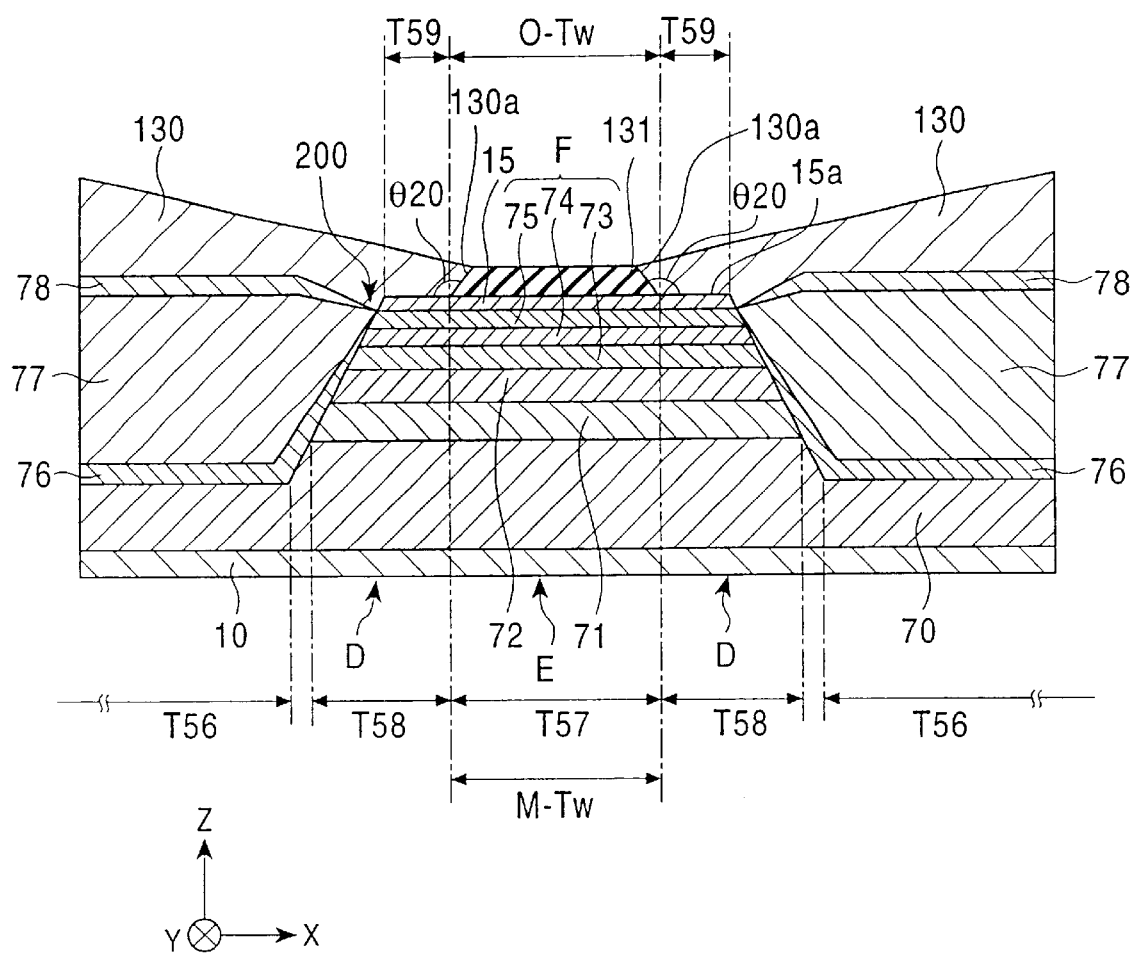
FIG. 20 is a partial cross-sectional view showing the construction of a magnetoresistive-effect device of a fifteenth embodiment of the present invention.

FIG. 20 is a cross-sectional view showing the magnetoresistive-effect device of a fifteenth embodiment of the present invention, viewed from an ABS side thereof.

The magnetoresistive-effect device shown in FIG. 20 includes, on the multilayer film 200 having the same construction as the one in the magnetoresistive-effect device shown in FIG. 10, a laminated insulator layer 131 constructed of $Al_2O_3$, and electrode layers 130 and 130 with end their faces 130a and 130a in direct contact with both sides of the insulator layer 131.

The construction and materials of the layers of the multilayer film 200 remain the same as those of the magnetoresistive-effect device shown in FIG. 10.

Metallic layers 76 and 76, hard bias layers 77 and 77 and intermediate layers 78 and 78, coextending the width dimension T56 of the antiferromagnetic layer 70 extending in the X direction, are identical, in construction and material, to the counterparts in the magnetoresistive-effect device shown in FIG. 10.

In the magnetoresistive-effect device shown in FIG. 20, the first free magnetic layer 73 and the second free magnetic layer 75, having different magnetic moments, are in a ferrimagnetic state with the magnetization directions thereof being antiparallel. The first free magnetic layer 73 and the second free magnetic layer 75, separated from each other by the nonmagnetic material layer 74, function as a single free magnetic layer F.

The two end portions of the free magnetic layer F, having disturbed magnetization directions, present a poor reproduction gain, and become insensitive regions unable to exhibit no substantial magnetoresistive effect.

In fifteenth embodiment again, the sensitive region E and the insensitive regions D and D of the multilayer film 200 are measured using the micro track profile method. Referring to FIG. 20, the portion, having the width dimension T57, of the multilayer film 200 is the sensitive region E, and the portions, each having the width dimension T58, on both sides of the sensitive region E are the insensitive regions D and D.

In the sensitive region E, the magnetization direction of the pinned magnetic layer P is pinned correctly in a direction parallel to the Y direction, and the magnetization direction of the free magnetic layer F is correctly aligned in the X direction. The pinned magnetic layer P and the free magnetic layer F are thus perpendicular in magnetization direction. The magnetization of the free magnetic layer F varies sensitively in response to an external magnetic field from the recording medium. An electrical resistance varies in accordance with the relationship between the variation in the magnetization direction of the free magnetic layer F and the pinned magnetic field of the pinned magnetic layer P. A leakage magnetic field from the recording medium is thus detected in response to a variation in voltage due to the electrical resistance variation. However, those which directly contribute to the variation in the electrical resistance (i.e., the reproduction output) are a relative angle made between the magnetization direction of the pinned magnetic layer 71 and the magnetization direction of the first free magnetic layer 73. These magnetization directions are preferably perpendicular with a sense current conducted in the absence of a signal magnetic field. In other words, the variation in the electrical resistance is determined by the relative angle made between the magnetization directions of the free magnetic layer 73 and the pinned magnetic layer 71, which are separated from each other by the nonmagnetic electrically conductive layer 72.

The electrode layers 130 and 130 formed above the multilayer film 200 extend over the multilayer film 200. The width dimension of the top surface of the multilayer film 200 not covered with the electrode layers 130 and 130 is the optical read track width O-Tw.

The magnetic read track width M-Tw, determined by the width dimension of the sensitive region E not covered with the electrode layers 130 and 130, is a width dimension T57, which is also the dimension of the sensitive region E.

In the fifteenth embodiment, the electrode layers 130 and 130 formed on the multilayer film 200 fully cover the insensitive regions D and D, setting the optical read track width O-Tw and the magnetic read track width M-Tw (i.e., the width dimension of the sensitive region E) to approximately the same dimension.

It is not a requirement that the electrode layers 130 and 130 formed above the multilayer film 200 fully cover the insensitive regions D and D, and the electrode layer 130 may be narrower than the insensitive region D. In this case, the optical read track width O-Tw becomes larger than the magnetic read track width M-Tw.

The percentage of the sense current flowing from the electrodes 130 and 130 to the multilayer film 200 without passing through the hard bias layers 77 and 77 is increased.

The electrode layers 130 and 130 extending over the insensitive regions D and D prevent the sense current from flowing into the insensitive regions D and D, thereby controlling the generation of noise.

When the magnetoresistive-effect device shown in FIG. 20 is produced using the manufacturing method to be described later, the angle θ20 made between the end face 130a of the electrode layer 130, extending over the insensitive region of the multilayer film 200 and in contact with the insulator layer 131, and the top surface 15a of the protective layer 15, is set to be 60 degrees or greater, or 90 degrees or greater. This arrangement allows a certain quantity of sense current to continuously flow through the electrode layer 130, way down to the tip thereof. The magnetoresistive-effect device shown in FIG. 20 is more effective than the magnetoresistive-effect device shown in FIG. 10 in the prevention of the sense current from shunting into the insensitive region, thereby in the control of the generation of noise.

If the magnetoresistive-effect devices shown in FIG. 1 through FIG. 14, having a tapered electrode layer toward its end, are produced in accordance with the manufacturing method described with reference to FIG. 15 through FIG. 19, it is difficult to form the width dimension of the electrode layer extending over the insensitive region at a constant width dimension. A magnetoresistive-effect device having the end of the electrode layer extending over into the sensitive region can result.

If the end of the electrode layer reaches the sensitive region, the width dimension of the area of the electrode layer permitting the sense current to flow therethrough becomes smaller than the width dimension of the sensitive region, and the area of the magnetoresistive-effect device capable of detecting the magnetic field is thus narrowed.

In the magnetoresistive-effect device shown in FIG. 20, the location of the insulator layer 131 on the multilayer film 200 is accurately set using a manufacturing method to be described later and the electrode layer 130 is prevented from extending beyond the insensitive region.

Referring to FIG. 20, the width dimension T59 of the electrode layer 130 extending over the insensitive region D of the multilayer film 200 is preferably within a range from 0 μm to 0.08 μm. The width dimension T59 of the electrode layer 130 is more preferably within a range of 0.05 μm to 0.08 μm.

By producing the magnetoresistive-effect device of FIG. 20 through the manufacturing method to be described later, the side face of the multilayer film 200 and the side face of the insulator layer 131 are set to be parallel to each other.

Figure 21:
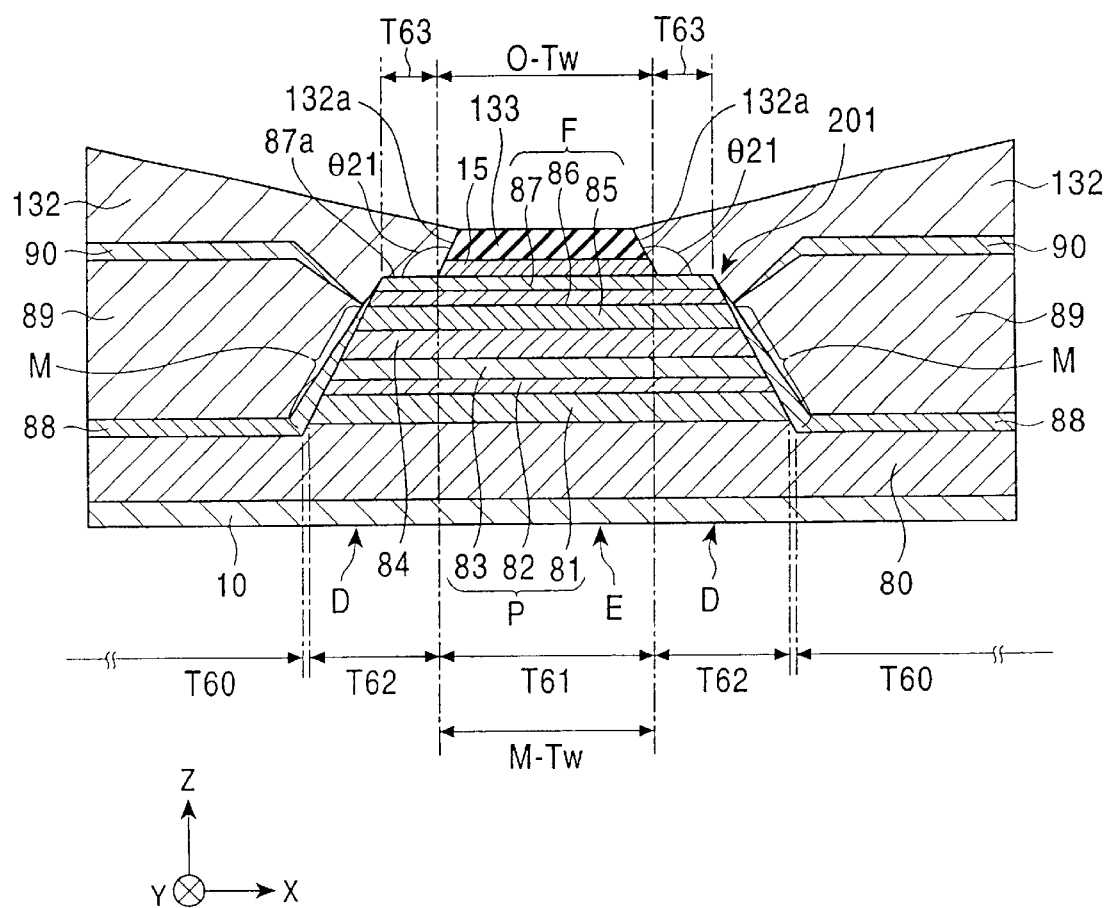
FIG. 21 is a partial cross-sectional view showing the construction of a magnetoresistive-effect device of a sixteenth embodiment of the present invention.

FIG. 21 is a cross-sectional view of the magnetoresistive device of a sixteenth embodiment of the present invention, viewed from an ABS side thereof.

The magnetoresistive-effect device shown in FIG. 21 includes, on a multilayer film 201 having the same construction as the one in the magnetoresistive-effect device shown in FIG. 11, a laminated insulator layer 133 constructed of $Al_2O_3$, and electrode layers 132 and 132 with their end faces 130a and 130a in direct contact with both sides of the insulator layer 133.

The construction and materials of the layers of the multilayer film 201 remain the same as those of the magnetoresistive-effect device shown in FIG. 11.

Metallic layers 88 and 88, hard bias layers 89 and 89 and intermediate layers 90 and 90, coextending the width dimension T60 of the antiferromagnetic layer 80 extending in the X direction, are identical, in construction and material, to the counterparts in the magnetoresistive-effect device shown in FIG. 11.

The first pinned magnetic layer 81 and the second pinned magnetic layer 83, having different magnetic moments, are in a ferrimagnetic state with the magnetization directions thereof being antiparallel. The first pinned magnetic layer 83 and the second pinned magnetic layer 83 pin each other in magnetization direction, thereby stabilizing the magnetization direction of the pinned magnetic layer P in one direction as a whole.

In the magnetoresistive-effect device shown in FIG. 21, the first free magnetic layer 85 and the second free magnetic layer 87, having different magnetic moments and in a ferrimagnetic state with magnetization directions thereof being antiparallel, are laminated with the nonmagnetic material layer 86 interposed therebetween, and function as a single free magnetic layer F.

The two end portions of the free magnetic layer F, having disturbed magnetization directions, present a poor reproduction gain, and become insensitive regions unable to exhibit no substantial magnetoresistive effect.

In sixteenth embodiment again, the sensitive region E and the insensitive regions D and D of the multilayer film 201 are measured using the micro track profile method. Referring to FIG. 21, the portion, having the width dimension T61, of the multilayer film 201 is the sensitive region E, and the portions, each having the width dimension T62, on both sides of the sensitive region E are the insensitive regions D and D.

In the sensitive region E, the magnetization direction of the pinned magnetic layer P is pinned correctly in a direction parallel to the Y direction, and the magnetization direction of the free magnetic layer F is correctly aligned in the X direction. The pinned magnetic layer P and the free magnetic layer F are thus perpendicular in magnetization direction. The magnetization of the free magnetic layer F varies sensitively in response to an external magnetic field from the recording medium. An electrical resistance varies in accordance with the relationship between the variation in the magnetization direction of the free magnetic layer F and the pinned magnetic field of the pinned magnetic layer P. A leakage magnetic field from the recording medium is thus detected in response to a variation in voltage due to the electrical resistance variation.

The electrode layers 132 and 132 formed above the multilayer film 201 extend over the multilayer film 201. The width dimension of the top surface of the multilayer film 201 not covered with the electrode layers 132 and 132 is the optical read track width O-Tw.

The magnetic read track width M-Tw, determined by the width dimension of the sensitive region E not covered with the electrode layers 132 and 132, is a width dimension T61, which is also the dimension of the sensitive region E.

In the sixteenth embodiment, the electrode layers 132 and 132 formed on the multilayer film 201 fully cover the insensitive regions D and D, setting the optical read track width O-Tw and the magnetic read track width M-Tw (i.e., the width dimension of the sensitive region E) to approximately the same dimension.

It is not a requirement that the electrode layers 132 and 132 formed above the multilayer film 201 fully cover the insensitive regions D and D, and the electrode layer 130 may be narrower than the insensitive region D. In this case, the optical read track width O-Tw becomes larger than the magnetic read track width M-Tw.

The percentage of the sense current flowing from the electrodes 132 and 132 to the multilayer film 201 without passing through the hard bias layers 89 and 89 is increased.

The electrode layers 132 and 132 extending over the insensitive regions D and D prevent the sense current from flowing into the insensitive regions D and D, thereby controlling the generation of noise.

As shown in FIG. 21, the protective layer 15 is formed where the multilayer film 201 has no electrode layers 132 and 132 deposited thereon. The insulator layer 133 is deposited on the protective layer 15. The electrode layers 132 and 132 are connected to the second free magnetic layer 87 with no protective layer 15 interposed therebetween.

This arrangement presents a smaller electrical resistance than the arrangement in which the electrode layers 132 and 132 are laminated on the protective layer 15, improving the characteristics of the magnetoresistive-effect device.

When the magnetoresistive-effect device shown in FIG. 21 is produced using the manufacturing method to be described later, the angle θ20 made between the end face 132a of the electrode layer 132, extending over the insensitive region of the multilayer film 201 and in contact with the insulator layer 133, and the top surface 87a of the second free magnetic layer 87, is set to be 60 degrees or greater, or 90 degrees or greater. This arrangement allows a certain quantity of sense current to continuously flow through the electrode layer 132, way down to the tip thereof. The magnetoresistive-effect device shown in FIG. 21 is more effective than the magnetoresistive-effect device shown in FIG. 11 in the prevention of the sense current from shunting into the insensitive region, thereby in the control of the generation of noise.

In the magnetoresistive-effect device shown in FIG. 21, the location of the insulator layer 133 on the multilayer film 201 is accurately set using the manufacturing method to be described later and the electrode layer 132 is prevented from extending beyond the insensitive region and from narrowing the area of the magnetoresistive-effect device capable of detecting the magnetic field.

Referring to FIG. 21, the width dimension T63 of the electrode layer 132 extending over the insensitive region D of the multilayer film 201 is preferably within a range from 0 μm to 0.08 tm. The width dimension T63 of the electrode layer 132 is more preferably within a range of 0.05 μm to 0.08 μm.

Referring to FIG. 21, the magnetic coupling junction M between the multilayer film 201 and each of the hard bias layers 89 and 89 is fabricated of an interface with the end face of only the first free magnetic layer 85, of both the first free magnetic layer 85 and the second free magnetic layer 87.

By producing the magnetoresistive-effect device of FIG. 21 through the manufacturing method to be described later, the side face of the multilayer film 201 and the side face of the insulator layer 133 are set to be parallel to each other.

Figure 22:
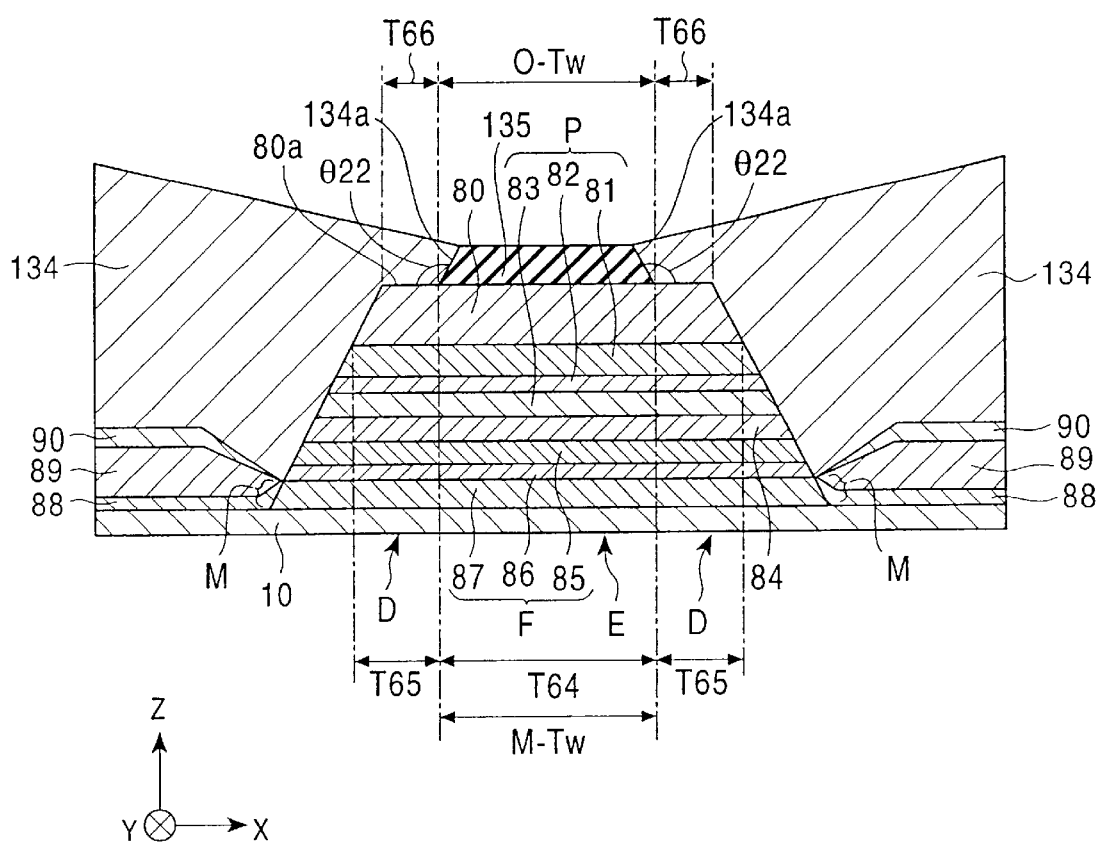
FIG. 22 is a partial cross-sectional view showing the construction of a magnetoresistive-effect device of a seventeenth embodiment of the present invention.

FIG. 22 is a cross-sectional view of the magnetoresistive device of a seventeenth embodiment of the present invention, viewed from an ABS side thereof.

The magnetoresistive-effect device shown in FIG. 22 includes, on the multilayer film 202 having the same construction as the one in the magnetoresistive-effect device shown in FIG. 12, a laminated insulator layer 135 constructed of $Al_2O_3$, and electrode layers 134 and 134 with their end faces 134a and 134a in direct contact with both sides of the insulator layer 135.

The construction and materials of the layers of the multilayer film 202 remain the same as those of the magnetoresistive-effect device shown in FIG. 12. Referring to FIG. 22, however, no protective layer 15 is deposited on top of the multilayer film 202.

The metallic layers 88 and 88, the hard bias layers 89 and 89 and the intermediate layers 90 and 90 deposited on the substrate 10 are identical, in construction and material, to the counterparts in the magnetoresistive-effect device shown in FIG. 12.

The first pinned magnetic layer 81 and the second pinned magnetic layer 83 are in a ferrimagnetic state with the magnetization directions thereof being antiparallel. The first pinned magnetic layer 81 and the second pinned magnetic layer 83 pin each other in magnetization direction, thereby stabilizing the magnetization direction of the pinned magnetic layer P in one direction as a whole.

In the magnetoresistive-effect device shown in FIG. 22, the first free magnetic layer 85 and the second free magnetic layer 87, having different magnetic moments and in a ferrimagnetic state with the magnetization directions thereof being antiparallel, are laminated with the nonmagnetic material layer 86 interposed therebetween, and function as a single free magnetic layer F.

The two end portions of the free magnetic layer F, having disturbed magnetization directions, present a poor reproduction gain, and become insensitive regions unable to exhibit no substantial magnetoresistive effect.

In the seventeenth embodiment again, the sensitive region E and the insensitive regions D and D of the multilayer film 202 are measured using the micro track profile method. Referring to FIG. 22, the portion, having the width dimension T64, of the multilayer film 202 is the sensitive region E, and the portions, each having the width dimension T65, on both sides of the sensitive region E are the insensitive regions D and D.

In the sensitive region E, the magnetization direction of the pinned magnetic layer P is pinned correctly in a direction parallel to the Y direction, and the magnetization direction of the free magnetic layer F is correctly aligned in the X direction. The pinned magnetic layer P and the free magnetic layer F are thus perpendicular in magnetization direction. The magnetization of the free magnetic layer F varies sensitively in response to an external magnetic field from the recording medium. An electrical resistance varies in accordance with the relationship between the variation in the magnetization direction of the free magnetic layer F and the pinned magnetic field of the pinned magnetic layer P. A leakage magnetic field from the recording medium is thus detected in response to a variation in voltage due to the electrical resistance variation.

The electrode layers 134 and 134 deposited above the multilayer film 202 extend over the multilayer film 202. The width dimension of the top surface of the multilayer film 202 not covered with the electrode layers 134 and 134 is the optical read track width O-Tw.

The magnetic read track width M-Tw, determined by the width dimension of the sensitive region E not covered with the electrode layers 134 and 134, is a width dimension T64, which is also the dimension of the sensitive region E.

In the seventeenth embodiment, the electrode layers 134 and 134 formed on the multilayer film 202 fully cover the insensitive regions D and D, setting the optical read track width O-Tw and the magnetic read track width M-Tw (i.e., the width dimension of the sensitive region E) to approximately the same dimension.

It is not a requirement that the electrode layers 134 and 134 formed above the multilayer film 202 fully cover the insensitive regions D and D, and the electrode layer 134 may be narrower than the insensitive region D. In this case, the optical read track width O-Tw becomes larger than the magnetic read track width M-Tw.

The percentage of the sense current flowing from the electrodes 134 and 134 to the multilayer film 202 without passing through the hard bias layers 89 and 89 is increased.

The electrode layers 134 and 134, extending over the insensitive regions D and D, prevent the sense current from flowing into the insensitive regions D and d, thereby controlling the generation of noise.

Referring to FIG. 22, the protective layer 15 is not deposited on top of the multilayer film 202, and the insulator layer 135 is directly deposited on the antiferromagnetic layer 80. The insulator layer 135 also serves as an antioxidizing protective layer. The electrode layers 134 and 134 are directly in contact with the antiferromagnetic layer 80.

This arrangement presents a smaller electrical resistance than the arrangement in which the electrode layers 134 and 134 are deposited on the protective layer 15, improving the characteristics of the magnetoresistive-effect device.

When the magnetoresistive-effect device shown in FIG. 22 is produced using the manufacturing method to be described later, the angle θ22 made between the end face 134*a* of the electrode layer 134, extending over the insensitive region of the multilayer film 202 and in contact with the insulator layer 135, and the top surface 80*a* of the antiferromagnetic layer 80, is set to be 60 degrees or greater, or 90 degrees or greater. This arrangement allows a certain quantity of sense current to continuously flow through the electrode layer 134, way down to the tip thereof. The magnetoresistive-effect device shown in FIG. 22 is more effective than the magnetoresistive-effect device shown in FIG. 12 in the prevention of the sense current from shunting into the insensitive region, thereby in the control of the generation of noise.

In the magnetoresistive-effect device shown in FIG. 22, the location of the insulator layer 135 on the multilayer film 202 is accurately set using the manufacturing method to be described later and the electrode layer 134 is prevented from extending beyond the insensitive region and from narrowing the area of the magnetoresistive-effect device capable of detecting the magnetic field.

Referring to FIG. 22, the width dimension T66 of the electrode layer 134 extending over the insensitive region D of the multilayer film 202 is preferably within a range from 0 μm to 0.08 μm. The width dimension T66 of the electrode layer 134 is more preferably within a range of 0.05 μm to 0.08 μm.

Referring to FIG. 22, the magnetic coupling junction M between the multilayer film 202 and each of the hard bias layers 89 and 89 is fabricated of an interface with the end face of only the first free magnetic layer 87, of both the first free magnetic layer 85 and the second free magnetic layer 87.

By producing the magnetoresistive-effect device of FIG. 22 through the manufacturing method to be described later, the side face of the multilayer film 202 and the side face of the insulator layer 135 are set to be parallel to each other.

Figure 23:
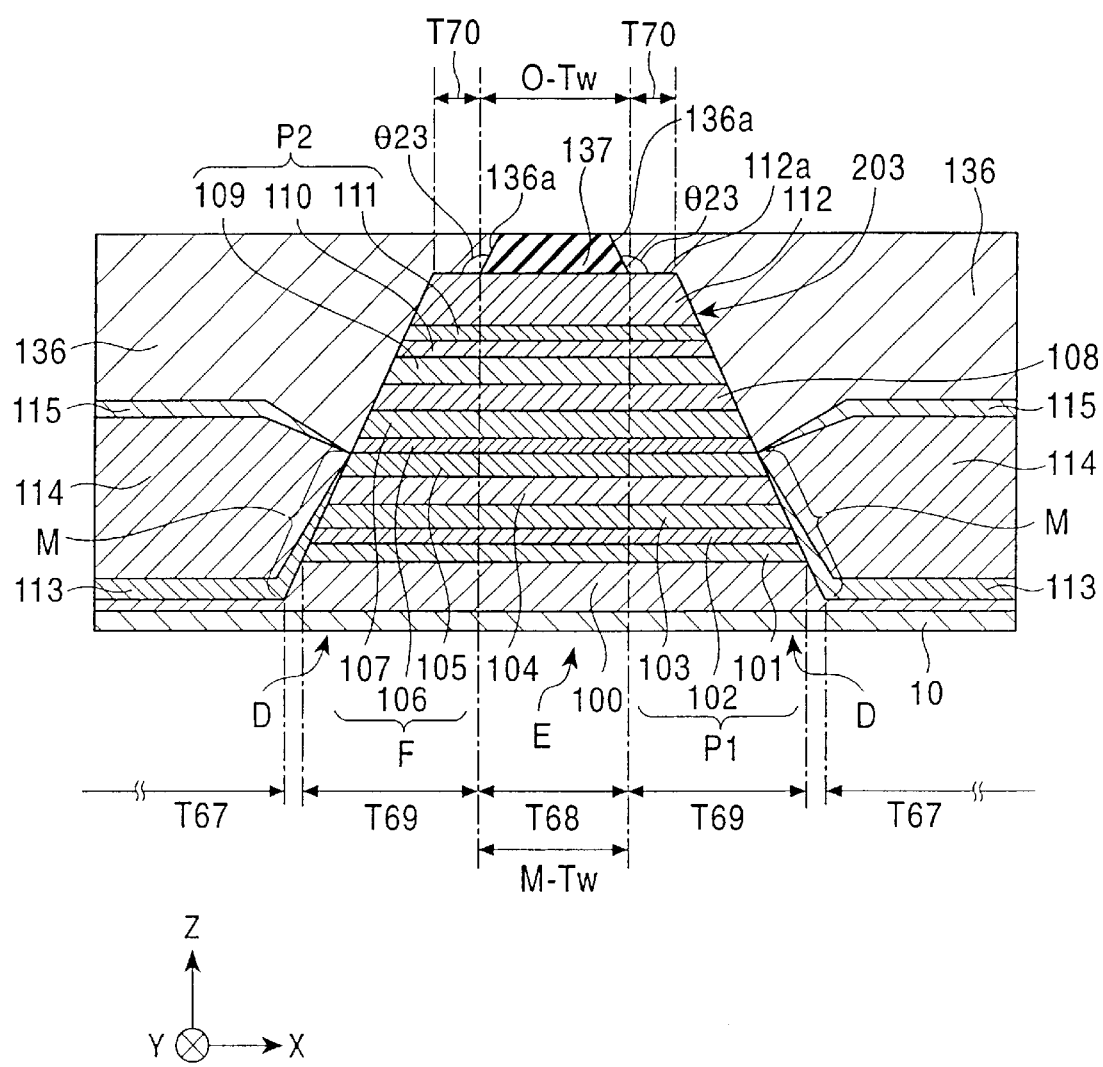
FIG. 23 is a partial cross-sectional view showing the construction of a magnetoresistive-effect device of an eighteenth embodiment of the present invention.

FIG. 23 is a cross-sectional view of the magnetoresistive device of an eighteenth embodiment of the present invention, viewed from an ABS side thereof.

The magnetoresistive-effect device shown in FIG. 23 includes, on the multilayer film 203 having the same construction as the one in the magnetoresistive-effect device shown in FIG. 13, a laminated insulator layer 137 constructed of Al$_2$O$_3$, and electrode layers 136 and 136 with their end faces 136*a* and 136*a* in direct contact with both sides of the insulator layer 137.

The construction and materials of the layers of the multilayer film 203 remain the same as those of the magnetoresistive-effect device shown in FIG. 13. Referring to FIG. 23, however, the layer 15 is deposited on top of the multilayer film 203.

The metallic layers 113 and 113, the hard bias layers 114 and 114 and the intermediate layers 115 and 115 formed on the substrate 10 are identical, coextending the width dimension T67 of the antiferromagnetic layer 100 extending in the X direction, are identical, in construction and material, to the counterparts in the magnetoresistive-effect device shown in FIG. 13.

The first pinned magnetic layer 103 and the second pinned magnetic layer 101 are in a ferrimagnetic state with the magnetization directions thereof being antiparallel. The first pinned magnetic layer 103 and the second pinned magnetic layer 101 pin each other in magnetization direction, thereby stabilizing the magnetization direction of the pinned magnetic layer P$_1$ in one direction as a whole. The first pinned magnetic layer 103 and the fourth pinned magnetic layer 111 are in a ferrimagnetic state with the magnetization directions thereof being antiparallel.

In the magnetoresistive-effect device shown in FIG. 23, the first free magnetic layer 105 and the second free magnetic layer 107, having different magnetic moments and in a ferrimagnetic state with the magnetization directions thereof being antiparallel, are laminated with the nonmagnetic material layer 106 interposed therebetween, and function as a single free magnetic layer F.

The two end portions of the free magnetic layer F, having disturbed magnetization directions, present a poor reproduction gain, and become insensitive regions unable to exhibit no substantial magnetoresistive effect.

In the eighteenth embodiment again, the sensitive region E and the insensitive regions D and D of the multilayer film 203 are measured using the micro track profile method. Referring to FIG. 23, the portion, having the width dimension T68, of the multilayer film 203 is the sensitive region E, and the portions, each having the width dimension T69, on both sides of the sensitive region E are the insensitive regions D and D.

In the sensitive region E, the magnetization directions of the pinned magnetic layers P$_1$ and P$_2$ are correctly aligned in a direction parallel to the Y direction, and the magnetization of the free magnetic layer F is correctly aligned in the X direction. The pinned magnetic layers P$_1$ and P$_2$ and the free magnetic layer F are perpendicular to each other in magnetization direction. The magnetization of the free magnetic layer F varies sensitively in response to an external magnetic field from the recording medium. An electrical resistance varies in accordance with the relationship between the variation in the magnetization direction of the free magnetic layer F and the pinned magnetic field of the pinned magnetic layers $P_1$ and $P_2$. A leakage magnetic field from the recording medium is thus detected in response to a variation in voltage due to the electrical resistance variation.

The electrode layers 136 and 136 formed above the multilayer film 203 extend over the multilayer film 203. The width dimension of the top surface of the multilayer film 203 not covered with the electrode layers 134 and 134 is the optical read track width O-Tw.

The magnetic read track width M-Tw, determined by the width dimension of the sensitive region E not covered with the electrode layers 136 and 136, is the width dimension T68, which is also the dimension of the sensitive region E.

In the eighteenth embodiment, the electrode layers 136 and 136 formed on the multilayer film 203 fully cover the insensitive regions D and D, setting the optical read track width O-Tw and the magnetic read track width M-Tw (i.e., the width dimension of the sensitive region E) to approximately the same dimension.

It is not a requirement that the electrode layers 136 and 136 formed above the multilayer film 203 fully cover the insensitive regions D and D, and the electrode layer 136 may be narrower than the insensitive region D. In this case, the optical read track width O-Tw becomes larger than the magnetic read track width M-Tw.

The percentage of the sense current flowing from the electrodes, 136 and 136 to the multilayer film 203 without passing through the hard bias layers 114 is increased.

The electrode layers 136 and 136, extending over the insensitive regions D and D, prevent the sense current from flowing into the insensitive regions D and D, thereby controlling the generation of noise.

Referring to FIG. 23, the protective layer 15 is not deposited on top of the multilayer film 203, and the insulator layer 137 is directly deposited on the antiferromagnetic layer 112. The insulator layer 137 also serves as an antioxidizing protective layer. The electrode layers 136 and 136 are directly in contact with the antiferromagnetic layer 112.

This arrangement presents a smaller electrical resistance than the arrangement in which the electrode layers 136 and 136 are deposited on the-protective layer 15, improving the characteristics of the magnetoresistive-effect device.

When the magnetoresistive-effect device shown in FIG. 23 is produced using the manufacturing method to be described later, the angle θ23 made between the end face 136a of the electrode layer 136, extending over the insensitive region of the multilayer film 203 and in contact with the insulator layer 137, and the top surface 112a of the antiferromagnetic layer 112, is set to be 60 degrees or greater, or 90 degrees or greater. This arrangement allows a certain quantity of sense current to continuously flow through the electrode layer 136, way down to the tip thereof. The magnetoresistive-effect device shown in FIG. 23 is more effective than the magnetoresistive-effect device shown in FIG. 13 in the prevention of the sense current from shunting into the insensitive region, thereby in the control of the generation of noise.

In the magnetoresistive-effect device shown in FIG. 23, the location of the insulator layer 137 on the multilayer film 203 is accurately set using the manufacturing method to be described later and the electrode layer 136 is prevented from extending beyond the insensitive region and from narrowing the area of the magnetoresistive-effect device capable of detecting the magnetic field.

Referring to FIG. 23, the width dimension T70 of the electrode layer 136 extending over the insensitive region D of the multilayer film 203 is preferably within a range from 0 μm to 0.08 μm. The width dimension T70 of the electrode layer 136 is more preferably within a range of 0.05 μm to 0.08 μm.

Referring to FIG. 23, the magnetic coupling junction M between the multilayer film 203 and each of the hard bias layers 114 and 114 is fabricated of an interface with the end face of only the first free magnetic layer 105, of both the first free magnetic layer 105 and the second free magnetic layer 107.

By producing the magnetoresistive-effect device of FIG. 23 through the manufacturing method to be described later, the side face of the multilayer film 203 and the side face of the insulator layer 137 are set to be parallel to each other.

Figure 24:
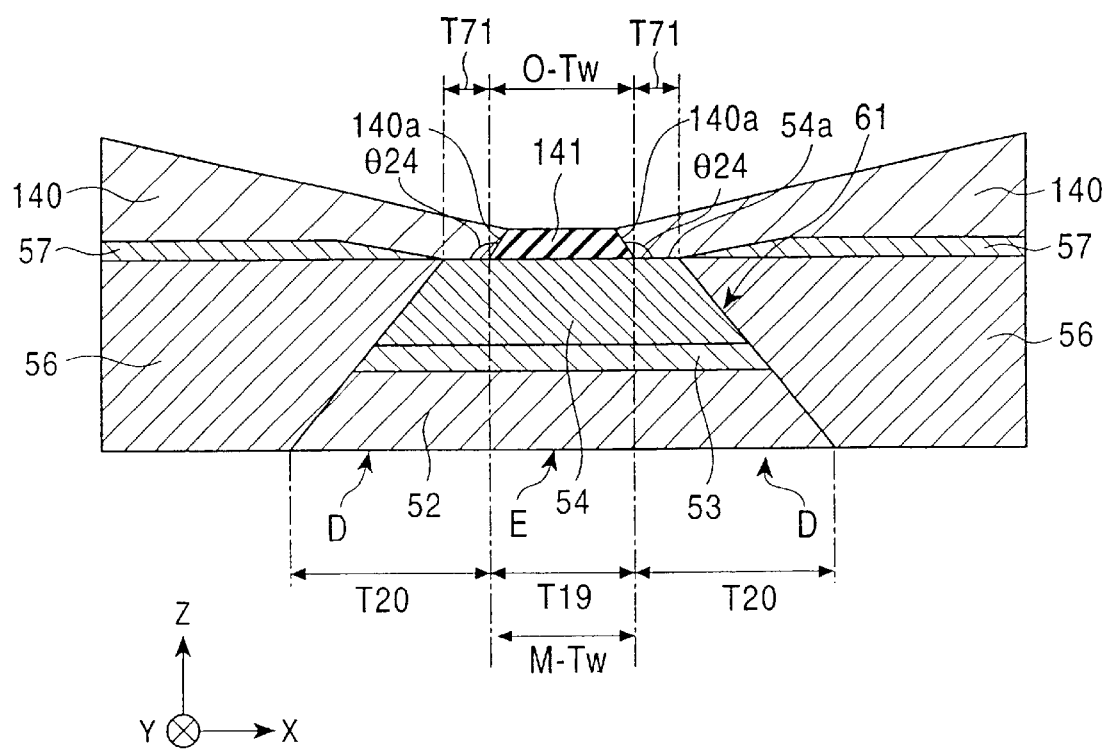
FIG. 24 is a partial cross-sectional view showing the construction of a magnetoresistive-effect device of a nineteenth embodiment of the present invention.

FIG. 24 is a cross-sectional view of the magnetoresistive device of a nineteenth embodiment of the present invention, viewed from an ABS side thereof.

The magnetoresistive-effect device shown in FIG. 24 includes, on the multilayer film 61 having the same construction as the one in the magnetoresistive-effect device shown in FIG. 14, a laminated insulator layer 141 constructed of $Al_2O_3$, and electrode layers 140 and 140 with their end faces 140a and 140a in direct contact with both sides of the insulator layer 141.

The construction and materials of the layers of the multilayer film 61 remain the same as those of the magnetoresistive-effect device shown in FIG. 14. Referring to FIG. 24, however, the layer 55 is not deposited on top of the multilayer film 61.

The hard bias layers 56 and 56 and the intermediate layers 57 and 57 are identical, in construction and material, to the counterparts in the magnetoresistive-effect device shown in FIG. 14.

In the nineteenth embodiment again, the sensitive region E and the insensitive regions D and D of the multilayer film 61 are measured using the micro track profile method. Referring to FIG. 24, the portion, having the width dimension T19, of the multilayer film 61 is the sensitive region E, and the portions, each having the width dimension T20, on both sides of the sensitive region E are the insensitive regions D and D.

The electrode layers 140 and 140 formed on both sides of the multilayer film 61 extend over the multilayer film 61. The width dimension of the top surface of the multilayer film 61 not covered with the electrode layers 140 and 140 is the optical read track width O-Tw.

The magnetic read track width M-Tw, determined by the width dimension of the sensitive region E not covered with the electrode layers 140 and 140, is the width dimension T19, which is also the dimension of the sensitive region E.

In the nineteenth embodiment, the electrode layers 140 and 140 formed on the multilayer film 61 fully cover the insensitive regions D and D, setting the optical read track width O-Tw and the magnetic read track width M-Tw (i.e., the width dimension of the sensitive region E) to approximately the same dimension.

It is not a requirement that the electrode layers 140 and 140 formed above the multilayer film 203 fully cover the insensitive regions D and D, and the electrode layer 140 may be narrower than the insensitive region D. In this case, the optical read track width O-Tw becomes larger than the magnetic read track width M-Tw.

The percentage of the sense current flowing from the electrodes 140 and 140 to the multilayer film 61 without passing through the hard bias layers 56 and 56 is increased in this embodiment.

The electrode layers 140 and 140 extending over the insensitive regions D and D prevent the sense current from flowing into the insensitive regions D and D, thereby controlling the generation of noise.

Referring to FIG. 24, the protective layer 55 is not deposited on top of the multilayer film 61, and the insulator layer 141 is directly deposited on the magnetoresistive layer 54. The insulator layer 141 also serves as an antioxidizing protective layer. The electrode layers 140 and 140 are directly in contact with the magnetoresistive layer 54.

This arrangement presents a smaller electrical resistance than the arrangement in which the electrode layers 140 and 140 are deposited on the protective layer 55, improving the characteristics of the magnetoresistive-effect device.

When the magnetoresistive-effect device shown in FIG. 24 is produced using the manufacturing method to be described later, the angle θ24 made between the end face 140a of the electrode layer 140, extending over the insensitive region of the multilayer film 61 and in contact with the insulator layer 141, and the top surface 54a of the magnetoresistive layer 54, is set to be 60 degrees or greater, or 90 degrees or greater. This arrangement allows a certain quantity of sense current to continuously flow through the electrode layer 140, way down to the tip thereof. The magnetoresistive-effect device shown in FIG. 24 is more effective than the magnetoresistive-effect device shown in FIG. 14 in the prevention of the sense current from shunting into the insensitive region, thereby in the control of the generation of noise.

In the magnetoresistive-effect device shown in FIG. 24, the location of the insulator layer 141 on the multilayer film 61 is accurately set using the manufacturing method to be described later and the electrode layer 140 is prevented from extending beyond the insensitive region and from narrowing the area of the magnetoresistive-effect device capable of detecting the magnetic field.

Referring to FIG. 24, the width dimension T71 of the electrode layer 141 extending over the insensitive region D of the multilayer film 61 is preferably within a range from 0 μm to 0.08 μm. The width dimension T71 of the electrode layer 140 is more preferably within a range of 0.05 μm to 0.08 μm.

In the AMR device, the hard bias layers 56 and 56 are magnetized in the X direction as shown, and the magnetoresistive layer 54 is supplied with the bias magnetic field in the X direction by the hard bias layers 56 and 56. Furthermore, the magnetoresistive layer 54 is supplied with the bias field in the Y direction by the soft magnetic layer 52. With the magnetoresistive layer 54 supplied with the bias magnetic fields in the X direction and Y direction, a variation in magnetization thereof in response to a variation in the magnetic field becomes linear.

The sense current from the electrode layers 140 and 140 is directly fed to the magnetoresistive layer 54 in the sensitive region E. The direction of the advance of the recording medium is aligned with the Z direction. When a leakage magnetic field from the recording medium in the Y direction is applied, the magnetization direction of the magnetoresistive layer 54 varies, causing a variation in the resistance. The resistance variation is then detected as a voltage variation.

By producing the magnetoresistive-effect device of FIG. 24 through the manufacturing method to be described later, the side face of the multilayer film 61 and the side face of the insulator layer 141 are set to be parallel to each other.

The formation of the insulator layer between the electrode layers makes mild the inclination of the top surface of each of the magnetoresistive-effect devices as shown in FIG. 20 through FIG. 24. Even if the angle made between the top surface of the protective layer, the free magnetic layer or the antiferromagnetic layer and the end face of each electrode layer becomes large, a short is less likely to occur between the electrode layers and a top shield layer of a soft magnetic material when the top shield layer is deposited over the multilayer film and the electrode layers.

The manufacturing method for manufacturing the magnetoresistive-effect devices shown in FIGS. 20 through 24 is now discussed, referring to drawings.

Figure 25:
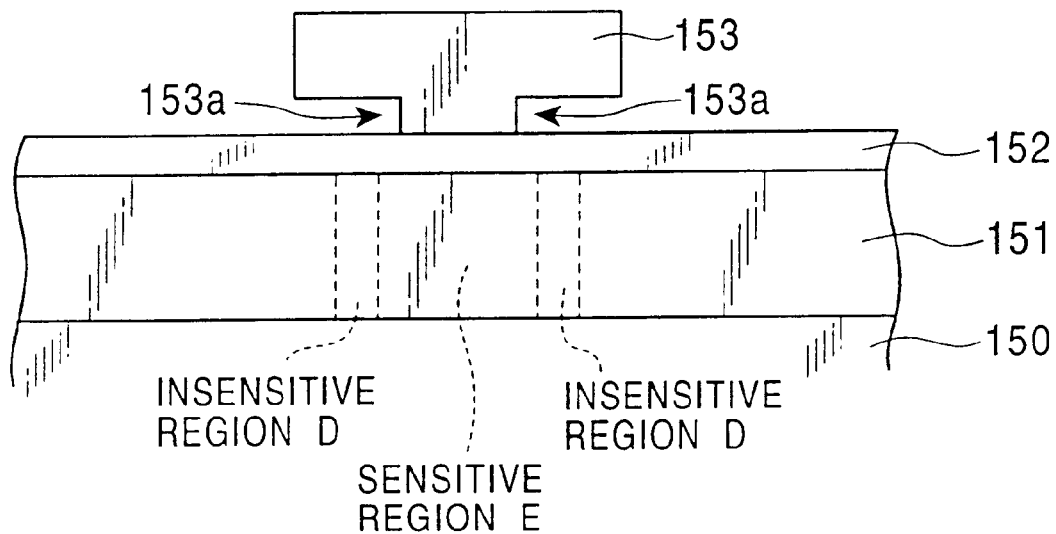
FIG. 25 is a conceptual diagram showing a manufacturing step of the magnetoresistive-effect device of the present invention.

Referring to FIG. 25, a multilayer film 151 of the magnetoresistive-effect device is formed on a substrate 150. An insulator layer 152, made of $Al_2O_3$, is formed on the multilayer film 151. The multilayer film 151 can be any of the multilayer films of the single spin-valve type thin-film devices shown in FIG. 20 through FIG. 22, the multilayer film of the dual spin-valve type thin-film devices shown in FIG. 23, and the multilayer film of the AMR device shown in FIG. 24.

Figure 26:
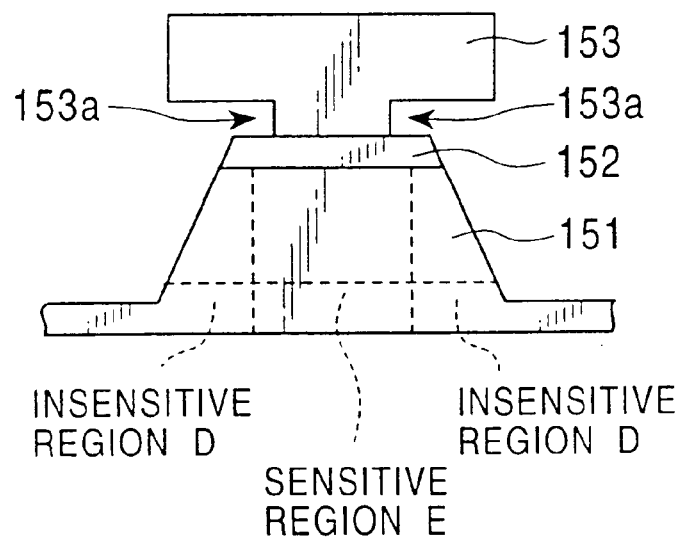
FIG. 26 is a conceptual diagram showing a manufacturing step performed subsequent to the step of FIG. 25.

To form the antiferromagnetic layer 70, 80, or 100 in the extended form thereof in the X direction respectively shown in FIG. 20, FIG. 21, or FIG. 23, an etch rate and etch time are controlled to leave the side portions of the antiferromagnetic layer 70, 80, or 100 when the side portions of the multilayer film 151 and the insulator layer 152, shown in FIG. 26, are etched away.

When the multilayer film 151 is a multilayer film for a single spin-valve type thin-film device or a dual spin-valve type thin-film device, the antiferromagnetic layer in the multilayer film 151 is preferably made of a PtMn alloy, or may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof. When the antiferromagnetic layer is made of one of the above-cited materials, the antiferromagnetic layer needs to be subjected to a heat treatment to generate an exchange coupling magnetic field in the interface with the pinned magnetic layer.

FIG. 33 shows a conventional magnetoresistive-effect device having its hard bias layers and electrode layers on only both sides of the multilayer film. The width dimension A of the top surface of the multilayer film of the conventional magnetoresistive-effect device is measured using an optical microscope as shown in FIG. 31. The magnetoresistive-effect device is then scanned across a micro track having a signal recorded thereon, on a recording medium in the direction of the track width, and a reproduction output is detected. A top width dimension of B giving an output equal to or greater than 50% of a maximum reproduction output is defined as the sensitive region E and a top width dimension of C giving an output smaller than 50% of the maximum reproduction output is defined as the insensitive region D.

Based on these measurement results, a lift-off resist layer 153 is deposited on the multilayer film 151, paying attention to the width dimension C of the insensitive regions D and D measured through the micro track profile method.

Referring to FIG. 25, undercuts 153a and 153a are formed on the underside of the resist layer 153. The resist layer 153 serves as a mask for etching the insulator layer 152 in a later step. The resist layer 153 is adjusted to grow so that the bottom face of the insulator layer 152 fully covers the sensitive region E of the multilayer film 151 after-the etching of the insulator layer 152. The undercuts 153a and 153a are chiefly formed above the insensitive regions D and D of the multilayer film 151. When the side walls of the resist layer 153 are inclined at an angle subsequent to the etching, the undercuts 153a and 153a may cut into the area above the sensitive region E by a slight depth to account for the inclined wall face.

In a manufacturing step shown in FIG. 26, both sides of each of the multilayer film 151 and the insulator layer 152 are etched away.

Figure 27:
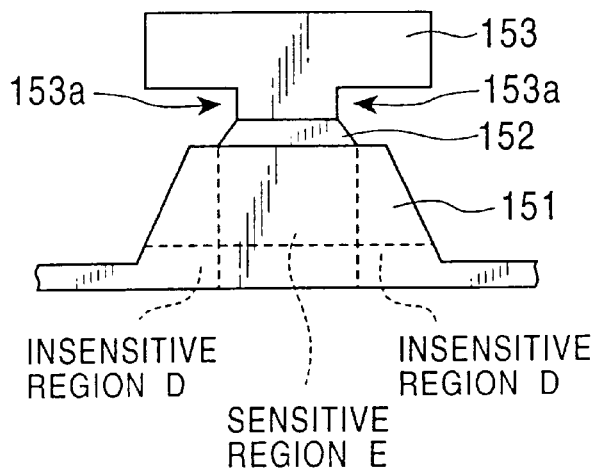
FIG. 27 is a conceptual diagram showing a manufacturing step performed subsequent to the step of FIG. 26.

In a manufacturing step shown in FIG. 27, the insensitive regions D and D of the multilayer film 151 are exposed by etching away only the insulator layer 152 of $Al_2O_3$ in a alkaline solution. The layers forming the multilayer film 151 are not dissolved into the alkaline solution. In the state shown in FIG. 27, the bottom face of the insulator layer 152 fully covers the sensitive region E of the multilayer film 151.

When the insulator layer 152 of $Al_2O_3$ is etched in the alkaline solution, the side walls of the insulator layer 152 are respectively maintained parallel to the side walls of the multilayer film 151, and even after the etching process, the side walls of the insulator layer 152 and the side walls of the multilayer film 151 are maintained parallel to each other.

When the magnetoresistive-effect devices shown in FIG. 21 is manufactured, the protective layer is deposited on top of the multilayer film 151, and the insulator layer 152 and the resist layer 153 are successively formed on top of the protective layer. Subsequent to the manufacturing step shown in FIG. 27, the portions of the protective layer, which come just below the undercuts 153a and 153a of the resist layer 153, namely, the portions not covered with the insulator layer 152, are removed through an obliquely entering ion milling beam to expose the layer beneath the protective layer.

Figure 28:
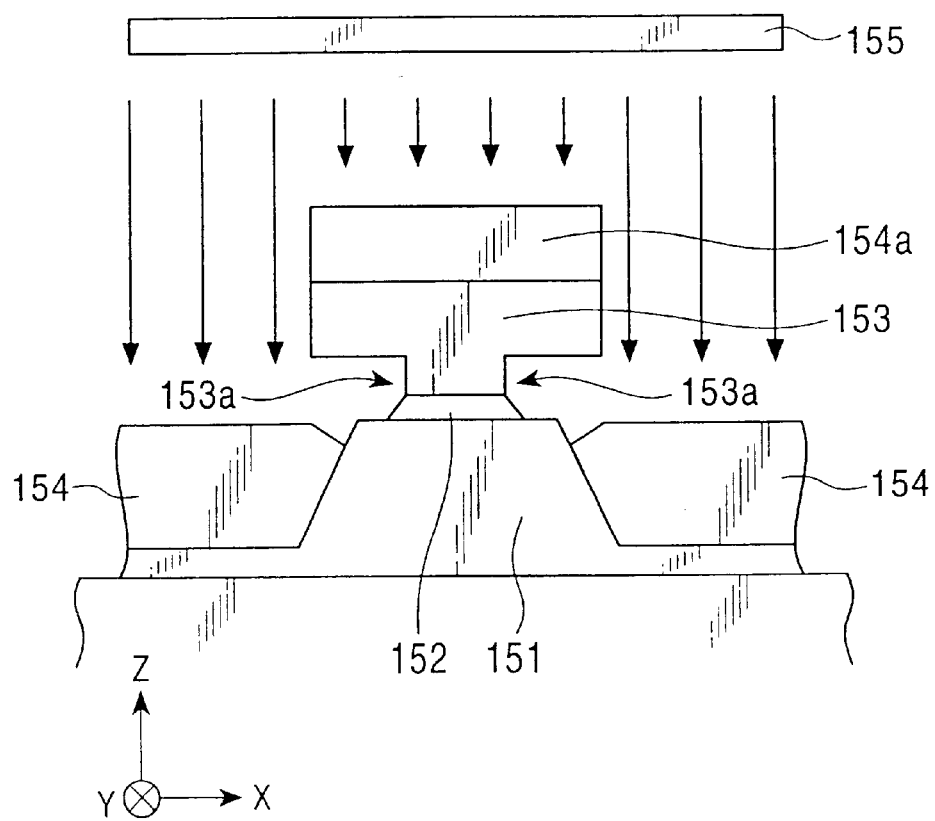
FIG. 28 is a conceptual diagram showing a manufacturing step performed subsequent to the step of FIG. 27.

In a manufacturing step shown in FIG. 28, hard bias layers 154 and 154 are deposited on both sides of the multilayer film 151. In this invention, the sputtering technique, used to form the hard bias layers 154 and 154 and electrode layers 156 and 156 to be formed subsequent to the formation of the hard bias layers 154 and 154, is preferably at least one sputtering technique selected from an ion-beam sputtering method, a long-throw sputtering method, and a collimation sputtering method.

In accordance with the present invention, as shown in FIG. 28, a substrate 150 having the multilayer film 151 formed thereon is placed normal to a target 155 having the same composition as that of the hard bias layers 154 and 154. In this setup, the hard bias layers 154 and 154 are grown in a direction normal to the multilayer film 151 using the ion-beam sputtering method, for instance. Less sputter particles are deposited in the regions of the hard bias layers 154 and 154 in contact with the multilayer film 151, because of the overhang by both end portions of the resist layer 153. The thickness of the hard bias layers 154 and 154 is thinner in the regions thereof in contact with the multilayer film 151, and the top surface of the hard bias layers 154 and 154 are downwardly inclined or curved toward the multilayer film 151 as shown. Referring to FIG. 28, a layer 154a having the same composition as that of the hard bias layers 154 and 154 is deposited on top of the resist layer 153.

In the manufacturing step shown in FIG. 28, the hard bias layers 154 and 154 are preferably formed so that the height position of the top edge or the bottom edge (in the Z direction) of the magnetic coupling junction between the multilayer film 151 and each of the hard bias layers 154 and 154 is at the same level as the height position of the top surface or the bottom surface of the free magnetic layer or the magnetoresistive-effect layer in the direction of the advance of the recording medium.

It is sufficient if each of the hard bias layers 154 and 154 is magnetically coupled with the free magnetic layer only or the magnetoresistive-effect layer only. The influence of the magnetic field generated from the bias layers 154 and 154 on the magnetization direction of the pinned magnetic layer is controlled, if the hard bias layers 154 and 154 remain magnetically uncoupled with the-pinned magnetic layer.

If the multilayer film 151 includes a free magnetic layer which is composed of a plurality of soft magnetic thin-film layers having different magnetic moments and separated from each other by nonmagnetic material layers, like the multilayer film of one of the thin-film devices shown in FIG. 20 through FIG. 23, the hard bias layers 154 and 154 are preferably formed so that the magnetic coupling junction between the multilayer film 151 and each of the hard bias layers 154 and 154 is fabricated of an interface with the end face of only one of the plurality of the soft magnetic thin films forming the free magnetic layer.

If the magnetic coupling junction between the multilayer film 151 and each of the hard bias layers 154 and 154 is fabricated of an interface with the end face of only one of the plurality of the soft magnetic thin-film layers forming the free magnetic layer, the magnetization direction of the soft magnetic thin-film layer on both end portions is free from disturbance.

Figure 29:
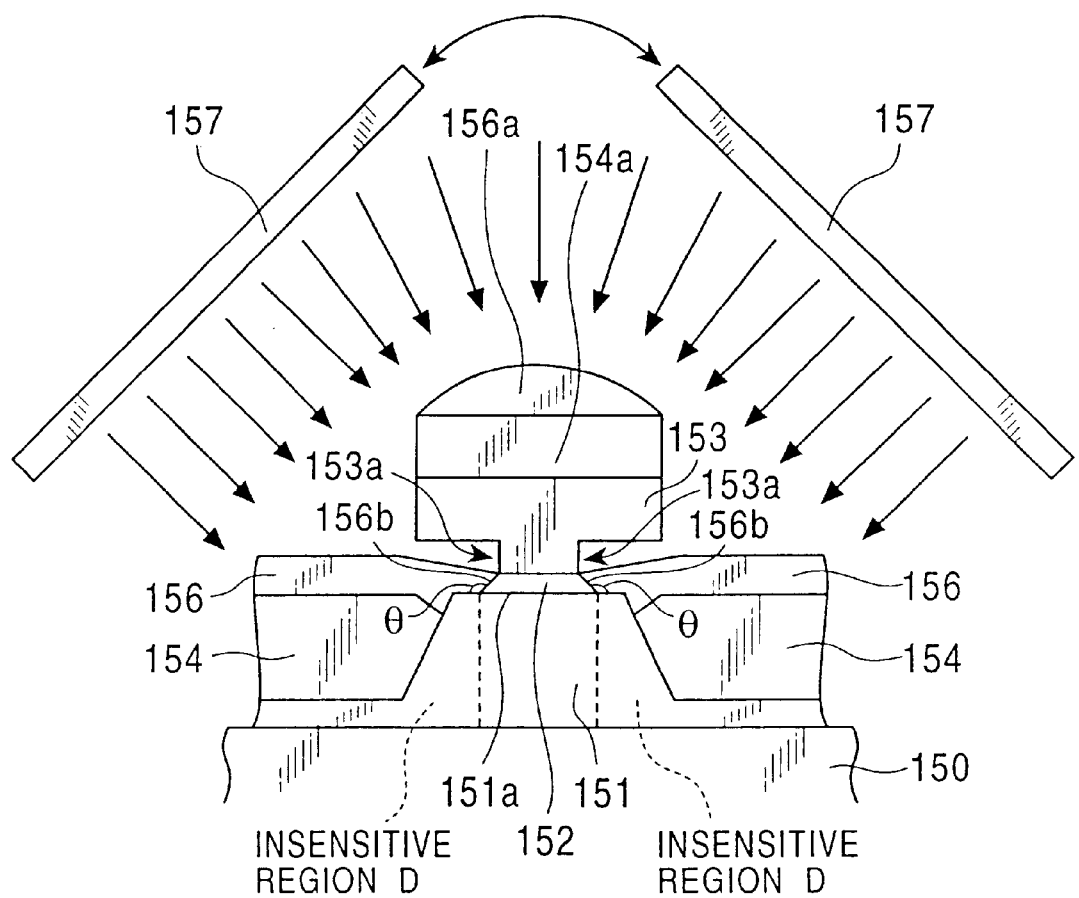
FIG. 29 is a conceptual diagram showing a manufacturing step performed subsequent to the step of FIG. 28.

In a manufacturing step shown in FIG. 29, the electrode layers 156 and 156 are obliquely grown on the hard bias layers 154 and 154 at an angle to the multilayer film 151. In this case, the electrode layers 156 and 156 are grown into the undercuts 153a and 154a formed on the underside of the resist layer 153 arranged on top of the multilayer film 151.

Referring to FIG. 29, the target 157 having the same composition as that of the electrode layer 156 is inclined at an angle to the substrate 150 having the multilayer film 151 formed thereon, and the electrode layers 156 and 156 are grown on the hard bias layers 154 and 154 using the ion-beam sputtering method while moving the target 157 transversely across the substrate 150. The electrode layers 156 and 156 sputtered at an angle to the multilayer film 151 are formed not only on the hard bias layers 154 and 154 but also into the undercuts 153a and 153a of the resist layer 153.

Specifically, the electrode layers 156 and 156 formed within the undercuts 153a and 153a are grown on the insensitive regions D and D of the multilayer film 151.

The end face 156b of each of the electrode layers 156 and 156 is in contact with both side walls of the insulator layer 152.

Referring to FIG. 29, the target 157 is moved at an angle with respect to a fixed substrate 150. Alternatively, the substrate 150 is moved at an angle with respect to a fixed target 157. As shown in FIG. 29, a layer 156a having the same composition as that of the electrode layers 156 and 156 is formed on top of the layer 154a on the resist layer 154.

When the portions of the protective layer, formed on top of the multilayer film 151, are removed to expose the underlayer beneath the protective layer, the electrode layers 156 and 156 are formed on the free magnetic layer beneath the protective layer as in the magnetoresistive-effect device shown in FIG. 21.

Figure 30:
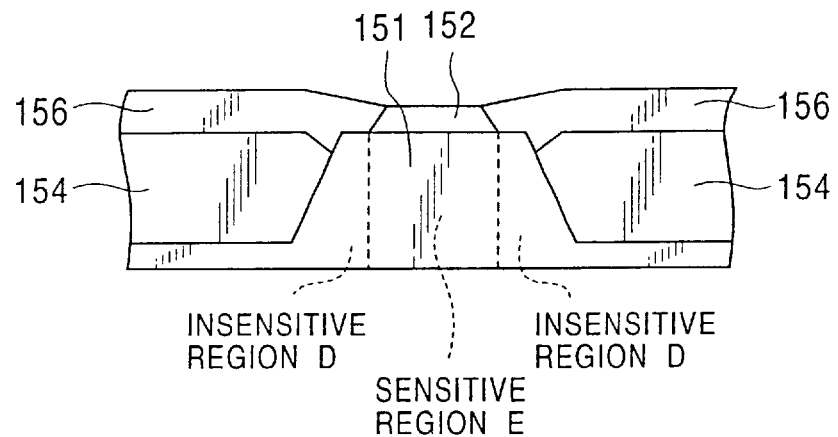
FIG. 30 is a conceptual diagram showing a manufacturing step performed subsequent to the step of FIG. 29.

In a manufacturing step shown in FIG. 30, the resist layer 153 shown in FIG. 29 is removed through a lift-off process, and this completes a magnetoresistive-effect device having the electrode layers 156 and 156 formed on top of the insensitive regions D and D of the multilayer film 151 and the insulator layer 152 formed between the electrode layers 156 and 156.

In the film forming process of the electrode layers 156 and 156, the angle θ made between the end face 156b of the electrode layer 156 extending over the insensitive region D and in contact with the side walls of the insulator layer 152 and the top surface 151a of the multilayer film 151 is preferably 60 degrees or greater, and more preferably 90 degrees or greater. This arrangement allows a certain quantity of sense current to continuously flow through the electrode layer 156, way down to the tip thereof. The magnetoresistive-effect device manufactured in this way is more effective than the magnetoresistive-effect devices shown in FIG. 1 through FIG. 14 in the prevention of the sense current from shunting into the insensitive region, thereby in the control of the generation of noise.

Since the location of the insulator layer 152 on the multilayer film 151 is accurately set, the electrode layers 156 and 156 are prevented from extending beyond the insensitive region and from narrowing the area of the magnetoresistive-effect device capable of detecting the magnetic field.

Tests have been conducted to measure the relationship of the width dimension of each electrode, formed to extend over the multilayer film constituting the magnetoresistive-effect device, with the direct current resistance (DCR) and the noise generation rate.

The magnetoresistive-effect device tested in measurements is a spin-valve type thin-film device shown in FIG. 5. The width dimension of the top surface of the multilayer film in the magnetoresistive-effect device is 1.4 μm.

The electrode layers formed on both sides and above the multilayer film extend over the multilayer film. The width dimension of the electrode layer extending over the multilayer film is increased from 0 μm to 0.12 μm in steps of 0.01 μm to produce a plurality of magnetoresistive-effect devices. In each of the magnetoresistive-effect devices, the relationship of the width dimension of each electrode, formed to extend over the multilayer film, with the direct current resistance (DCR) and the noise generation rate, is measured. The test results are plotted in FIG. 32.

Figure 32:
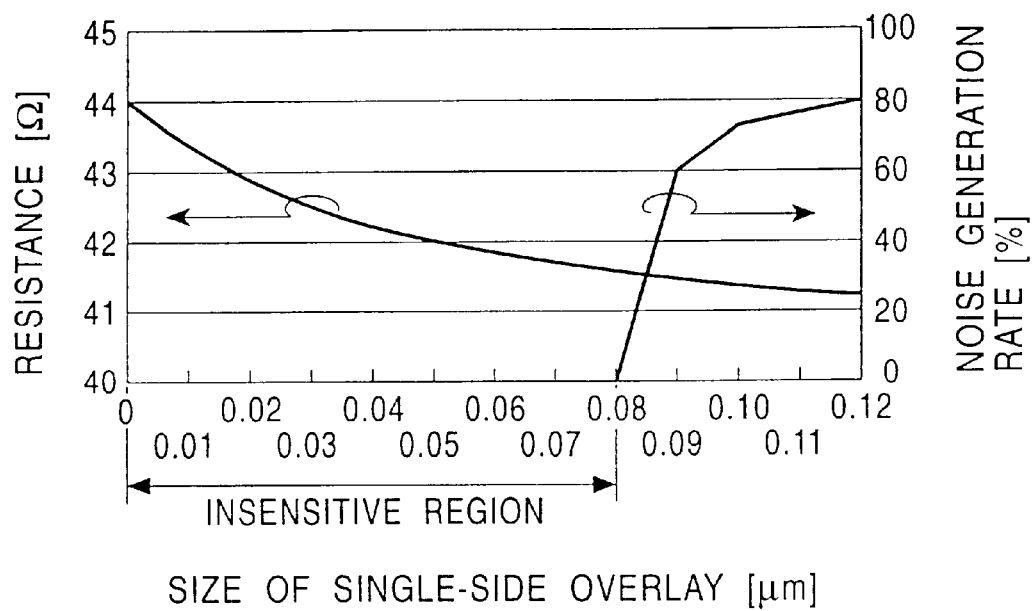
FIG. 32 is a graph showing the relationship of the width dimension of an electrode layer formed on a multilayer film, a direct current resistance thereof, and noise generation rate.

FIG. 32 shows that the larger the width dimension of the electrode layer extending over the multilayer, the smaller the direct current resistance. When the electrode layer is formed on the multilayer film with its width dimension enlarged, the electrode layer covers the insensitive region D in the side end portion of the multilayer film, and the sense current from the electrode layer is effectively conducted to the sensitive region E. As the junction area of the electrode layer with the multilayer film is increased, the direct current resistance is reduced.

As shown in FIG. 32, when the width dimension of the electrode layer extending over the multilayer film is 0.08 μm, the direct current resistance is smaller than the one with no electrode layer formed at all on the multilayer film (i.e., the direct current resistance at an electrode layer width dimension of 0 μm) and no noise is generated in the reproduction output.

It is found that an excessively large width dimension of the electrode layer formed on the multilayer film generates noise in the reproduction output.

The noise generation rate rises as shown in FIG. 32, when the width dimension of the electrode layer formed on the multilayer film increases above 0.08 μm. This is because the area of the multilayer film as wide as 0.08 μm from its edge is the insensitive region D. If the electrode layer extends beyond the 0.08 μm area, the electrode layer extends into the sensitive region E. Although the sensitive region E exhibits effectively the magnetoresistive effect, a portion of the sensitive region E having the electrode layer deposited thereon falls outside the magnetic read track width M-Tw, and the output produced therein becomes noise. The test results show that the electrode layer extending over the multilayer film preferably extends over the insensitive region D but not into the sensitive region E beyond the insensitive region D.

From the above discussion, the width dimension of the electrode layers on both sides of the multilayer film is preferably within a range from 0 μm to 0.08 μm.

In accordance with the present invention, the electrode layers, above and on both sides of the multilayer film, are formed to extend over the insensitive regions, on both side portions of the multilayer film, having a poor magnetoresistive effect without reproduction capability. This arrangement makes it easier for the sense current to flow into the multilayer film from the electrode layers without passing through the hard bias layers. The junction area between the electrode layers and the multilayer film thus increases, reducing the direct current resistance, and thereby improving the reproduction characteristics.

In accordance with the present invention, the electrode layers are formed to reliably and easily extend over the insensitive regions of the multilayer film with the lift-off resist employed, using the ion-beam sputtering method.

Figure 35:
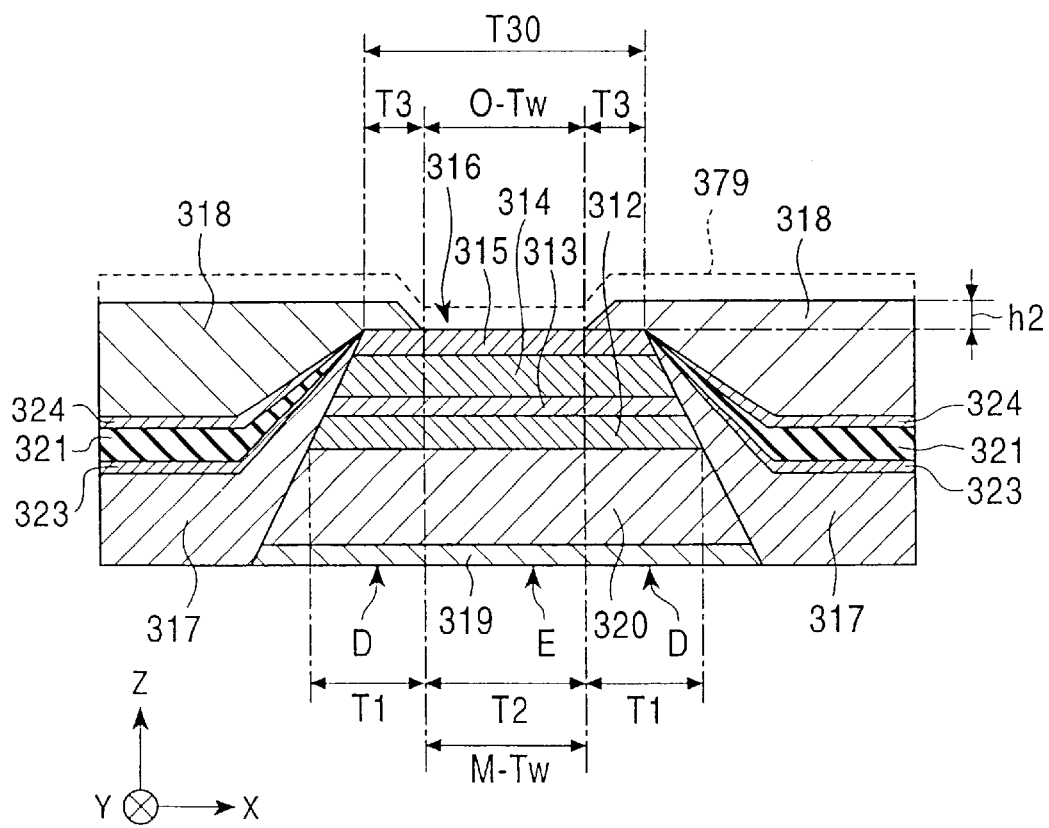
FIG. 35 is a partial cross-sectional view showing the construction of a magnetoresistive-effect device of a twentieth embodiment of the present invention.

FIG. 35 is a cross-sectional view showing the construction of the magnetoresistive-effect device of a twentieth embodiment of the present invention, viewed from an ABS side thereof. FIG. 35 shows only the central portion of the device sectioned in an XZ plane.

The magnetoresistive-effect device is a spin-valve type thin-film device, namely, one type of GMR (giant magnetoresistive) devices making use of the giant magnetoresistive effect. The spin-valve type thin-film device is mounted on the trailing end of a floating slider in a hard disk device to detect a magnetic field recorded onto a hard disk. The direction of the movement of a magnetic recording medium such as a hard disk is aligned with the Z direction, and the direction of a leakage magnetic field of the magnetic recording medium is aligned with the Y direction.

A substrate 319, fabricated of a nonmagnetic material such as Ta (tantalum), becomes the bottom layer of the device as shown in FIG. 35. An antiferromagnetic layer 320, a pinned magnetic layer 312, a nonmagnetic, electrically conductive layer 313, and a free magnetic layer 314 are laminated onto the substrate 319. A protective layer 315, fabricated of Ta (tantalum), is formed on the free magnetic layer 314. A multilayer film 316 thus includes the substrate 319 through the protective layer 315. Referring to FIG. 35, the width dimension of the top surface of the multilayer film 316 is T30.

The pinned magnetic layer 312 is deposited on and in direct contact with the antiferromagnetic layer 320, and is subjected to annealing in the presence of a magnetic field. An exchange anisotropic magnetic field takes place through exchange coupling at the interface between the antiferromagnetic layer 320 and the pinned magnetic layer 312. The magnetization of the pinned magnetic layer 312 is thus pinned in the Y direction.

In accordance with the present invention, the antiferromagnetic layer 320 is made of a Pt—Mn (platinum-manganese) alloy film. The Pt—Mn alloy film outperforms an Fe—Mn alloy film and Ni—Mn alloy film, conventionally used as an antiferromagnetic layer, in terms of corrosion resistance, and has a high blocking temperature, and further provides a large exchange anisotropic magnetic field (Hex). The Pt—Mn alloy film has thus excellent characteristics as an antiferromagnetic material.

Instead of the Pt—Mn alloy, the antiferromagnetic layer 320 may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof.

The pinned magnetic layer 312 and the free magnetic layer 314 are made of an Ni—Fe (nickel-iron) alloy, Co (cobalt), an Fe—Co (iron-cobalt) alloy, or an Fe—Co—Ni alloy, and the nonmagnetic electrically conductive layer 313 is made of a low electrical-resistance nonmagnetic electrically conductive material, such as Cu (copper).

Referring to FIG. 35, hard bias layers 317 and 317 are formed on both sides of the multilayer film 316, composed of the substrate 319 through the protective layer 315. The hard bias layers 317 and 317 are made of a Co—Pt (cobalt-platinum) alloy or a Co—Cr—Pt (cobalt-chromium-platinum) alloy.

The hard bias layers 317 and 317 are magnetized in the X direction (i.e., the direction of a track width), and the magnetization of the free magnetic layer. 314 is aligned in the X direction under the bias magnetic field in the X direction from the hard bias layers 317 and 317.

Intermediate layers 321 and 321, made of a high-resistivity material having a resistance higher than that of the electrode layers 318 and 318 or an insulating material, or a laminate of a high-resistivity material and an insulating material, are separated from the hard bias layers 317 and 317 by antimagnetic layers 323 and 323. When an oxide or Si compound is used for the intermediate layer 321, the antimagnetic layer 323 is preferably interposed between each of the hard bias layers 317 and 317 and each of the electrode layers 318 and 318. Without the antimagnetic layer 323, diffusion is likely to take place between the hard bias layers 317 and 317, made of CoPt, and the intermediate layers 321 and 321 made of the oxide or Si compound. When the intermediate layers 321 and 321 are constructed of an N compound, however, such a diffusion is less likely to take place, and the antimagnetic layer 323 is dispensed with.

The high-resistivity material 321, which fabricates the intermediate layer 321, is preferably at least one material selected from the group consisting of $TaSiO_2$, TaSi, $CrSiO_2$, CrSi, WSi, $WSiO_2$, TiN, and TaN.

Furthermore, the high-resistivity material, which fabricates the intermediate layer 321, is preferably at least one material selected from the group consisting of $Al_2O_3$, $SiO_2$, $Ti_2O_3$, TiO, WO, AlN, $Si_3N_4$, $B_4C$, SiC, and SiAlON.

Referring to FIG. 35, the electrode layers 318 and 318 are deposited on nonmagnetic materials 234 and 324, made of Ta, which are respectively deposited on top of the intermediate layers 321 and 321. In the twentieth embodiment, the electrode layers 318 and 318 are formed to extend over the multilayer film 316. When an oxide or Si compound is used for the intermediate layers 321 and 321, the use of the nonmagnetic material 234 and 324 is preferable. When an N compound is used for the intermediate layers 321 and 321, whether to use the nonmagnetic material 234 and 324 is not important.

Since the electrode layers 318 and 318 are formed to extend over the multilayer film 316, the electrode layers 318 and 318 are connected to each other through the multilayer film 316. The electrode layers 318 and 318 are made of Ta (tantalum) or Cr (chromium).

Since the intermediate layers 321 and 321, made of at least one of a high-resistivity material having a resistance higher than that of the electrode layers 318 and 318 and an insulating material, are interposed between each of the hard bias layers 317 and 317 and each of the electrode layers 318 and 318, the sense current from the electrode layer 318 is less likely to flow into the hard bias layer 17. The percentage of the sense current shunting into the hard bias layer 317 is thus reduced.

In accordance with the present invention, the electrode layers 318 and 318 are formed to extend over the multilayer film 316, and the sense current directly flows from the electrode layer 318 formed on the multilayer film 316 into the multilayer film 316 without passing through the hard bias layer 317, because of the presence of the intermediate layers 321 and 321. The magnetoresistive-effect device of this invention thus enhances the reproduction gain, thereby resulting in high reproduction output, compared with the conventional magnetoresistive-effect devices.

One of the reasons for the increase in the reproduction output is that the sense current flows with ease from the electrode layer 318 into chiefly the nonmagnetic electrically conductive layer 313 of the multilayer film 316, leading to a large magnetoresistive effect.

The magnetoresistive effect is exhibited by the three layers of the pinned magnetic layer 312, the nonmagnetic electrically conductive layer 313, and the free magnetic layer 314. The magnetization direction of the pinned magnetic layer 312 is pinned in the Y direction, and the magnetization of the free magnetic layer 314, aligned in the direction of the track width (i.e., the X direction), freely varies in response to the external magnetic field. When the magnetization of the free magnetic layer 314 varies in response to the external magnetic field, the sense current flows into the nonmagnetic electrically conductive layer 313. When electrons move from one of the free magnetic layer 314 and the pinned magnetic layer 312 to the other, the electrons scatter in the interface between the nonmagnetic electrically conductive layer 313 and the pinned magnetic layer 312 or in the interface between the nonmagnetic electrically conductive layer 313 and the free magnetic layer 314, causing the electrical resistance to vary. A voltage change in response to the electrical resistance variation gives rise to a reproduction output.

As shown in FIG. 35, in accordance with the present invention, the electrode layers 318 and 318 are formed to extend over the multilayer film 316 so that the sense current directly flows from the electrode layer 318 into the multilayer film 316. The sense current also flows into the free magnetic layer 314 on top of the nonmagnetic electrically conductive layer 313 of the multilayer film 316, although the sense current chiefly flows into the nonmagnetic electrically conductive layer 313 with ease.

In contrast, the conventional magnetoresistive-effect device shown in FIG. 33 is designed so that the sense current flows from the electrode layer 8 via the hard bias layer 5 to the multilayer film 9 from its side face (in the X direction). With this arrangement, the sense current shunts to not only the nonmagnetic electrically conductive layer 3 but also the antiferromagnetic layer 1, the pinned magnetic layer 2 and the free magnetic layer 4. The quantity of the sense current flowing into the nonmagnetic conductive layer 3 is reduced.

Compared with the construction of the conventional magnetoresistive-effect device, the construction of the magnetoresistive-effect device in this embodiment allows the sense current to substantially flow into the nonmagnetic electrically conductive layer 313. A large magnetoresistive effect results, improving the reproduction output.

With the pinned magnetic layer 312 employed, the sense current is less likely to shunt into the hard bias layer 317 from the electrode layer 318 even if the thickness h2 of the electrode layer 318 formed in contact with the multilayer film 316 is made thinner. This arrangement allows the sense current to directly flow into the multilayer film 316 from the electrode layer 318.

The use of the thin electrode layer 318, having a thickness of h2, formed in contact with the multilayer film 316 reduces the size of a step between the top surface of the electrode layer 318 and the top surface of the multilayer film 316. This arrangement allows an upper gap layer 379 to be formed over the border area between the electrode layer 318 and the multilayer film 316 with an improved step coverage and with no film discontinuity involved, and provides sufficient insulation.

However, there is a limitation on the extension of the electrode layer.318 over the multilayer film 316. Referring to FIG. 35, the portion, having the width dimension T2, in the center of the multilayer film 316 is the sensitive region E, while the portions, each having the width dimension T1, on both sides of the sensitive region E are the insensitive regions D and D.

In the sensitive region E, the magnetization of the pinned magnetic layer 312 is correctly pinned in the Y direction as shown. Since the magnetization of the free magnetic layer 314 is correctly aligned in the X direction, the magnetization of the pinned magnetic layer 312 is perpendicular to the magnetization of the free magnetic layer 314. The magnetization of the free magnetic layer 314 in the sensitive region E varies sensitively in response to an external magnetic field from the recording medium. In other words, the sensitive region E is a portion that substantially exhibits the magnetoresistive effect.

In contrast, in the insensitive regions D and D arranged on both sides of the sensitive region E, the magnetizations of pinned magnetic layer 312 and the free magnetic layer 314 are greatly affected by the hard bias layers 317 and 317, and the magnetization of the free magnetic layer 314 is less susceptible to the external magnetic field. In other words, the insensitive regions D and D provide a weak magnetoresistive effect with a reproduction capability thereof reduced.

In the twentieth embodiment of the present invention, the width dimension T2 of the sensitive region E, and the width dimension of the insensitive region D of the multilayer film 316 are measured through the previously discussed micro track profile method (see FIG. 31).

Referring to FIG. 35, in this embodiment of the present invention, the electrode layers 318 and 318 directly formed on the hard bias layers 317 and 317 on both sides of the multilayer film 316 are formed to extend over the insensitive region D of the multilayer film 316 by a width dimension of T3. The width dimension of the top surface of the multilayer film 316 not covered with the electrode layers 318 and 318 is defined as an optical read track width O-Tw measured through an optical method.

The width dimension T2 of the sensitive region E not covered with the electrode layers 318 and 318 substantially functions as a track-width, and this width dimension is defined as a magnetic read track width M-Tw.

In the twentieth embodiment shown in FIG. 35, the optical read track width O-Tw, the magnetic read track width M-Tw, and the width dimension T2 of the sensitive region E substantially have the same dimension.

In the twentieth embodiment of the present invention, the electrode layer 318 overlaps the insensitive regions D and D of the multilayer film 316. The sense current is more likely to dominantly flow from the electrode layer 318 into the sensitive region E that substantially exhibits the magnetoresistive effect, rather than flowing into the insensitive regions D and D. The reproduction output is even more increased.

Particularly when the optical read track width O-Tw and the width dimension T2 (i.e., the magnetic read track width M-Tw) of the sensitive region E are set to be approximately the same dimension, the sense current more easily flows into the sensitive region E, thereby further improving the reproduction characteristics.

Although the electrode layers 318 and 318 fully cover the insensitive regions D and D in the twentieth embodiment shown in FIG. 35, it is not a requirement that the electrode layers 318 and 318 fully cover the insensitive regions D and D. The insensitive regions D and D may be partly exposed. In this case, the optical read track width O-Tw becomes larger than the width dimension T2 of the sensitive region E (the magnetic read track width M-Tw).

However, the electrode layers 318 and 318 formed to extend over the multilayer film 316 must not extend into the sensitive region E.

The sense current flows out, chiefly from the tip of the electrode layer 318 extending over the multilayer film 316. When the electrode layers 318 and 318 are formed on the sensitive region E that substantially exhibits the magnetoresistive effect, the area of the sensitive region E covered with the electrode layer 18 permits the sense current to less flow. The sensitive region E that presents an otherwise excellent magnetoresistive effect is partly degraded, and a drop in the reproduction output occurs. Since the area of the sensitive region E covered with the electrode layer 318 still has some sensitivity, a variation in the magnetoresistance occurs in both ends of the magnetic read track width M-Tw, inconveniently generating noise.

Figure 36:
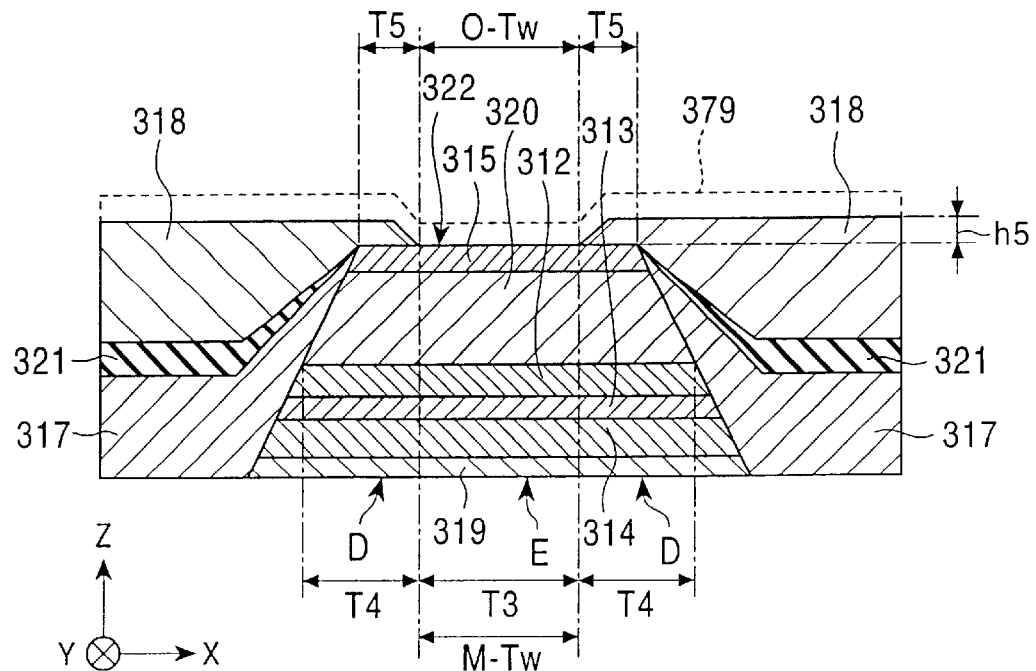
FIG. 36 is a partial cross-sectional view showing the construction of a magnetoresistive-effect device of a twenty-first embodiment of the present invention.

FIG. 36 shows a multilayer film 322 in a spin-valve type thin-film device of a twenty-first embodiment of the present invention shown in FIG. 36, in which the order of the lamination of the multilayer film 316 of the spin-valve type thin-film device shown in FIG. 35 is inverted. Specifically, a free magnetic layer 314, a nonmagnetic electrically conductive layer 313, a pinned magnetic layer 312, and an antiferromagnetic layer 320 are successively laminated from the substrate 319 as shown in FIG. 36.

In the twenty-first embodiment, the free magnetic layer 314 of the multilayer film 322 shown in FIG. 36 is formed below the antiferromagnetic layer 320, and is in contact with the thick portion of the hard bias layers 317 and 317. The magnetization of the free magnetic layer 314 is thus easily aligned in the X direction. The generation of Barkhausen noise is thus controlled.

In the twenty-first embodiment, again, the intermediate layers 321 and 321, made of a high-resistivity material having a resistance higher than that of the electrode layers 318 and 318 or an insulating material, are interposed between the hard bias layers 317 and 317 and the electrode layers 318 and 318, and the shunting of the sense current from the electrode layer 318 into the hard bias layer 317 is controlled. As in the magnetoresistive-effect device shown in FIG. 35, the nonmagnetic material layers 323 and 324, made of Ta, may be laminated under and over the intermediate layer 321.

The electrode layers 318 and 318 are formed to extend over the multilayer film 322, specifically extends over the insensitive region D of the multilayer film 322 by a width dimension of T5.

In the twenty-first embodiment, the multilayer film 322 is produced by successively laminating the free magnetic layer 314, the nonmagnetic electrically conductive layer 313, the pinned magnetic layer 312, and the antiferromagnetic layer 320 in that order from below. The sense current flowing to the nonmagnetic electrically conductive layer 313 from the electrode layer 318 formed on the multilayer film 322 is also shunted to the pinned magnetic layer 312 and the antiferromagnetic layer 320, formed over the nonmagnetic electrically conductive layer 313. The sense current flowing into the nonmagnetic electrically conductive layer 313 can be reduced from the one flowing in the magnetoresistive-effect device of FIG. 35 in which the free magnetic layer 314 only is formed over the nonmagnetic electrically conductive layer 313.

In the twenty-first embodiment, however, the intermediate layers 321 and 321, formed between the hard bias layers 317 and 317 and the electrode layers 318 and 318, control the sense current shunting into the hard bias layer 317. With the electrode layers 318 and 318 extending over the multilayer film 322, the sense current directly flows from the electrode layer 318 to the multilayer film 322. Furthermore, since the electrode layers 318 and 318 extend over the insensitive regions D and D, the sense current is allowed to predominantly flow into the sensitive region E. The magnetoresistive-effect device of this embodiment results in a high reproduction gain and a high reproduction output, compared with the conventional magnetoresistive-effect device shown in FIG. 33, in which the multilayer film 9 is produced by successively laminating the free magnetic layer 4, the nonmagnetic conductive layer 3, the pinned magnetic layer 2 and the antiferromagnetic layer 1 in that order from below.

The use of the thin electrode layer 318, having a thickness of h5, formed in contact with the multilayer film 322 reduces the size of a step between the top surface of the electrode layer 318 and the top surface of the multilayer film 322. This arrangement allows an upper gap layer 379 to be formed over the border area between the electrode layer 318 and the multilayer film 322 with an improved step coverage and with no film discontinuity involved, and provides sufficient insulation.

Figure 37:
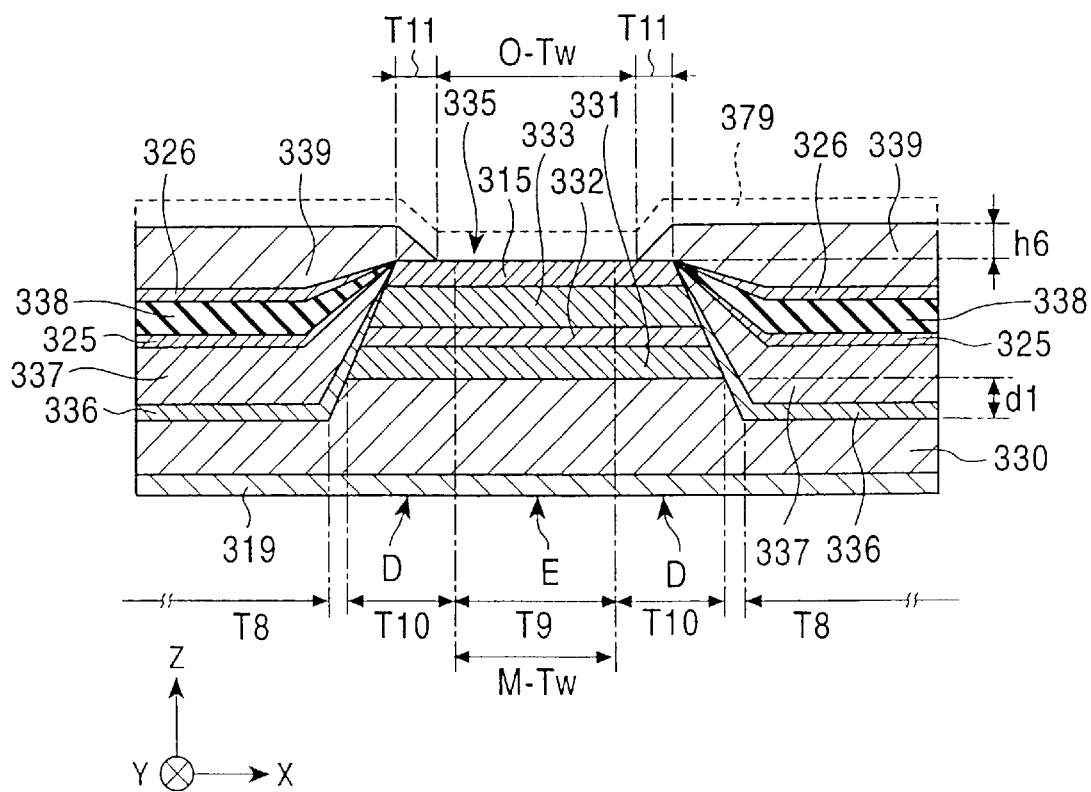
FIG. 37 is a partial cross-sectional view showing the construction of a magnetoresistive-effect device of a twenty-second embodiment of the present invention.

FIG. 37 is a cross-sectional view showing the construction of the magnetoresistive-effect device of a twenty-second embodiment of the present invention, viewed from an ABS side thereof.

In a spin-valve type thin-film device shown in FIG. 37, an antiferromagnetic layer 330 is formed over and along a substrate 319 in the X direction, and has a projected portion having a height d1 on the center thereof. Laminated on the projected portion of the antiferromagnetic layer 330 are a pinned magnetic layer 331, a nonmagnetic electrically conductive layer 332, a free magnetic layer 333, and a protective layer 315 to form a multilayer film 335.

The antiferromagnetic layer 330 is made of a Pt—Mn (platinum-manganese) alloy. Instead of the Pt—Mn alloy, the antiferromagnetic layer 330 may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof.

The pinned magnetic layer 331 and the free magnetic layer 333 are made of an Ni—Fe (nickel-iron) alloy, Co (cobalt), an Fe—Co (iron-cobalt) alloy, or an Fe—Co—Ni alloy, and the nonmagnetic electrically conductive layer 332 is made of a low electrical-resistance nonmagnetic electrically conductive material, such as Cu (copper).

Referring to FIG. 37, metallic layers 336 and 336, made of Cr or the like, and functioning as a buffer layer or a alignment layer, extend from a horizontal portion thereof coextending a width dimension T8 of the antiferromagnetic layer 330 in the X direction, rising along the side end faces of the pinned magnetic layer 331, the nonmagnetic electrically conductive layer 332, and the free magnetic layer 333. The use of the metallic layer 336 helps increase the strength of the bias magnetic field created by hard bias layers 337 and 337.

Deposited on the metallic layers 336 and 336 are hard bias layers 337 and 337, made of a Co—Pt (cobalt-platinum) alloy or a Co—Cr—Pt (cobalt-chromium-platinum) alloy. In the magnetoresistive-effect device shown in FIG. 37, the hard bias layers 337 and 337 are deposited on the antiferromagnetic layer 330. The thickness of the hard bias layers 337 and 337, formed on both sides of the free magnetic layer 333, are thicker than the counterparts in the spin-valve type thin-film devices shown in FIG. 35 and FIG. 36. The hard bias layers 337 and 337 give a sufficient bias magnetic field to the free magnetic layer 333, permitting the free magnetic layer 333 to be correctly shifted into a single-domain state in the X direction.

The intermediate layers 338 and 338, made of a high-resistivity material having a resistance higher than that of the electrode materials 339 and 339 or an insulating material, are separated from the hard bias layers 337 and 337 by the nonmagnetic material layers 325 and 325, made of Ta. The electrode layers 339 and 339, made of Ta or Cr, are then respectively separated from the intermediate layers 338 and 338 by the nonmagnetic material layers 326 and 326.

In the twenty-second embodiment, again, the intermediate layers 338 and 338, formed between the hard bias layers 337 and 337 and the electrode layers 339 and 339, control the sense current shunting into the hard bias layer 337. With the electrode layers 339 and 339 extending over the multilayer film 335, the electrode layer 339 is electrically connected to the multilayer film 335 on the top surface thereof. The sense current is directly conducted to the multilayer film 335 from the electrode layer 339on the multilayer film 335 without passing the hard bias layer 337. The magnetoresistive-effect device thus results in a high reproduction gain and a high reproduction output.

Referring to FIG. 37, the portion of the multilayer film 335 having a width dimension T9 is the sensitive region E while the portions of the multilayer film 335 having a width dimension T10 are the insensitive regions D and D. Since the electrode layers 339 and 339 extend over the insensitive regions D and D, the sense current is allowed to predominantly flow into the sensitive region E. This arrangement further increases the reproduction output.

Referring to FIG. 37, the electrode layer 339 on the multilayer film 335 does not fully cover the insensitive region D, with its width dimension T11 smaller than that of each insensitive region D. As already discussed, the insensitive region D may be fully covered with the electrode layer 339.

When the electrode layer 339 on the multilayer film 335 does not fully cover the insensitive region D as shown in FIG. 37, the optical read track width O-Tw, which is defined as the width dimension of the top surface of the multilayer film 335 not covered with the electrode layer 339, becomes larger than the magnetic read track width M-Tw, which is defined as the width dimension of the sensitive region E not covered with the electrode layer 339.

The use of the intermediate layer 338 permits the thickness h6 of the electrode layer 339 to be made thinner relative to the multilayer film 335 and thereby reduces the size of a step between the top surface of the electrode layer 339 and the top surface of the multilayer film 335. This arrangement allows an upper gap layer 379 to be formed over the border area between the electrode layer 339 and the multilayer film 335 with an improved step coverage and with no film discontinuity involved, and provides sufficient insulation.

Figure 38:
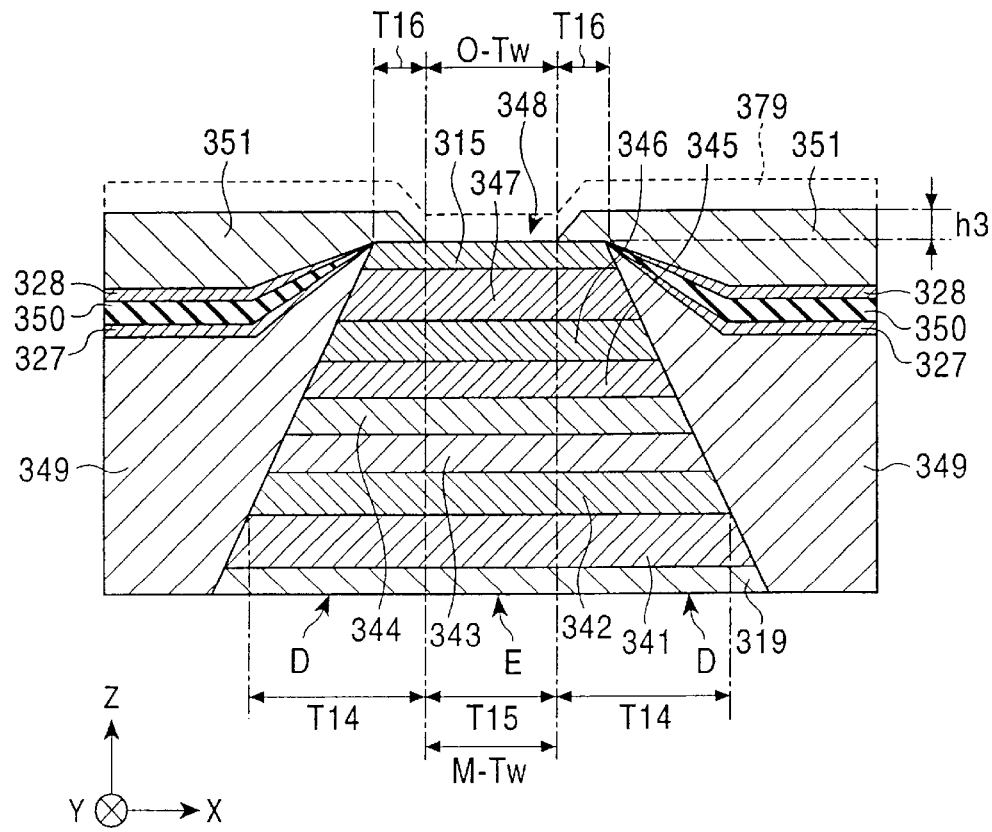
FIG. 38 is a partial cross-sectional view showing the construction of a magnetoresistive-effect device of a twenty-third embodiment of the present invention.

FIG. 38 is a cross-sectional view showing a twenty-third embodiment of the magnetoresistive-effect device of the present invention, viewed from an ABS side thereof.

This spin-valve type thin-film device is a so-called dual spin-valve type thin-film device, which includes a free magnetic layer 344, nonmagnetic electrically conductive layers 345 and 343 respectively lying over and under the free magnetic layer 344, pinned magnetic layers 346 and 342 respectively lying over and under the nonmagnetic electrically conductive layers 345 and 343, and antiferromagnetic layers 347 and 341 respectively lying over and under the pinned magnetic layers 346 and 342. The dual spin-valve type thin-film device provides a reproduction output higher in level than that of the spin-valve type thin-film devices (i.e., so-called single spin-valve type thin-film devices) shown in FIG. 35 through FIG. 37. The layer lying at the bottom is the substrate 319, while the layer lying on the top is a protective layer 315. The laminate, composed of the layers from the substrate 319 through the protective layer 315, constitutes a multilayer film 348.

The antiferromagnetic layers 341 and 347 are preferably made of a PtMn alloy. Instead of the Pt—Mn alloy, the antiferromagnetic layers 314 and 347 may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof.

The pinned magnetic layers 342 and 346 and the free magnetic layer 344 are made of an Ni—Fe (nickel-iron) alloy, Co (cobalt), an Fe—Co (iron-cobalt) alloy, or an Fe—Co—Ni alloy, and the nonmagnetic electrically conductive layer 343 and 345 are made of a low electrical-resistance nonmagnetic electrically conductive material, such as Cu (copper).

Referring to FIG. 38, hard bias layers 349 and 349 are formed on both sides of the multilayer film 348, and are made of a Co—Pt (cobalt-platinum) alloy or a Co—Cr—Pt (cobalt-chromium-platinum) alloy.

The hard bias layers 349 and 349 are magnetized in the X direction (i.e., the direction of a track width), and the magnetization of the free magnetic layer 344 is aligned in the X direction under the bias magnetic field in the X direction from the hard bias layers 349 and 349.

Intermediate layers 350 and 350 are formed to be separated from the hard bias layers 349 and 349 by nonmagnetic material layers 327 and 327, made of Ta. Each of the intermediate layers 350 and 350 is made of a high-resistivity material having a resistance higher than that of electrode layers 351 and 351, for example, a material selected from the group consisting of $TaSiO_2$, TaSi, $CrSiO_2$, CrSi, WSi, $WSiO_2$, TiN, and TaN, or is made of an insulating material selected from the group consisting of $Al_2O_3$, $SiO_2$, $Ti_2O_3$, TiO, WO, AlN, $Si_3N_4$, $B_4C$, SiC, and SiAlON. The electrode layers 351 and 351, made of Ta or Cr, are then respectively separated from the intermediate layers 350 and 350 by the nonmagnetic material layers 328 and 328.

Referring to FIG. 38, the electrode layers 351 and 351 extend over the multilayer film 348.

The intermediate layers 350 and 350, made of the high-resistivity material or the insulating material, formed between the hard bias layers 349 and 349 and the electrode layers 351 and 351, control the sense current shunting into the hard bias layer 349. With the electrode layers 351 and 351 extending over the top surface of the multilayer film 348, the sense current directly flows from the electrode layer 351 to the multilayer film 348. The magnetoresistive-effect device thus results in a high reproduction gain and a high reproduction output.

Even if the thickness h3 of the electrode layer 350 formed in contact with the multilayer film 340 is made smaller, the use of the intermediate layer 350 permits the sense current to flow from the electrode layer 351 to the multilayer film 348 without passing through the hard bias layer 349. This arrangement reduces the size of a step between the top surface of the electrode layer 351 and the top surface of the multilayer film 348, and forms an upper gap layer 379 over the border area between the electrode layer 351 and the multilayer film 348, with an improved step coverage and with no film discontinuity involved, and provides sufficient insulation.

In the twenty-third embodiment, the sensitive region E and insensitive regions D and D of the multilayer film 348 are measured using the micro track profile. The portion having a width dimension T15 centrally positioned in the multilayer film 348 as shown in FIG. 38 is the sensitive region E, while the portions, each having a width dimension T14, are the insensitive regions D and D.

In the sensitive region E, the magnetization of the pinned magnetic layers 342 and 346 is correctly pinned in the Y direction as shown. Since the magnetization of the free magnetic layer 344 is correctly aligned in the X direction, the magnetization of the pinned magnetic layers 342 and 346 is perpendicular to the magnetization of the free magnetic layer 344. The magnetization of the free magnetic layer 344 varies sensitively in response to an external magnetic field from the recording medium. An electrical resistance varies in accordance with the relationship between the variation in the magnetization direction of the free magnetic layer 344 and the pinned magnetic field of the pinned magnetic layers 342 and 346. A leakage magnetic field from the recording medium is thus detected in response to a variation in voltage due to the electrical resistance variation.

Referring to FIG. 38, the electrode layers 351 deposited on the multilayer film 348 respectively extend over the insensitive regions D and D by a width dimension T16.

The width dimension of the top surface of the multilayer film 348 not covered with the electrode layer 351 is defined as the optical read track width O-Tw. The width dimension T15 of the sensitive region E is defined as the magnetic read track width M-Tw. In this embodiment, the electrode layers 451 and 451 deposited on the multilayer film 348 respectively fully cover the insensitive regions D and D. The optical read track width O-Tw and the magnetic read track width M-Tw (i.e., the width dimension of the sensitive region E) are approximately equal to each other.

It is not a requirement that the electrode layers 351 and 351 fully cover the insensitive regions D and D. The width dimension T15 of the electrode layer 351 extending over the multilayer film 348 is smaller than the insensitive region D. In this case, the optical read track width O-Tw becomes larger than the magnetic read track width M-Tw.

This arrangement allows the sense current to predominantly flow from the electrode layer 351 into the sensitive region E, thereby increasing the reproduction output.

Figure 39:
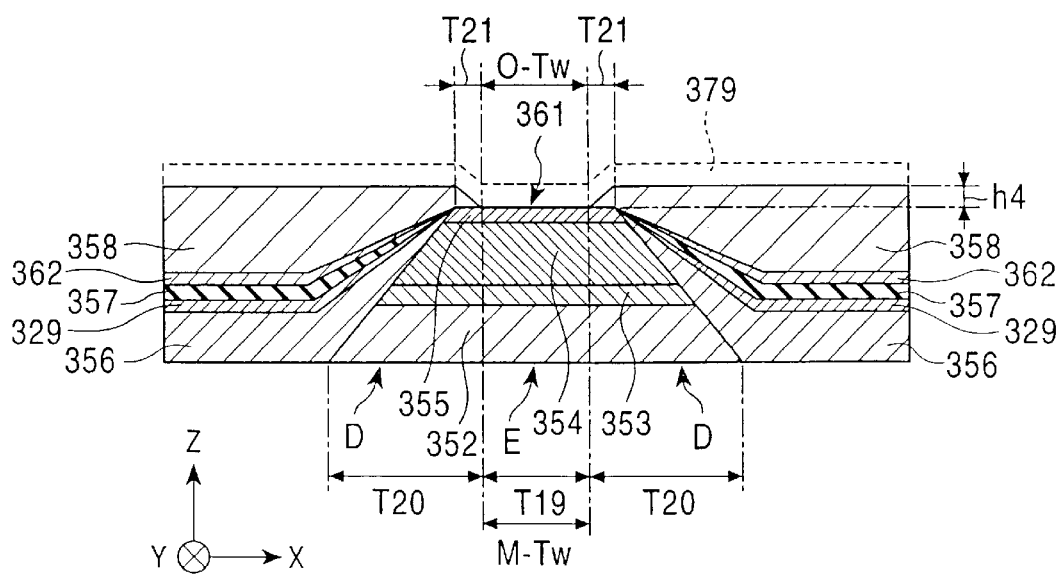
FIG. 39 is a partial cross-sectional view showing the construction of a magnetoresistive-effect device of a twenty-fourth embodiment of the present invention.

FIG. 39 is a cross-sectional view of a twenty-fourth embodiment of the magnetoresistive-effect device of the present invention, viewed from an ABS side thereof.

The magnetoresistive-effect device shown in FIG. 39 is called an anisotropic magnetoresistive-effect (AMR) device. A soft magnetic layer (a SAL layer) 352, a nonmagnetic layer (a shunt layer) 353, a magnetoresistive layer (MR layer) 354, and a protective layer 355 are successively laminated in that order from below to form a multilayer film 361. Hard bias layers 356 and 356 are formed on both sides of the multilayer film 361. Typically, the soft magnetic layer 352 is made of an NiFeNb alloy, the nonmagnetic layer 353 is made of Ta, the magnetoresistive layer 354 is made of an NiFe alloy, and the hard bias layers 356 and 356 are made of a CoPt alloy.

Intermediate layers 357 and 357 are formed to be separated from the hard bias layers 356 and 356 by nonmagnetic material layers 329 and 329, made of Ta. Each of the intermediate layers 357 and 357 is made of a high-resistivity material having a resistance higher than that of electrode layers 358 and 358, for example, a material selected from the group consisting of $TaSiO_2$, TaSi, $CrSiO_2$, CrSi, WSi, $WSiO_2$, TiN, and TaN, or is made of an insulating material selected from the group consisting of $Al_2O_3$, $SiO_2$, $Ti_2O_3$, TiO, WO, AlN, $Si_3N_4$, $B_4C$, SiC, and SiAlON. The electrode layers 358 and 358, made of Ta or Cr, are then respectively separated from the intermediate layers 357 and 357 by the nonmagnetic material layers 362 and 362.

Referring to FIG. 39, the electrode layers 358 and 358 extend over the multilayer film 361.

In the AMR device, the hard bias layer 356 is magnetized in the X direction as shown, and the magnetoresistive layer 354 is supplied with the bias magnetic field in the X direction by the hard bias layer 356. Furthermore, the magnetoresistive layer 354 is supplied with the bias field in the Y direction by the soft magnetic layer 352. With the magnetoresistive layer 354 supplied with the bias magnetic fields in the X direction and Y direction, a variation in magnetization thereof in response to a variation in the magnetic field becomes linear. The direction of the advance of the recording medium is aligned with the Z direction. When a leakage magnetic field from the recording medium in the Y direction is applied, the magnetization direction of the magnetoresistive layer 354 varies, causing a variation in the resistance. The resistance variation is then detected as a voltage variation.

In the twenty-fourth embodiment of the present invention, the intermediate layers 357 and 357, made of the high-resistivity material or the insulating material, formed between the hard bias layers 356 and 356 and the electrode layers 358 and 358, control the sense current shunting into the hard bias layer 356. With the electrode layers 358 and 358 extending over the top surface of the multilayer film 361, the sense current directly flows from the electrode layer 358 to the multilayer film 361.

Since the sense current flows to the multilayer film 361 from the electrode layer 358 formed on and in contact with the multilayer film 361, the percentage of the sense current flowing into the magnetoresistive layer 354 formed as the top layer of the multilayer film 361 is increased. The shunting of the sense current to the soft magnetic layer 352, which is a typical problem in the conventional art, is thus controlled. Compared with the conventional art, this invention thus achieves a high reproduction gain and a high reproduction output.

Even if the thickness h4 of the electrode layer 358 is made thin relative to that of the multilayer film 361, the use of the intermediate layer 357 permits the sense current to effectively flow from the electrode layer 358 to the multilayer film 361 without passing through the hard bias layer 356. This arrangement reduces the size of a step between the top surface of the electrode layer 358 and the top surface of the multilayer film 361, and forms an upper gap layer 379 over the border area between the electrode layer 358 and the multilayer film 361, with an improved step coverage and with no film discontinuity involved, and provides sufficient insulation.

In the twenty-fourth embodiment, the sensitive region E and insensitive regions D and D of the multilayer film 361 are measured using the micro track profile. The portion having a width dimension T19 centrally positioned in the multilayer film 361 is the sensitive region E, while the portions, each having a width dimension T20, are the insensitive regions D and D.

Referring to FIG. 39, in this invention, the electrode layer 358 deposited on the multilayer film 361 extends over the insensitive region D by a width dimension T21.

The width dimension of the top surface of the multilayer film 361 not covered with the electrode layers 358 and 358 is defined as the optical read track width O-Tw. The width dimension T19 of the sensitive region E not covered with the electrode layers 358 and 358 is defined as the magnetic read track width M-Tw. In this embodiment, the electrode layers 358 and 358 extending over the multilayer film 361 fully cover the insensitive regions D and D. The optical read track width O-Tw and the width dimension T19 of the sensitive region E (the magnetic read track width M-Tw) are approximately equal to each other.

It is not a requirement that the electrode layers 358 and 358 fully cover the insensitive regions D and D. The width dimension T21 of the electrode layer 358 extending over the multilayer film 361 may be smaller than the insensitive region D. In this case, the optical read track width O-Tw becomes larger than the magnetic read track width M-Tw With the electrode layers 358 and 358 extending over the insensitive regions D and D of the multilayer film 361, the sense current predominantly flows into the sensitive region E of the magnetoresistive layer 354, thereby increasing the reproduction output.

The method of manufacturing the magnetoresistive-effect device of the present invention is now discussed referring to drawings.

Figure 40:
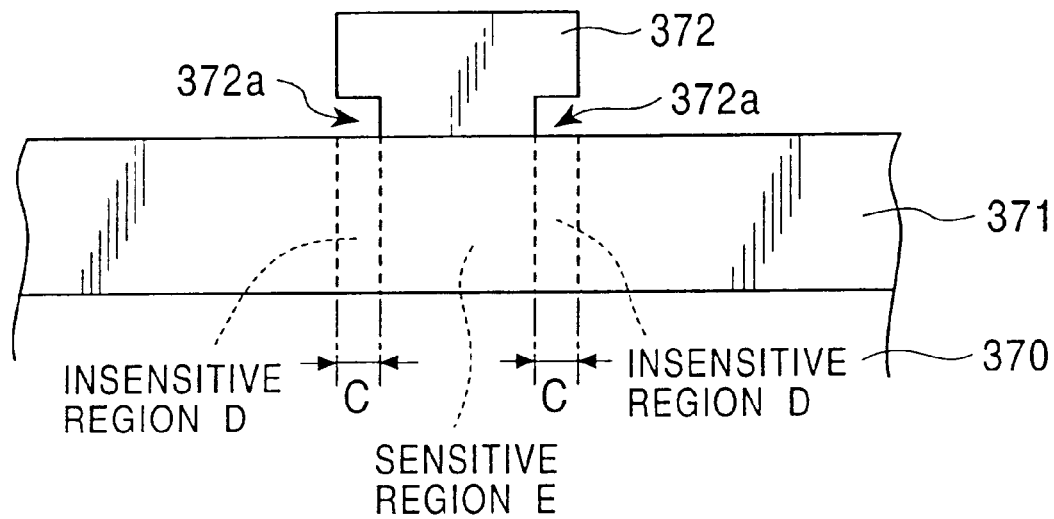
FIG. 40 is a conceptual diagram showing a manufacturing step of the magnetoresistive-effect device of the present invention.

Referring to FIG. 40, a multilayer film 371 of the magnetoresistive-effect device is formed on a substrate 370. The multilayer film 371 can be any of the multilayer films of the single spin-valve type thin-film devices shown in FIGS. 35 and 36, and the multilayer film of the dual spin-valve type thin-film devices shown in FIG. 38, and the multilayer film of the AMR devices shown in FIG. 39. To form the antiferromagnetic layer 330 in its extended form in the X direction as shown in FIG. 37, an etch rate and etch time are controlled to leave the side portions of the antiferromagnetic layer 330, when the sides of the multilayer film 371, shown in FIG. 40, are etched away. When the multilayer film 371 is a multilayer film for a single spin-valve type thin-film device or a dual spin-valve type thin-film device, the antiferromagnetic layer 330 in the multilayer film 371 is preferably made of a PtMn alloy, or may be made of an X—Mn alloy where X is a material selected from the group consisting of Pd, Ir, Rh, Ru, and alloys thereof, or a Pt—Mn—X' alloy where X' is a material selected from the group consisting of Pd, Ir, Rh, Ru, Au, Ag, and alloys thereof. When the antiferromagnetic layer is made of one of the above-cited materials, the antiferromagnetic layer needs to be subjected to a heat treatment to generate an exchange coupling magnetic field in the interface with the pinned magnetic layer.

FIG. 33 shows a conventional magnetoresistive-effect device having its hard bias layers and electrode layers on only both sides of the multilayer film. The width dimension A of the top surface of the multilayer film of the conventional magnetoresistive-effect device is measured using the optical microscope as shown in FIG. 31. The magnetoresistive-effect device is then scanned across a micro track having a signal recorded thereon, on a recording medium in the direction of the track width, and a reproduction output is detected. A top width. dimension of B giving an output equal to or greater than 50% of a maximum reproduction output is defined as the sensitive region E and a top width dimension of C giving an output smaller than 50% of the maximum reproduction output is defined as the insensitive region D.

Based on these measurement results, a lift-off resist layer 372 is formed on the multilayer film 371, paying attention to the width dimension C of the insensitive regions D and D measured through the micro track profile method. Referring to FIG. 40, undercuts 372a and 372a are formed on the underside of the resist layer 372. The undercuts 372a and 372a are formed above the insensitive regions D and D, and the sensitive region E of the multilayer film 371 is fully covered with the resist layer 372.

Figure 41:
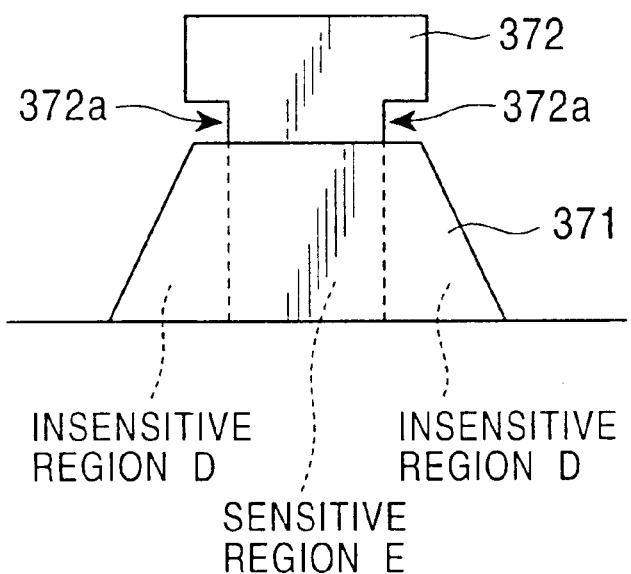
FIG. 41 is a conceptual diagram showing a manufacturing step performed subsequent to the step of FIG. 40.
Figure 42:
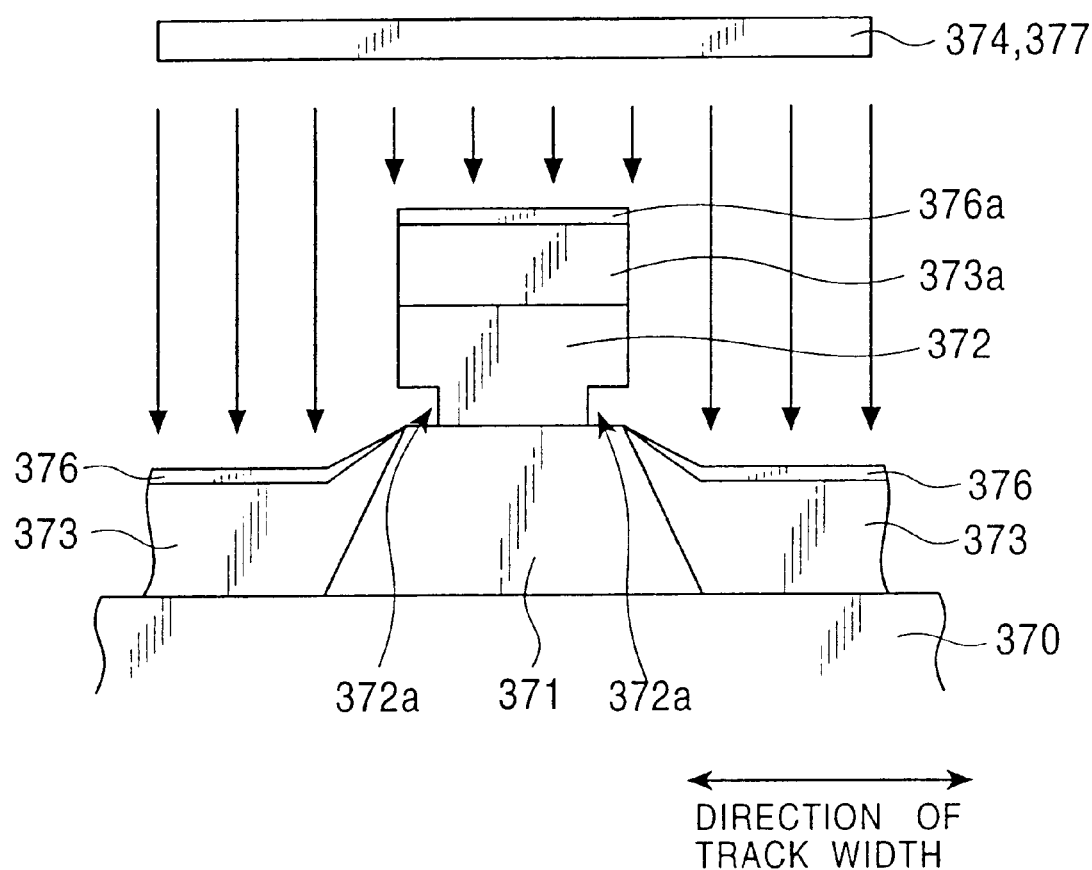
FIG. 42 is a conceptual diagram showing a manufacturing step performed subsequent to the step of FIG. 41.

In a manufacturing step shown in FIG. 41, both sides of the multilayer film 371 are cut away by etching, and in a manufacturing step shown in FIG. 42, hard bias layers 373 and 373 are formed on both sides of the multilayer film 371. In this invention, the sputtering technique, used to form the hard bias layers 373 and 373, intermediate layers 376 and 376, and electrode layers 375 and 375, is preferably at least one sputtering technique selected from an ion-beam sputtering method, a long-throw sputtering method, and a collimation sputtering method.

In accordance with the present invention, as shown in FIG. 42, a substrate 370 having the multilayer film 371 formed thereon is placed normal to a target 374 having the same composition as that of the hard bias layers 373 and 373. In this setup, the hard bias layers 373 and 373 are grown in a direction normal to the multilayer film 371 using the ion-beam sputtering method, for instance. The hard bias layers 373 and 373 are not grown into the undercuts 372a and 372a of the resist layer 372 arranged on the multilayer film 371. Referring to FIG. 42, a layer 373a having the same composition as that of the hard bias layers 373 and 373 is formed on top of the resist layer 372.

Intermediate layers 376 and 376 are grown on the hard bias layers 373 and 373 through ion-beam sputtering method. In this case, the target 374 is replaced with a target 377 having the composition of a high-resistivity material selected from the group consisting of $TaSiO_2$, TaSi, $CrSiO_2$, CrSi, WSi, $WSiO_2$, TiN, and TaN, or an insulating material selected from the group consisting of $Al_2O_3$, $SiO_2$, $Ti_2O_3$, TiO, WO, AlN, $Si_3N_4$, $B_4C$, SiC, and SiAlON. The intermediate layers 376 and 376 are not deposited into the undercuts 372a and 372a of the resist layer 372 arranged on the multilayer film 371. As shown in FIG. 42, a layer 376a having the same composition as that of the intermediate layers 376 and 376 is formed on the resist layer 372.

Figure 43:
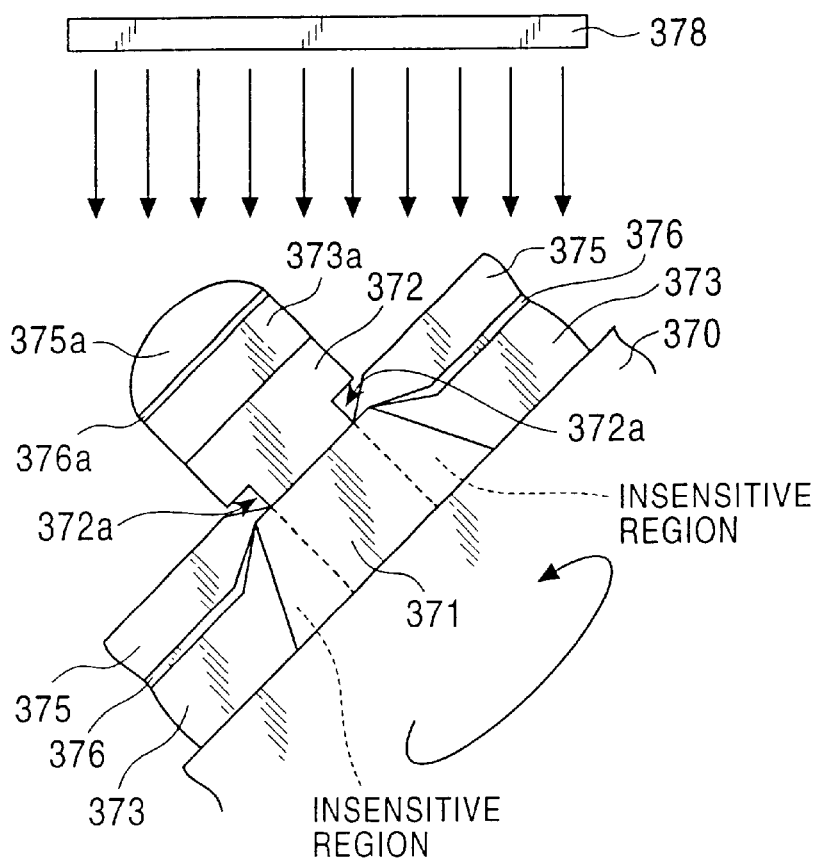
FIG. 43 is a conceptual diagram showing a manufacturing step performed subsequent to the step of FIG. 42.

In a manufacturing step shown in FIG. 43, the electrode layers 375 and 375 are obliquely grown on the hard bias layers intermediate layers 376 and 376 at an angle to the multilayer film 371. In this case, the electrode layers 375 and 375 are grown into the undercuts 372a and 372a formed on the underside of the resist layer 372 arranged on top of the multilayer film 371.

Referring to FIG. 43, the electrode layers 375 and 375 are deposited on the hard bias layers 373 and 373 through the ion beam splutter method, while the substrate 370, having the multilayer film 371 thereon, is rotated in a plane at an angle with respect to a target 378 having the same composition as that of the electrode layer 375. The electrode layer 375 sputtered at an oblique angle is grown not only on the intermediate layer 376 but also into the undercut 372a of the resist layer 372 formed on the multilayer film 371. Specifically, the electrode layer 375 grown into the undercut 372a covers the insensitive region D of the multilayer film 371.

Figure 44:
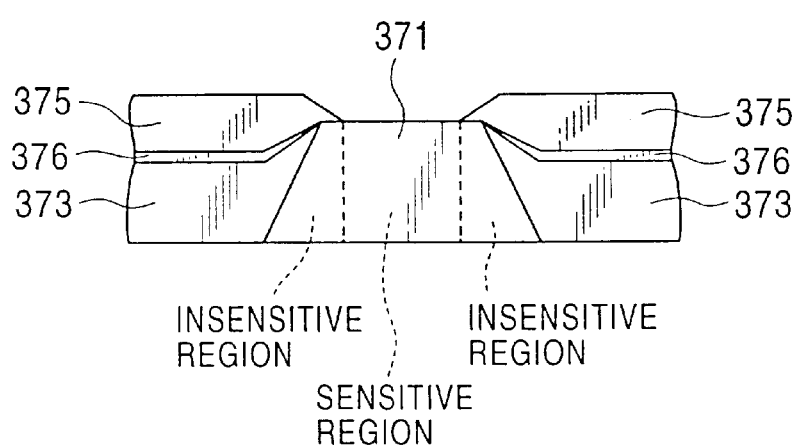
FIG. 44 is a conceptual diagram showing a manufacturing step performed subsequent to the step of FIG. 43.

In a manufacturing step shown in FIG. 44, the resist layer 372 shown in FIG. 43 is removed using a resist-stripper, and this completes a magnetoresistive-effect device having the electrode layers 375 and 375 formed on top of the insensitive regions D and D of the multilayer film 371.

In accordance with the present invention, the intermediate layer, made of a high-resistivity material having a resistance higher than that of the electrode layer or an insulating materia, is formed between the hard bias layer and the electrode layer. With the electrode layer formed to extend over the multilayer film, the sense current shunting to the hard bias layer is controlled, and the sense current directly flows from the electrode layer to the multilayer film. The magnetoresistive-effect device of this invention thus presents a high reproduction gain and a high reproduction output, compared with the conventional art.

The use of the intermediate layer permits the thickness of the electrode in the contact area thereof with the multilayer film to be thinned. This arrangement reduces the size of a step between the top surface of the electrode layer and the top surface of the multilayer film, and forms an upper gap layer over the border area between the electrode layer and the multilayer film, with an improved step coverage and with no film discontinuity involved, and provides sufficient insulation.

The electrode layers overlapping the multilayer film are formed to extend over the insensitive regions that occupy both end portions of the multilayer film. In this arrangement, the sense current predominantly flows into the sensitive region that is centrally positioned in the multilayer film and substantially exhibits the magnetoresistive effect. The reproduction output is even further increased.

What is claimed is:

1. A magnetoresistive-effect device comprising:
   a multilayer film comprising:
   an antiferromagnetic layer,
   a pinned magnetic layer, which is deposited on and in contact with said antiferrornagnetic layer, and a magnetization direction of which is pinned through an exchange anisotropic magnetic field with said antiferromagnetic layer, and
   a free magnetic layer, separated from said pinned magnetic layer by a nonmagnetic electrically conductive layer;

a pair of hard bias layers, deposited on both sides of said multilayer film, for orienting a magnetization direction of said free magnetic layer perpendicular to the magnetization direction of said pinned magnetic layer; and a pair of electrode layers respectively deposited on said hard bias layers, wherein said electrode layers extend over said multilayer film, and said electrode layers are in direct contact with the multilayer film, wherein said multilayer film is fabricated by successively laminating said antiferromagnetic layer, said pinned magnetic layer, said nonmagnetic electrically conductive layer, and said free magnetic layer in that order from below, wherein said antiferromagnetic layer laterally extends from the layers laminated thereon, and the hard bias layers, intermediate layers, and the electrode layers are respectively laminated on metallic layers respectively deposited on said antiferromagnetic layers in said laterally extending regions thereof, wherein said free magnetic layer is in a ferrimagnetic state in which the magnetization directions of two adjacent soft magnetic thin films, separated by the nonmagnetic material layer, are aligned antiparallel to each other, wherein a magnetic coupling junction between said multilayer film and each bias layer is fabricated of an interface with an end face of only one of the plurality of the soft magnetic thin films forming said free magnetic layer, and wherein an insulator layer is denosited between said electrode layers, which are deposited above and on both sides of said multilayer film, and an end face of said insulator layer is in direct contact with each of said electrode layers or is separated from each of said electrode layers by a layer, an angle made between an end face of the electrode in contact with both side surfaces of the insulator layer and a top surface of the multilaver film is at least 90 degrees.

2. A magnetoresistive-effect device according to claim 1, wherein said pinned magnetic layer comprises a plurality of soft magnetic thin films having different magnetic moments and nonmagnetic material layers, which are alternately laminated with one soft magnetic thin film separated from another by one nonmagnetic material layer, and said pinned magnetic layer is in a ferrimagnetic state in which magnetization directions of adjacent soft magnetic thin films, separated by the nonmagnetic material layer, are aligned antiparallel to each other.

3. A magnetoresistive-effect device according to claim 1, wherein said nonmagnetic material layer is made of a material selected from the group consisting of Ru, Rh, Ir, Cr, Re, Cu, and alloys thereof.

4. A magnetoresistive-effect device according to claim 1, wherein said antiferromagnetic layer is made of a PtMn alloy.

5. A magnetoresistive-effect device according to claim 1, wherein said antiferromagnetic layer is made of an X-Mn alloy where X is a material selected from the group consisting of Pd, Ir, Rh, Ru, and alloys thereof.

6. A magnetoresistive-effect device according to claim 1, wherein said antiferromagnetic material is made of a PtMn-X' alloy where X' is a material selected from the group consisting of Pd, Ir, Rh, Ru, Au, Ag, and alloys thereof.

7. A magnetoresistive-effect device according to claim 1, wherein a protective layer is deposited, as a top layer, on top of said multilayer film.

8. A magnetoresistive-effect device according to claim 1, wherein said protective layer is deposited where there is no junction between said multilayer film and said electrode layer.

9. A magnetoresistive-effect device according to claim 1, wherein a width dimension of a portion of each electrode layer extending over said multilayer film is within a range from 0 $\mu$m to 0.08 $\mu$m.

10. A magnetoresistive-effect device according to claim 9, wherein the width dimension of the portion of each electrode layer extending over said multilayer film is equal to or larger than 0.06 $\mu$m.

11. A magnetoresistive-effect device comprising:

a multilayer film comprising
a free magnetic layer,
nonmagnetic electrically conductive layers respectively lying over and under said free magnetic layer,
pinned magnetic layers respectively lying over said one nonmagnetic electrically conductive layer and under said other nonmagnetic electrically conductive layer, each having a pinned magnetization direction, and
antiferromagnetic layers respectively lying over said one pinned magnetic layer and under said other pinned magnetic layer;

a pair of hard bias layers, deposited on both sides of said multilayer film, for orienting a magnetization direction of said free magnetic layer perpendicular to a magnetization direction of said pinned magnetic layerr: and a pair of electrode layers respectively deposited on said hard bias layers;

wherein said electrode layers extend over said multilayer film, wherein said free magnetic layer is in a ferrimagnetic state in which magnetization directions of two adjacent soft magnetic thin films, separated by the nonmagnetic material layer, are aligned antiparallel to each other, and wherein a magnetic coupling junction between said multilayer film and each bias layer is fabricated of an interface with an end face of only one of the plurality of the soft magnetic thin films forming said free magnetic layer.

12. A magnetoresistive-effect device according to claim 11, wherein said pinned magnetic layer comprises a plurality of soft magnetic thin films having different magnetic moments and nonmagnetic material layers, which are alternately laminated with one soft magnetic thin film separated from another by one nonmagnetic material layer, and said pinned magnetic layer is in a ferrimagnetic state in which the magnetization directions of adjacent soft magnetic thin films, separated by the nonmagnetic material layer, are aligned antiparallel to each other.

13. A magnetoresistive-effect device according to claim 11, wherein said nonmagnetic material layer is made of a material selected from the group consisting of Ru, Rh, Ir, Cr, Re, Cu, and alloys thereof.

14. A magnetoresistive-effect device according to claim 11, wherein said antiferromagnetic layer is made of a PtMn alloy.

15. A magnetoresistive-effect device according to claim 11, wherein said antiferromagnetic layer is made of an X-Mn alloy where X is a material selected from the group consisting of Pd, Ir, Rh, Ru, and alloys thereof.

16. A magnetoresistive-effect device according to claim 11, wherein said antiferromagnetic material is made of a Pt-Mn X' alloy where X' is a material selected from the group consisting of Pd, Ir, Rh, Ru, Au, Ag, and alloys thereof.

17. A magnetoresistive-effect device according to claim 11, wherein a protective layer is deposited, as a top layer, on top of said multilayer film.

18. A magnetoresistive-effect device according to claim 11, wherein said protective layer is deposited where there is no junction between said multilayer film and said electrode layer.

19. A magnetoresistive-effect device according to claim 11, wherein a width dimension of a portion of each electrode layer extending over said multilayer film is within a range from 0 μm to 0.08 μm.

20. A magnetoresistive-effect device according to claim 19, wherein a width dimension of the portion of each electrode layer extending over said multilayer film is equal to or larger than 0.05 μm.

21. A magnetoresistive-effect device according to claim 19, wherein an insulator layer is deposited between said electrode layers, which are formed above and on both sides of said multilayer film, and an end face of said insulator layer is in direct contact with each of said electrode layers or is separated from each of said electrode layers by a layer.

* * * * *

UNITED STATES PATENT AND TRADEMARK OFFICE
CERTIFICATE OF CORRECTION

PATENT NO. : 6,690,554 B2
DATED : February 10, 2004
INVENTOR(S) : Daigo Aoki et al.

It is certified that error appears in the above-identified patent and that said Letters Patent is hereby corrected as shown below:

<u>Title page, Column 1,</u>
Item [75], delete "; Kiyoshi Sato Niigata-ken (JP);Yoshihiko Kakihara Niigata-ken (JP)".

<u>Column 74,</u>
Line 61, delete "antiferrornagnetic" and substitute -- antiferromagnetic -- in its place.

<u>Column 75,</u>
Line 8, delete "multilaver" and substitute -- multilayer -- in its place.

<u>Column 76,</u>
Line 24, delete "layerr:" and substitute -- layer; in its place.

Signed and Sealed this

Thirty-first Day of August, 2004

JON W. DUDAS
*Director of the United States Patent and Trademark Office*